(12) United States Patent
Chen et al.

(10) Patent No.: US 10,386,581 B2
(45) Date of Patent: Aug. 20, 2019

(54) GRATING BASED OPTICAL TRANSMITTER

(71) Applicant: Forelux Inc., Zhubei, Hsinchu County (TW)

(72) Inventors: Shu-Lu Chen, Taipei (TW); Yun-Chung Na, Hsinchu (TW)

(73) Assignee: Forelux Inc.

( * ) Notice: Subject to any disclaimer, the term of this patent is extended or adjusted under 35 U.S.C. 154(b) by 0 days.

(21) Appl. No.: 15/201,907

(22) Filed: Jul. 5, 2016

(65) Prior Publication Data

US 2016/0315452 A1 Oct. 27, 2016

Related U.S. Application Data

(63) Continuation-in-part of application No. 14/291,253, filed on May 30, 2014, now abandoned, and a
(Continued)

(51) Int. Cl.
*G02B 6/34* (2006.01)
*H01S 5/183* (2006.01)
(Continued)

(52) U.S. Cl.
CPC .......... *G02B 6/34* (2013.01); *G02B 6/29328* (2013.01); *G02B 6/29356* (2013.01);
(Continued)

(58) Field of Classification Search
CPC . G02B 6/30; G02B 6/34; G02B 6/124; G02B 6/2085; G02B 2006/12104;
(Continued)

(56) References Cited

U.S. PATENT DOCUMENTS

| 4,894,833 A | 1/1990 | Carlin |
| 4,958,357 A * | 9/1990 | Kinoshita ............... H01S 5/187 372/26 |

(Continued)

FOREIGN PATENT DOCUMENTS

| EP | 0322180 | 6/1989 |
| EP | 0430691 | 6/1991 |

(Continued)

OTHER PUBLICATIONS

U.S. Appl. No. 14/291,253, "Optical Device for Redirecting Incident Electromagnetic Wave," filed May 30, 2014, 39 pages.
(Continued)

*Primary Examiner* — Michael P Mooney
(74) *Attorney, Agent, or Firm* — Fish & Richardson P.C.

(57) ABSTRACT

A grating based optical transmitter includes a light source region coupled to an interference region, two reflective regions on both sides of the interference region, and one or several gratings interacting with the interference light wave in the interference region causing a vertical emission. Two electrodes are used to inject electrical carriers, and a third electrode can be added to modulate the electrical carrier density recombined in the light source region. Compared to conventional edge-emitting laser with two electrodes, the grating-based optical transmitter in this invention largely reduces the packaging cost and complexity due to the vertical emission, and largely enhances the modulation bandwidth due to the three-terminal configuration.

30 Claims, 45 Drawing Sheets

Related U.S. Application Data continuation-in-part of application No. 14/964,865, filed on Dec. 10, 2015, now Pat. No. 9,703,043, and a continuation-in-part of application No. 14/635,133, filed on Mar. 2, 2015, now Pat. No. 9,548,589.

(60) Provisional application No. 61/979,489, filed on Apr. 14, 2014, provisional application No. 61/925,629, filed on Jan. 9, 2014, provisional application No. 61/895,493, filed on Oct. 25, 2013, provisional application No. 61/946,657, filed on Feb. 28, 2014, provisional application No. 62/014,182, filed on Jun. 19, 2014, provisional application No. 62/012,446, filed on Jun. 16, 2014, provisional application No. 62/194,170, filed on Jul. 17, 2015.

(51) Int. Cl.
  *H01S 5/30* (2006.01)
  *H01S 5/343* (2006.01)
  *G02B 6/293* (2006.01)
  *G02B 6/42* (2006.01)
  *G02B 27/42* (2006.01)
  *G02B 26/00* (2006.01)

(52) U.S. Cl.
  CPC ......... *G02B 6/4206* (2013.01); *G02B 26/001* (2013.01); *G02B 27/4233* (2013.01); *H01S 5/18386* (2013.01); *H01S 5/3013* (2013.01); *H01S 5/343* (2013.01)

(58) Field of Classification Search
  CPC ........ G02B 2006/12107; G02B 6/1226; G02B 6/29323; G02B 6/29328; G02B 6/29356; H01S 5/12; H01S 5/18; H01S 5/20; H01S 5/32; H01S 5/062; H01S 5/18386; H01S 5/3013; H01S 5/343; H01S 5/13386
  USPC ............ 385/37, 129–132, 14, 30, 34, 43, 49
  See application file for complete search history.

(56) References Cited

U.S. PATENT DOCUMENTS

| | | | | |
|---|---|---|---|---|
| 5,088,097 | A * | 2/1992 | Ono | H01S 5/5045 372/20 |
| 5,970,081 | A | 10/1999 | Hirayama et al. | |
| 6,031,243 | A | 2/2000 | Taylor | |
| 6,104,852 | A | 8/2000 | Kashyap | |
| 6,775,427 | B2 | 8/2004 | Evans | |
| 9,239,507 | B2 | 1/2016 | Chen et al. | |
| 9,703,043 | B2 * | 7/2017 | Chen | G02B 6/29328 |
| 2002/0097770 | A1 * | 7/2002 | Mekis | H01P 1/2005 372/92 |
| 2002/0136259 | A1 * | 9/2002 | Evans | H01S 5/187 372/102 |
| 2004/0076198 | A1 | 4/2004 | Spoonhower | |
| 2004/0114642 | A1 | 6/2004 | Bullington | |
| 2005/0238079 | A1 * | 10/2005 | Botez | B82Y 20/00 372/96 |
| 2006/0051016 | A1 | 3/2006 | Ogawa et al. | |
| 2006/0093299 | A1 | 5/2006 | Ogawa et al. | |
| 2007/0263973 | A1 | 11/2007 | Van Laere et al. | |
| 2009/0074024 | A1 | 3/2009 | Noda et al. | |
| 2012/0082016 | A1 | 4/2012 | Komura | |
| 2013/0279844 | A1 | 10/2013 | Na et al. | |
| 2014/0348195 | A1 * | 11/2014 | Sakaguchi | H01S 5/105 372/45.01 |
| 2015/0117808 | A1 | 4/2015 | Chen et al. | |
| 2015/0117817 | A1 | 4/2015 | Chen et al. | |
| 2015/0168647 | A1 * | 6/2015 | Liang | B82Y 20/00 385/14 |

FOREIGN PATENT DOCUMENTS

| | | | |
|---|---|---|---|
| EP | 2634605 | 9/2013 | |
| EP | 2913902 | 9/2015 | |
| JP | 63-111689 | 5/1988 | |
| JP | 63-318185 | 12/1988 | |
| JP | 10-190122 | * 7/1998 | ............... H01S 5/00 |
| JP | 2011-112942 | 6/2011 | |
| WO | 2015/008627 | 1/2015 | |

OTHER PUBLICATIONS

Office Action issued in U.S. Appl. No. 14/510,799 dated Jul. 14, 2015, 15 pages.
Notice of Allowance issued in U.S. Appl. No. 14/510,799 dated Nov. 10, 2015, 8 pages.
Restriction Requirement received in U.S. Appl. No. 14/291,253 dated Feb. 5, 2016.
Restriction Requirement received in U.S. Appl. No. 14/964,865 dated Jun. 27, 2016, 6 pages.
Extended European Search Report issued in EP14189392.5-1553 dated Mar. 2, 2015, 7 pages.
Extended European Search Report issued in Application No. 15157204.7, dated Jul. 24, 2015, 8 pages.
Chen et al., "Fabrication-Tolerant Waveguide Chirped Grating Coupler for Coupling to a Perfectly Vertical Optical Fiber," IEEE Photonics Technol Lett., Dec. 2008, 20(23):1914-1916.
Covey and Chen, "Efficient perfectly vertical fiber-to-chip grating coupler for silicon horizontal multiple slot waveguides," Optics Express, May 2013, 21(9):10886-10896.
Ding et al., "Ultrahigh-efficiency apodized grating coupler using fully etched photonic crystals," Optics Lett., Aug. 2013, 38(15):2732-2734.
Lalanne and Hugonin, "Bloch-Wave Engineering for High-Q, Small-V Microcavities," IEEE J Quantum Electronics, Nov. 2003, 39(11):1430-1438.
Li et al., "CMOS-compatible high efficiency double-etched apodized waveguide grating coupler," Optics Express, Apr. 2013, 21(7):7868-7874.
Mekis et al., "A Grating-Coupler-Enabled CMOS Photonics Platform," IEEE J Selected Topics Quantum Electronics, May/Jun. 2011, 17(3):597-608.
Na et al., "Efficient broadband silicon-on-insulator grating coupler with low backreflection," Optics Lett., Jun. 2011, 36(11):2101-2103.
Roelkens et al., "High efficiency grating coupler between silicon-on-insulator waveguides and perfectly vertical optical fibers," Optics Lett., Jun. 2007, 32(11):1495-1497.
Schrauwen et al., "Polymer wedge for perfectly vertical light coupling to silicon," Integrated Optics: Devices, Materials, and Technologies XIII, Jan. 2009, 8 pages.
Taillaert et al., "A Compact Two-Dimensional Grating Coupler Used as a Polarization Splitter," IEEE Photonics Technol Lett., Sep. 2003, 15(9):1249-1251.
Wang et al., "Embedded Slanted Grating for Vertical Coupling Between Fibers and Silicon-on-Insulator Planar Waveguides," IEEE Photonics Technol Lett., Sep. 2005, 17(9):1884-1886.
Wu et al., "A critically coupled Germanium photodetector under vertical illumination," Optics Express, Dec. 2012, 20(28):29338-29346.
International Search Report and Written Opinion for PCT/US2017/040712, dated Oct. 10, 2017.
PCT International Preliminary Report on Patentability in International Application No. PCT/US2017/040712, dated Jan. 8, 2019, 6 pages.
EP Office Action in European Appln. No. 14189392.5-1003, dated May 24, 2019, 6 pages.
Taillaeart et al, "An out-of-plain Grating Coupler for Efficient Butt-Coupling Between Compact Planar Waveguides and Single-Mode Fibers," IEEE Xplore, Jul. 2002, 7 pages.
EP Office Action in European Appln. 17824804.3, dated Jul. 2, 2019, 1 pages.

(56) References Cited

OTHER PUBLICATIONS

Extended European Search Report in European Appln. 17824804.3, dated Jun. 13, 2019, 10 pages.
Botez et al, "Analysis of surface-emitting second-order distributed feedback lasers with central grating phaseshift," IEEE Xplore, Sep. 2003, 13 pages.

* cited by examiner

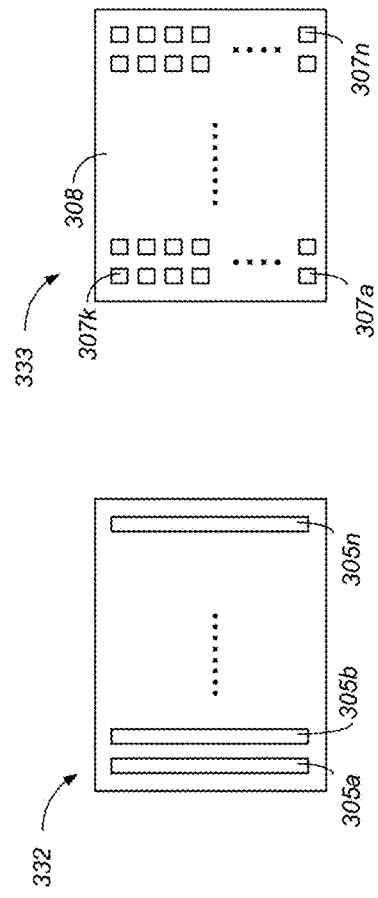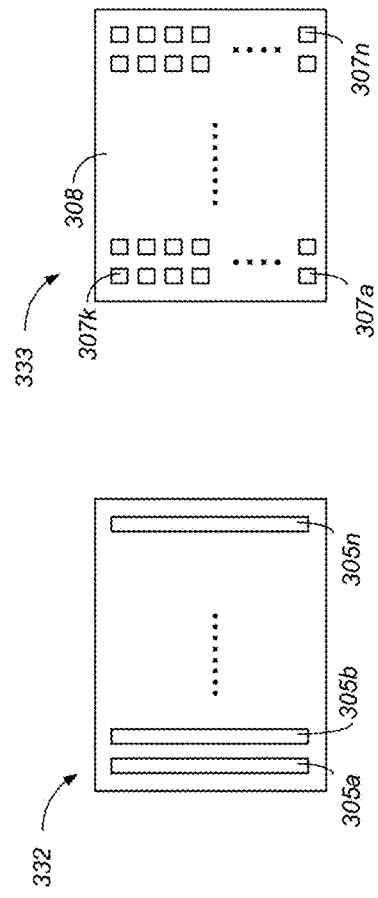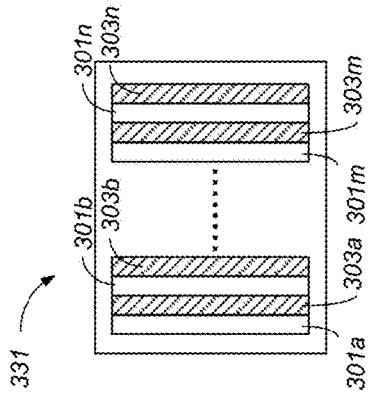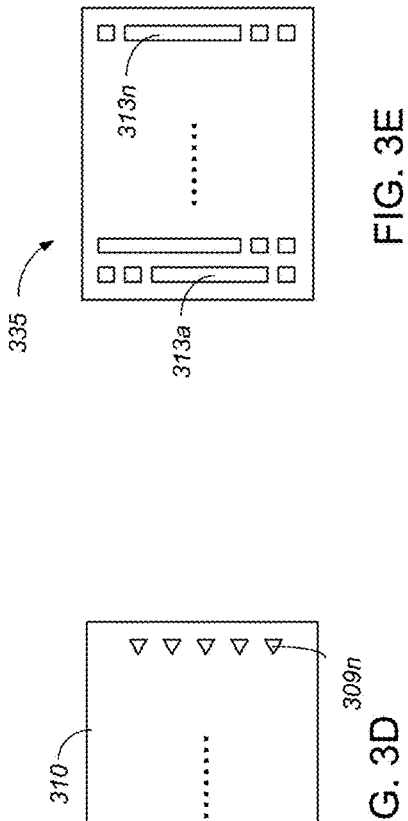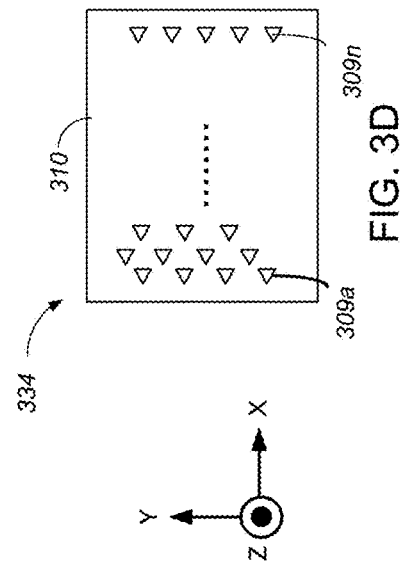

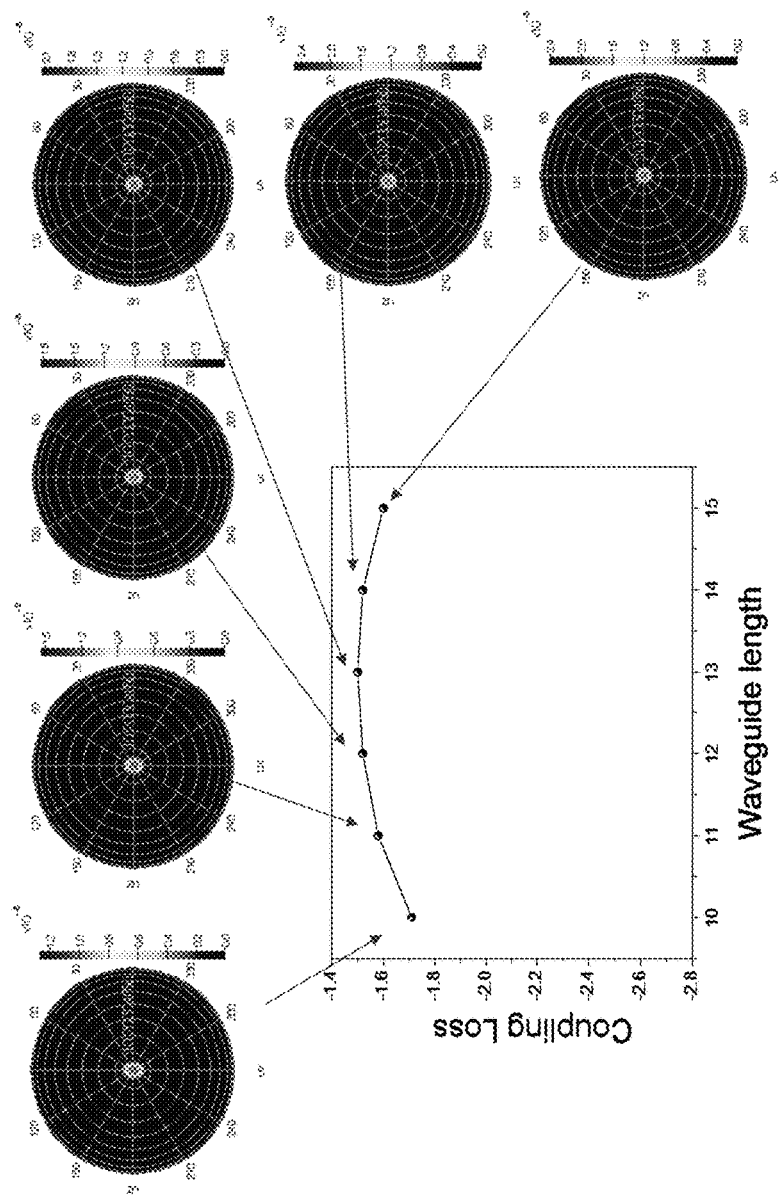
FIG. 8B  W/L ratio beam shape and efficiency

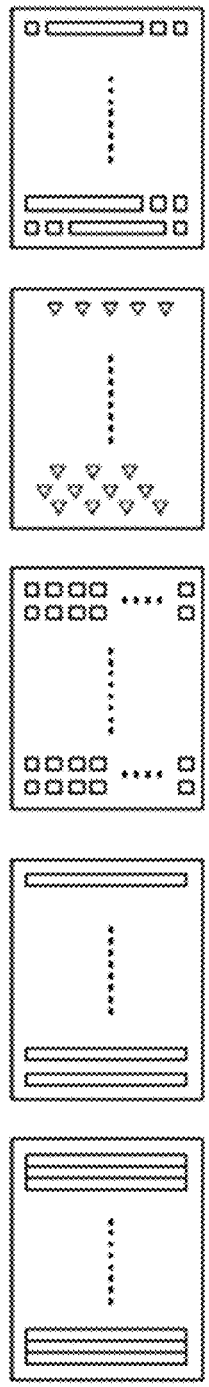
FIG. 17A  FIG. 17B  FIG. 17C  FIG. 17D  FIG. 17E
FIG. 17F  FIG. 17G  FIG. 17H  FIG. 17I  FIG. 17J

GRATING BASED OPTICAL TRANSMITTER

CROSS-REFERENCE TO RELATED APPLICATIONS

This specification is a continuation-in-part of U.S. patent application Ser. No. 14/291,253, titled "Optical device for redirecting incident electromagnetic wave" and filed May 30, 2014, which claims the benefit of U.S. Provisional Patent Application No. 61/979,489, filed Apr. 14, 2014, U.S. Provisional Patent Application No. 61/925,629, filed Jan. 9, 2014, and U.S. Provisional Patent Application No. 61/895,493, filed Oct. 25, 2013, which are incorporated by reference herein.

This specification is also a continuation-in-part of U.S. patent application Ser. No. 14/964,865, titled "Grating Based Optical Coupler" and filed Dec. 10, 2015, which is a continuation of U.S. patent application Ser. No. 14/510,799, filed Oct. 9, 2014, now U.S. Pat. No. 9,239,507, which claims the benefit of U.S. Provisional Patent Application No. 62/014,182, filed Jun. 19, 2014, U.S. Provisional Patent Application No. 62/012,446, filed Jun. 16, 2014, U.S. Provisional Patent Application No. 61/979,489, filed Apr. 14, 2014, U.S. Provisional Patent Application No. 61/946,657, filed Feb. 28, 2014, U.S. Provisional Patent Application No. 61/925,629, filed Jan. 9, 2014, and U.S. Provisional Patent Application No. 61/895,493, filed Oct. 25, 2013, which are incorporated herein.

This specification is also a continuation-in-part of U.S. patent application Ser. No. 14/635,133, titled "GRATING BASED OPTICAL TRANSMITTER" and filed Mar. 2, 2015, which claims the benefit of U.S. Provisional Patent Application No. 62/014,182, filed Jun. 19, 2014, U.S. Provisional Patent Application No. 62/012,446, filed Jun. 16, 2014, U.S. Provisional Patent Application No. 61/979,489, filed Apr. 14, 2014, and U.S. Provisional Patent Application No. 61/946,657, filed Feb. 28, 2014, which are incorporated by reference herein.

This specification also claims the benefit of U.S. Provisional Patent Application 62/194,170, filed Jul. 17, 2015 which are incorporated by reference.

BACKGROUND

This specification relates to coupling light using a grating.

Light propagates inside a photonic integrated circuit, and is coupled to an external medium through a grating fabricated on the photonic integrated circuit. Conventionally, coupling between light and the photonic integrated circuit is achieved by an edge coupling, where an optical facet needs to be prepared and the process is time-consuming and expensive. An emission of a laser diode in the photonic integrated circuit is coupled to the external medium through a grating. Two terminals of the laser diode are used to inject electrical carriers to generate photons, and the photons resonate in a cavity and emit coherent light.

SUMMARY

According to one innovative aspect of the subject matter described in this specification, an optical apparatus includes a light source region configured to generate light; a first reflector region and a second reflector region configured to reflect the generated light to form an interference light along a first direction; an interference region formed between the first reflector region and the second reflector region and coupled to the light source region, and the interference region configured to confine at least a portion of the interference light formed by light reflected between the first reflector region and the second reflector region along the first direction; and a grating region containing a first grating structure and a second grating structure with substantially the same periodicity but different duty cycles, where both grating structures are arranged along the first direction with 180° phase offset, where the grating region is formed on a region confining at least a portion of the interference light, and the grating region is configured to emit at least a portion of the light along a second direction that is different from the first direction.

This and other implementations can each optionally include one or more of the following features. The grating periodicity of the first grating structure substantially may match the periodicity of the interference light inside the interference region. A quarter-wavelength shift region may be formed in the grating region by removing or adding at least one segment of the grating structure. A taper region may be formed in adjacent to the quarter-wavelength shift region along the first direction where the period or duty cycle of the taper region increases or decreases from the side closer to the quarter-wavelength shift region toward the side away from the quarter-wavelength shift region.

The first reflector region may be a surface corrugated grating structure forming a distributed feedback or a distributed Bragg reflector. The duty cycle of the first grating structure of the grating region may be different from the duty cycle of the surface corrugated grating structure of the first reflector region, and the period of the first grating structure may be twice the period of the surface corrugated grating structure. The first grating structure of the grating region may be formed on the same planar surface as the surface corrugated grating structure of the first reflector region.

The light source may be at least partially embedded in the interference region, and may contain alternating III-V material layers forming a quantum well or quantum wire or quantum dot structure. A portion of the grating region may be formed on the interference region, or the first reflector region. The second direction may be substantially perpendicular to the first direction. The grating periodicity of the first grating structure region may be d2, where the interference light inside the interference region may have an intensity periodicity of d1, where d2 substantially equals to 2×d1.

The grating region may have a grating length along the first direction and a grating width along a third direction perpendicular to the first direction at a planar surface, and the grating width may be different from the grating length to obtain an circular beam profile.

The optical apparatus may include an n-doped region and a p-doped region configured to provide an electric field in the interference region with an application of a voltage or a current across the n-doped region and the p-doped region, where the interference region is configured to provide a different interference pattern for the interference light with the application of a voltage or a current across the n-doped region and the p-doped region.

The optical apparatus may include an n-doped region and a p-doped region configured to provide an electric field in the first and/or second reflector region with an application of a voltage or a current across the n-doped region and the p-doped region, where the first and/or second reflector region is configured to provide a different reflectivity with the application of a voltage or a current across the n-doped region and the p-doped region.

The first reflector region or the second reflector region may include one of a corner mirror, a DBR mirror, a DFB mirror, an anomalously dispersive mirror, a waveguide loop mirror, a dielectric layer with a metal mirror, or a metal layer. The grating region may have lattice vectors formed so that the locations of the in-phase antinodes of the interference light inside the interference region substantially match the locations of the grating valleys or peaks.

The optical apparatus may include a first electrode and a second electrode electrically coupled to the light source region, the first electrode and the second electrode configured to generate light through an electrical carrier injection by an electrical field applied between the first electrode and the second electrode. The optical apparatus may include a third electrode electrically coupled to the light source region, the third electrode configured to modulate an electrical carrier concentration in the light source region by an electrical field applied (i) between the first electrode and the third electrode or (ii) between the second electrode and the third electrode.

The light source region may contain at least two different layers of materials and the first electrode and the third electrode are physically in contact to different layers of materials of the light source region. A dielectric layer may be formed between the third electrode and the light source region and the third electrode is configured to modulate the amount of electrical carriers recombined in the light source region through a capacitive effect without injecting electrical carriers into the light source region. At least two different voltage levels can be applied to the third electrode in sequence to modulate the amount of electrical carriers recombined in the light source region to obtain different output light power level.

The grating region and the third electrode may be located on the opposite sides of the interference region, and the light is emitted through the side of the grating region. The grating region and the third electrode may be located on the opposite sides of the interference region, and the light is emitted through the opposite side of the grating region. The grating region and the third electrode may be located on the same side of the interference region, and the light is emitted through the side of the grating region. The grating region and the third electrode may be located on the same side of the interference region, and the light is emitted through the opposite side of the grating region. At least part of the third electrode may be transparent to the light emitting through the side of the grating region.

According to another innovative aspect of the subject matter described in this specification, a method for forming an optical transmitter includes forming a light source region; forming an interference region, a first reflector region and a second reflector region, where the interference region, of which the light source region is at least partially embedded in, is bounded at two opposite ends along a first direction by the first and second reflector region; and forming a grating region including a first grating structure, covering at least part of the interference region, where the first grating structure has periodicity substantially matched to the period of the interference light along a first direction, where light generated by the electrical carrier recombination resonates inside the interference region along the first direction and emits out of the interference region along a second direction that is different from the first direction.

This and other implementations can each optionally include one or more of the following features. The grating region may include a second grating structure with the same periodicity but different duty cycle as the first grating structure, and a third grating structure that is a surface corrugated structure forming a DFB type reflector region. The method may include forming a quarter-wavelength shift region in the grating region by removing or adding at least one segment of the grating structure. The method may include forming a taper region in adjacent to the quarter-wavelength shift region along the first direction where the period and the duty cycle of the taper region increases or decreases from the side closer to the quarter-wavelength shift region toward the side away from the quarter-wavelength shift region. The method may include forming at least three electrodes electrically coupled to the light source region, where the three electrodes arranged to provide a control for relative electrical fields among the three electrodes to modulate an electrical carrier concentration inside the light source region, and one of the electrode is an insulating electrode without electrical carrier injection.

Advantageous implementations may include one or more of the following features. Light may be coupled in or out of a photonic integrated circuit at an angle that is substantially perpendicular to the propagation direction of the light inside the photonic integrated circuit. This perpendicularity may reduce packaging cost and complexity. Reflected light back to the photonic integrated circuit may be minimized by one or more mirrors in the interference region to maintain stability of the photonic integrated circuit. The optical mode profile of the light exiting the grating may be shaped to match the optical mode profile of the external medium to minimize mode matching loss. Since the electric field in the interference region is quite uniform, there is no need for a chirped grating to match a traveling wave caused exponentially-decayed field profile. The interference region or grating may be actively tuned by mechanisms including electrical field, magnetic field or mechanical movement, to control the coupling of light. When the interference region is coupled to an active medium that generates light at a broad wavelength range, the interference region may be used to select a narrower wavelength range from the broad wavelength range. When the interference region is coupled to an absorption medium that detects light, the interference region may be used to increase the absorption efficiency through multiple reflections inside the interference region.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The details of one or more implementations are set forth in the accompanying drawings and the description below. Other potential features and advantages will become apparent from the description, the drawings, and the claims.

BRIEF DESCRIPTION OF THE DRAWINGS

FIGS. 3A-3E show examples of a grating pattern.

FIG. 8B shows a simulation of the effect of changing the W/L ratio of the waveguide on the beam shape/profile.

FIGS. 17A to 17E show the top views of exemplary embodiments of the grating structure 1420.

FIGS. 17F to 17J show the corresponding cross-section views of the exemplary embodiments of the grating structure in FIG. 17A to 17E.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
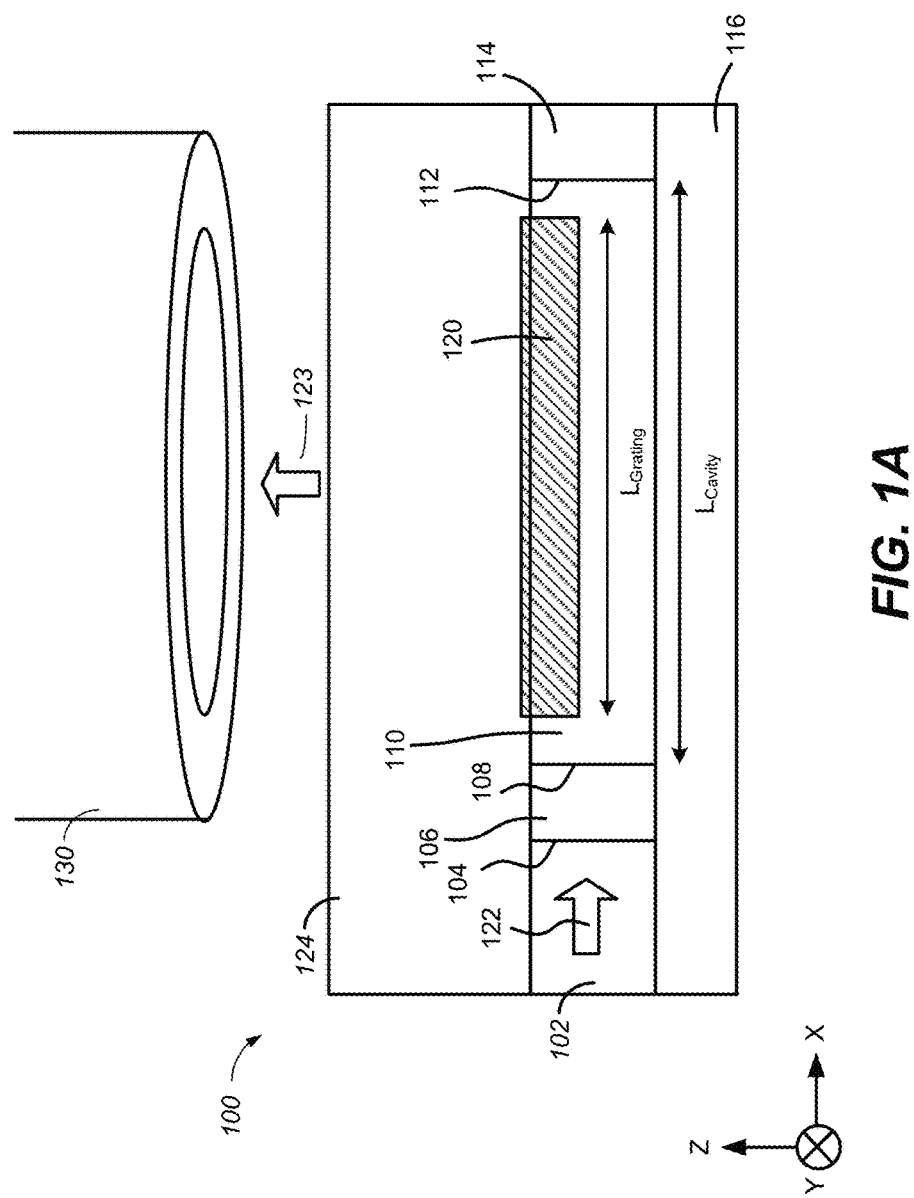
FIG. 1A is a block diagram of an example photonic integrated circuit.

FIG. 1A is a block diagram of an example photonic integrated circuit 100 that includes an grating-based optical coupler for enabling the coupling of light into and out of a photonic integrated circuit 100. In general, an optical coupler with substantial vertical emission is useful for interfacing surface-emitting/receiving optoelectronic devices, and can reduce the packaging cost and complexity due to off-normal configuration. Moreover, compared with edge emitting device, surface emitting device can be characterized at wafer level without dicing and polishing the chips, and hence reduces the overall testing and packaging cost.

The photonic integrated circuit 100 includes one or more optical components fabricated on a substrate 116. The optical components include a waveguide region 102, a first reflector region 106, an interference region 110, a second reflector region 114, and a grating region 120. The substrate 116 may be any type of substrate that is suitable for fabricating a photonic integrated circuit. For example, the substrate 116 may be a silicon wafer, a silicon-on-insulator (SOI) wafer, a III-V semiconductor such as a gallium arsenide (GaAs), an indium phosphide (InP) wafer, or a glass wafer. As another example, the substrate 116 may be a layer of passive or active material deposited over an integrated electronic circuit. As another example, the substrate 116 may be a layer of passive or active material deposited over another integrated photonic circuit.

In general, the waveguide region 102 is configured to confine light along one or more dimensions to guide light along a specific direction. In some implementations, the waveguide region 102 may confine light along one dimension. For example, the waveguide region 102 may be a slab waveguide that confines light along the z direction. In some implementations, the waveguide region 102 may confine light along two dimensions. For example, the waveguide region 102 may be a rib waveguide or a channel waveguide that confines light along the y and z directions, such that the light may propagate along the x direction, as designated by the arrow 122. The term "along the x direction" and their derivatives as used herein may be used to represent bidirectional (±x direction), or unidirectional (+x, −x). Furthermore, when light is traveling inside a multi-mode waveguide placed along the x direction, some portions of the light may travel in zigzag routes inside the waveguide while the overall direction may still be regarded as along the x direction.

In general, the first reflector region 106 and the second reflector 114 are configured to reflect incident light. For example, when light in the waveguide region 102 is incident on an interface 104, some portion of the light may be reflected back to the waveguide region 102, while the remaining portion of the light may be transmitted to the first reflector region 106. Similarly, when light in the first reflector region 106 is incident on an interface 108, some portion of the light may be reflected, while the remaining portion of the light may be transmitted to the interference region 110. Similarly, when light in the interference region 110 is incident on an interface 112, some portion of the light may be reflected, while the remaining portion of the light may be transmitted to the second reflector region 114. In some implementations, a reflector may be an interface between two mediums with different refractive indices.

The portion of the light that is reflected by a reflector may range from near zero percent to near one hundred percent, depending on the design. In some implementations, the first reflector region 106 or the second reflector 114 may be highly reflective. For example, the second reflector 114 may be coated with a metal, such as aluminum, to achieve a high reflectivity. As another example, light may be arrange to be incident on the second reflector 114 beyond a critical angle, where the light is reflected through total internal reflection. As another example, the second reflector 114 may be a Bragg reflector that provides high reflectivity for a range of wavelengths. As another example, the first reflector region 106 may comprise one or multiple slits disconnecting the waveguide region 102 and the interference region 110. As another example, the first reflector region 106 may comprise DBR structure.

In some implementations, the first reflector region 106 or the second reflector 114 may be partially transmissive and partially reflective. For example, the first reflector region 106 may be configured to (i) reflect, by a particular reflectivity, a portion of incident light, and (ii) transmit another portion of the incident light. A partial reflective reflector may be implemented, for example, by depositing a dielectric material having a refractive index that is lower than the material of the waveguide region 102 in the corresponding reflector region. The percentage of reflected and transmitted light may be calculated using Fresnel equations.

In general, the interference region 110 acts as a cavity having a cavity length, $L_{Cavity}$, that is formed between the waveguide region 102 and the second reflector region 114. In some implementations, the first reflector region 106 may be formed between the waveguide region 102 and the interference region 110, where $L_{Cavity}$ may be defined as the length between the first reflector region 106 and the second reflector region 114. In some implementations, an effective refractive index of the waveguide region 102 may be substantially equal to an effective refractive index of the interference region 110. For example, both the waveguide region 102 and the interference region 110 may be fabricated in silicon with the same cross sectional waveguide dimensions along the y-z dimensions. In this case, the effective refractive index of the waveguide region 102 is equal to an effective refractive index of the interference region 110. As another example, both the waveguide region 102 and the interference region 110 may be fabricated in silicon, but the cross sectional waveguide dimensions along the y-z dimensions may vary, which may cause a difference between the effective refractive index of the waveguide region 102 and the effective refractive index of the interference region 110. In this case, the effective refractive index of the waveguide region 102 is treated as substantially equal to the effective refractive index of the interference region 110 as long as a resulting performance degradation, such as an optical loss, caused by the effective refractive index difference is within a range that is acceptable for a targeted application.

The interference region 110 is configured to confine an interference light formed by an incident light and a reflected incident light. For example, a standing wave pattern between the first reflector 106 and the second reflector 114 may be formed in the interference region 110. To have interference formed in the interference region 110, the length of the cavity $L_{Cavity}$ and the parameters of grating region 120 are chosen so that the incident light may reach to and get reflected by the second reflector 114 without being totally attenuated in the first pass propagating from the first reflector 106 to the second reflector 114. In some implementations, the confinement may be a partial confinement, where a portion of the interference light is transmitted through the first reflector 106 back to the waveguide region 102 and/or a portion of the interference light is transmitted through the second reflector 114. The interference of light formed by the incident light and the reflected incident light is described in more details in FIG. 2.

In some implementations, an optical path length of the interference region 110 may be longer than a wavelength of the guided light. In some other implementations, an optical path length of the interference region 110 may be shorter than the wavelength of the guided light. For example, for an interference region 110 composed of silicon having a cavity length of 0.4 µm and a refractive index of 3.45, the interference region 110 has an optical path length of 0.4 µm×3.45=1.38 µm. If the wavelength of the guided light has a wavelength of 1.55 µm, the optical path length of the interference region 110 is shorter than the wavelength of the guided light. In this case, the light having the 1.55 µm wavelength may be coupled to the grating region 120 through an evanescent field of the light confined (partial confinement) in the interference region 110.

In general, the grating region 120 having a grating length of, $L_{Grating}$, is configured either to couple at least a portion of the light in a photonic integrated circuit 100 to an external medium 130, or to couple at least a portion of the light from the external medium 130 to the photonic integrated circuit 100. In some implementations, the grating length $L_{Grating}$ may be shorter than the cavity length $L_{Cavity}$. In some other implementations, the grating length $L_{Grating}$ may be equal to the cavity length $L_{Cavity}$. In some other implementations, the grating length $L_{Grating}$ may be longer than the cavity length $L_{Cavity}$. For example, the grating region 120 may be fabricated on the interference region 110, but a portion of the grating region 120 may be extended into the first reflector region 106, and/or the second reflector region 114, and/or the waveguide region 102. As used in this specification, the grating is formed or fabricated on a region means that the grating is formed above the region, or the grating is embedded at least partially inside the region. For example, the grating may be formed by etching into the region which the grating is disposed over.

In some implementations, the interference region 110 and the grating region 120 may have the same material composition. For example, the grating region 120 may be fabricated by etching a grating pattern directly on the surface of the interference region 110. In some other implementations, the interference region and the grating region may have different material compositions. For example, the grating region 120 may be fabricated by depositing silicon dioxide on the surface of a silicon-based interference region 110. A grating pattern may then be etched on the surface of the silicon dioxide to form an oxide grating. As another example, the grating region 120 may be fabricated by depositing metal on the surface of the interference region 110 and then be etched to form a metal grating. As another example, the grating region 120 may be fabricated by depositing a higher refractive index material on the surface of the interference region 110 having a lower refractive index to improve the grating efficiency by attracting the optical mode toward the grating side. The lower refractive index material can for example be InP and the higher refractive index material can for example be Si.

In general, the grating region 120 redirects light propagating along a first direction to a second direction that is different from the first direction. In some implementations, the grating region 120 may redirect light propagating along a first direction to a second direction that is substantially perpendicular to the first direction. For example, by substantially matching the grating periodicity of the grating region 120 to the interference periodicity in the interference region 110, the grating region 120 may redirect the light propagating inside the waveguide region 102 along the x direction, as designated by the arrow 122, to a perpendicular direction along the z direction, as designated by the arrow 123. The term "substantially match" as used in this application means that a resulting performance degradation, such as an optical loss, due to the mismatch is within an acceptable range for a targeted application. An acceptable range may be, for example, within an order of magnitude. In some other implementations, the grating region 120 may redirect light propagating along the first direction to a second direction that is not substantially perpendicular to the first direction. The term "substantially perpendicular" as used in this application means 90° with an error margin that is acceptable for a targeted application.

The external medium 130 may be any medium that can transmit, guide, detect, or generate light. For example, the external medium 130 may be an optical fiber. As another example, the external medium 130 may be a photodetector. As another example, the external medium 130 may be a light source. In some implementations, a cladding 124 may be formed between the grating region 120 and the external medium 130. The cladding 124 may be formed to protect the photonic integrated circuit 100, or to provide a specific distance between the grating region 120 and the external medium 130. In some implementations, a cross-sectional mode profile of the light emitted from the grating region 120 may be designed to substantially match a cross-sectional mode profile of the external medium 130 configured to receive the light emitted from the grating region. For example, the cross-sectional mode profile of the light emitted from the grating region 120 in the x-y dimensions may be designed to substantially match the cross-sectional mode profile of the single mode fiber in the in the x-y dimensions.

Figure 1B:
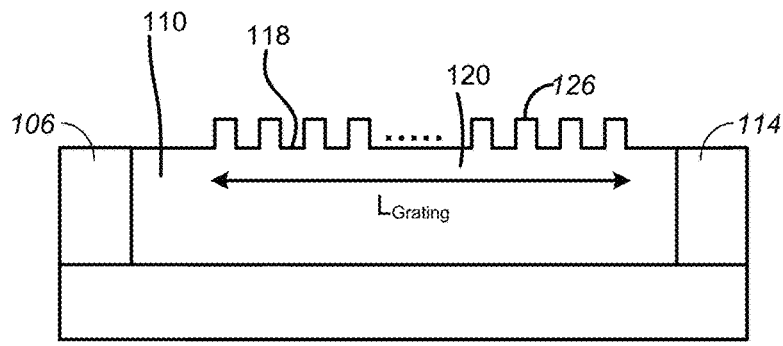
FIGS. 1B, 1C, and 1D show examples of an optical coupler.

FIG. 1B shows an example of an optical coupler 101 that may be implemented in the photonic integrated circuit 100. The optical coupler 101 may also be implemented in any one of the other photonic integrated circuits described throughout this application, or in another photonic integrated circuit not described in this application.

The optical coupler 101 includes an interference region 110 and a grating region 120. The grating region 120 includes grating valleys 118 and grating peaks 126, which together form a grating having a grating length, $L_{Grating}$. The height difference between a grating peak 126 and a grating valley 118 determines a grating height. The ratio of the peak width to the sum of peak width and valley width of the grating along the wave propagation direction determines the duty cycle of the grating. The sum of the grating peak width and the grating valley width determines the period of the grating. By tuning the grating height, the duty cycle, the grating period, the grating shapes, the cladding covering the grating, or a combination of the above, the directionality and far field angle of light emitted/received by the grating region 120 can be determined. For example, the grating height and the duty cycle may be modified to optimize the directionality of the light. As another example, the grating period and the duty cycle may be tuned to achieve the desired far field angles which might be most suitable for a targeted application.

In some implementations, the height of the grating peaks may be higher than the height of the first reflector region 106 and/or the second reflector region 114. For example, the first reflector region 106, the interference region 110, and the second reflector region 114 may be planarized by polishing, and then another layer of material is deposited on the planarized surface so that the grating region 120 may be formed by patterning and etching.

Figure 1C:
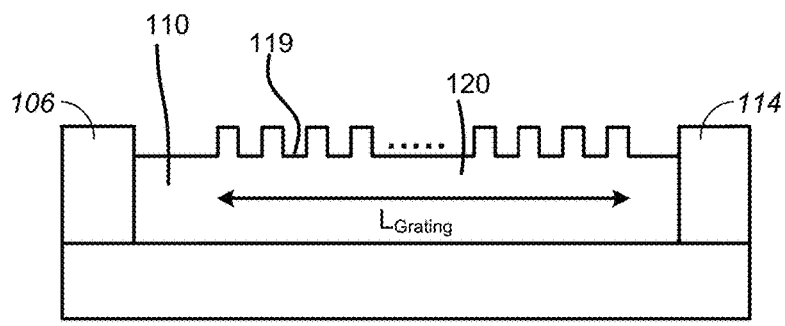

In some other implementations, the height of the grating valleys may be lower than the height of the first reflector region 106 and/or the second reflector region 114. FIG. 1C shows an example of an optical coupler 103 where the height of the grating valleys 119 is lower than the height of the first reflector region 106 and the second reflector region 114. For example, the first reflector region 106, the interference region 110, and the second reflector region 114 may be planarized by polishing, and then the grating region 120 may be formed on the polished surface by patterning and etching the interference region 110. The optical coupler 103 may be implemented in the photonic integrated circuit 100. The optical coupler 103 may also be implemented in any one of the other photonic integrated circuits described throughout this application, or in another photonic integrated circuit not described in this application.

Figure 1D:
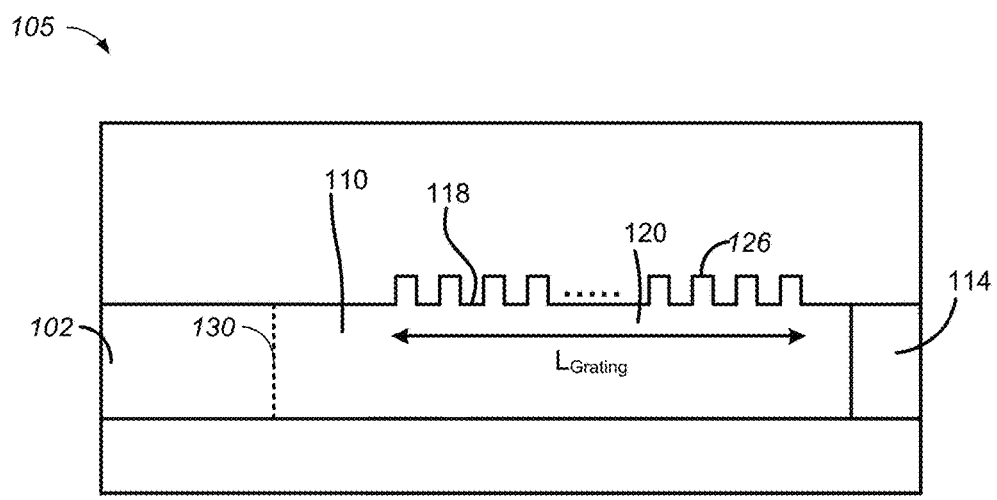

FIG. 1D shows an example of an optical coupler 105 that includes the waveguide region 102, the interference region 110, the grating region 120, and the second reflector region 114, but does not include the first reflector region 106. The boundary 130 between the waveguide region 102 and the interference region 110 is denoted by a dashed line 130 because in some implementations, the waveguide region 102 and the interference region 110 are composed of the same material or having substantially equal effective refractive index.

The optical coupler 105 does not include the first reflector region 106 in the case where light in the interference region 110 is attenuated below a threshold value after propagating one-circulation in the interference region 110. For example, a standing wave may be created in the interference region 110 through interference between forward light incident on the second reflector region 114 and backward light reflected by the second reflector region 114. The standing wave may diminish near the boundary 130 between the waveguide region 102 and the interference region 110 because the light reflected by the second reflector region 114 is attenuated below the threshold value beyond the boundary 130. The threshold value, for example, may be less than 10% of the initial incident light power. By substantially matching the grating pattern in the grating region 120 with the interference pattern in the interference region 110, the optical coupler 105 can be used to redirect light propagating along a first direction to a second direction that is different from the first direction without the first reflector region 106. For example, the optical coupler 105 may be used to direct light to a second direction that is substantially perpendicular to the first direction. In some implementations, without the first reflector region 106, the optical coupler can still redirect an incident light with high efficiency if the light is attenuated below a threshold value after propagating one-circulation in the interference region 110. In some implementations, to maintain high efficiency without introducing the first reflector region 106, the grating region 120 needs to provide enough one-circulation attenuation. For example, the grating length $L_{Grating}$ needs to be long enough to provide sufficient one-circulation attenuation before reaching the boundary 130.

Figure 2:
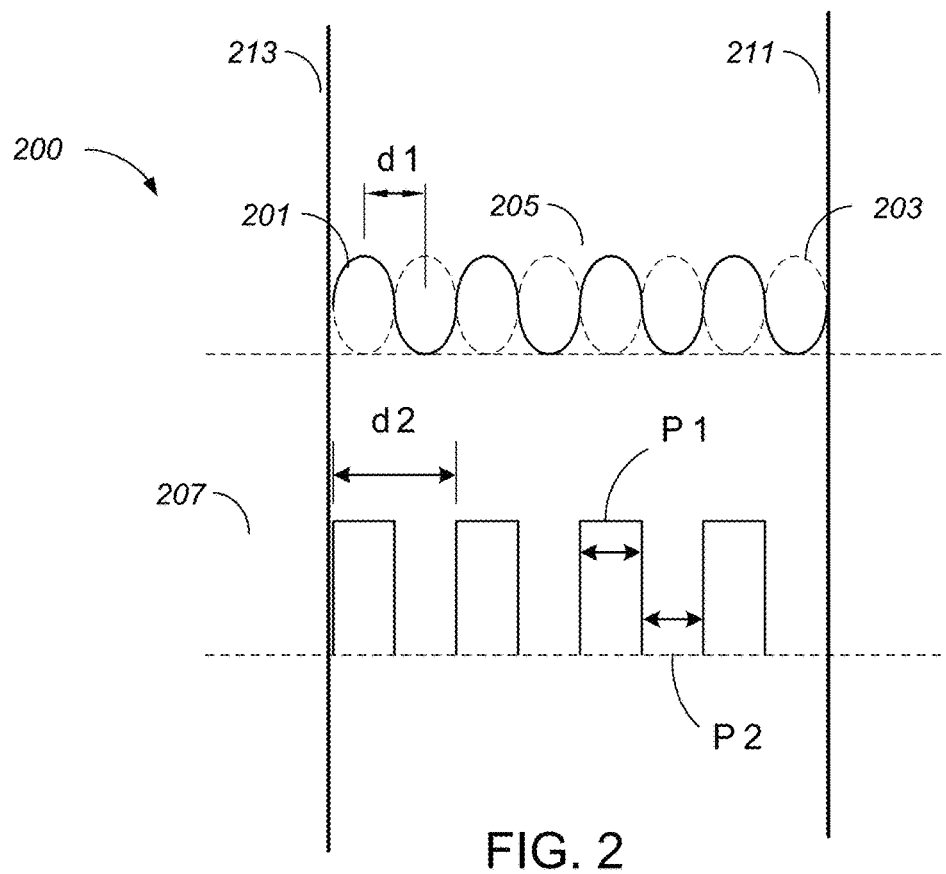
FIG. 2 is an example of interference patterns.

FIG. 2 is an example of a grating pattern 207 that substantially matches standing wave pattern 205 inside the interference region. The descriptions of FIG. 2 may be applied to any one of the optical couplers described in this application. Generally, the round-trip phase shift is the sum of the phase shift introduced by the one-circulation propagation and the phase shift introduced by a reflector. To simplify the description, the phase shift introduced by the reflectors may be assumed to be zero so that the resonant condition "round-trip phase shift equals 2mπ" can be viewed as the same as "one-circulation phase shift equals 2mπ," where m is any integer.

In some implementations, light propagating in a waveguide may be confined by two dimensions. For example, referring to FIG. 1A, light propagating in the waveguide region 102 is confined in y and z dimensions. When the light enters an interference region, the confinement of the waveguide may be weakened, and the light propagates like a point wave inside the interference region. For example, the interference region 110 may be designed to confine light tightly in the z dimension and confine light loosely in the y dimension. The point wave reaches a reflector 211, gets reflected, and a standing wave intensity pattern 205 may be formed inside the interference region through the interference of a forward propagating wave 201 and a backward propagating wave 203.

In some implementations, a grating pattern 207 may be designed to substantially match the standing wave pattern 205. By matching the standing wave pattern 205, this grating pattern 207 may act as an optical antenna and become the most efficient way for light to leave the interference region. Each one period of the grating structure may act to emit the light as a point wave, and all point-wave fronts emitted from individual grating periods are combined into a planar wave front which propagates in a perpendicular direction with low loss. For example, one theoretical condition for an ideal match may be d2~2×d1. In some implementations, there may be two gratings where their individual periodicity (pattern) substantially matches the standing wave periodicity (pattern), i.e., d2~2×d1, so that the two gratings have a similar periodicity. Moreover, the two gratings may differ in, for example, grating peak and/or valley width (duty cycles), and are displaced by a distance corresponding to a π phase shift.

Based on the material quality and the physical dimensions of the interference region and grating structure, an one-circulation attenuation coefficient, a, may be calculated along with a corresponding phase shift for the resonant condition inside the interference region. For example, the interference region may be composed of a material that has a specific absorption coefficient for the guided light, which contributes to the one-circulation attenuation coefficient. As another example, light may be emitted by the grating region during propagation, which also contributes to the one-circulation attenuation coefficient. In general, light is attenuated based on an one-circulation attenuation coefficient after propagating one-circulation in the interference region (i.e., forward propagation from the boundary 213 to the reflector 211, and then backward propagation from the reflector 211 to the boundary 213). The term "one-circulation attenuation coefficient α" as used in this application refers to a ratio between the remaining optical power after the one-circulation attenuation and the initial optical power.

In some implementations, to substantially reduce back reflection loss, a reflector region (e.g., the first reflector region 106) may be placed at the boundary 213, where the reflectivity of the reflector region at the boundary 213 is configured to substantially match the one-circulation attenuation coefficient α. By substantially matching the reflectivity of the reflector region at the boundary 213 with α, the light (from the left-hand side of 213) reflected from the boundary 213 back to the incident light source (at the left-hand side of 213) and the light (from the right-hand side of 213) transmitting through the boundary 213 back to the incident light (at the left-hand side of 213) cancel with each other after multiple passes due to destructive interference, meaning almost all the power of the original incident light (incident from the left of 213 into the region between 213 and 211) is transferred into the region between 213 and 211. In some implementations, the one circulation attenuation coefficient α may be near zero. In this case, the corresponding reflectivity r at the boundary 213 can be set as zero, which corresponds to the optical coupler 105 in FIG. 1D, where the first reflector region 106 is not included in the optical coupler 105. In some implementations, the reflectivity r at the boundary 213 can be set as high as the reflectivity of the reflector 211, (e.g., close to 1), to form a highly confined cavity along the x direction, where the light can enter or leave the cavity through another direction such as in the z direction.

In some implementations, there may be non-ideal factors that affect the performance. For example, a change of effective refractive index may occur from the etching of the grating region on the interference region. As another example, the etching process may not create a straight line from the grating peak to the grating valley. While the theoretical matching condition is d2=2d1, slight deviation from the exact condition may be expected during real implementation. Such deviation does not change the functionality of the optical coupler, but may affect the efficiency. However any reasonable deviation from the ideal case is within the scope of this disclosure, where the efficiency is acceptable for a targeted application. An iterative process of fabricating the optical coupler, testing the optical coupler, and then re-designing the optical coupler may improve this issue.

FIG. 3A shows an example of a view of a grating pattern 331 on a plane along the x-y dimensions. The descriptions of FIG. 3A may be applied to any one of the optical couplers described in this application. The grating pattern 331 includes an array of one-dimensional grating structures 301a-n and 303a-n along the x direction, where n is any integer greater than one. In some implementations, the grating structures 301a-n and 303a-n may be composed of different materials. For example, the grating structures 301a-n may be composed of silicon, and the grating structures 303a-n may be composed of InP. As another example, the grating structures 303a-n may include a layer of metal that forms surface plasmonic effect that couples light from an external medium to the interference region. The arrangement of 301a, 303a, 301 b, 303b, . . . , 301n, and 303n forms the grating in a grating region.

FIG. 3B shows an example of a view of a grating pattern 332 on a plane along the x-y dimensions. The descriptions of FIG. 3B may be applied to any one of the optical couplers described in this application. The grating pattern 332 includes an array of one-dimensional grating structures 305a-n along the x direction, where n is any integer greater than one. In some implementations, the grating structures 305a-n may be grating peaks of a grating. In some other implementations, the grating structures 305a-n may be grating valleys of a grating. The arrangement of 305a, 305b, and 305n forms the grating in a grating region.

FIG. 3C shows an example of a view of a grating pattern 333 on a plane along the x-y dimensions. The descriptions of FIG. 3C may be applied to any one of the optical couplers described in this application. The grating pattern 333 includes an array of two-dimensional rectangular grating structures 307a to 307n along the x direction, and 307a to 307k along the y direction. In some implementations, the rectangular grating structure 307a may be a grating peak of a grating. In some other implementations, the rectangular grating structure 307a may be a grating valley of a grating. In some implementations, the rectangular grating structure 307a may be composed of the same material as the layer 308, such as silicon. In some implementations, the rectangular grating structure 307a may be composed of a different material from the layer 308. For example, the rectangular grating structure 307a may be composed of silicon, and the layer 308 may be composed of InP. In some implementations, the rectangular grating structure 307a may be a square or a non-square, or combinations of both structures. The arrangement of the rectangular grating structures 307a-n and 307a-k on the x-y plane forms the grating in a grating region. In some implementations, the period of the grating along the x direction 321 and the period of the grating along the y direction 322 substantially match the period of interference pattern in the layer 308 along the x and y directions, respectively.

FIG. 3D shows an example of a view of a grating pattern 334 on a plane along the x-y dimensions. The descriptions of FIG. 3D may be applied to any one of the optical couplers described in this application. The grating pattern 334 includes an array of two-dimensional arbitrary-shaped grating structures 309a to 309n, where n is any integer greater than one. In some implementations, the arbitrary-shaped grating structure 309a may be a grating peak of a grating. In some other implementations, the arbitrary-shaped grating structure 309a may be a grating valley of a grating. In some implementations, the arbitrary-shaped grating structure 309a may be composed of a different material from the layer 310. For example, the arbitrary-shaped grating structure 309a may be composed of silicon-dioxide, and the layer 308 may be composed of silicon. In some implementations, the arbitrary-shaped grating structure 309a may be a triangle or an ellipse or combinations of different shapes. The arrangement of the arbitrary-shaped grating structures 309a-n on the x-y plane forms the grating in a grating region.

FIG. 3E shows an example of a view of a grating pattern 335 on a plane along the x-y dimensions. The descriptions of FIG. 3E may be applied to any one of the optical couplers described in this application. The grating pattern 335 includes an array of two-dimensional arbitrary-shaped grating structures 313a to 313n, where n is any integer greater than one. In some implementations, the shape of any one of the arbitrary-shaped grating structures 313a to 313n may be determined using numerical analysis. For example, a finite-difference time-domain (FDTD) analysis program may be used to design the shape of each of the arbitrary-shaped structures 313a to 313n that optimizes the coupling efficiency. In some implementations, the distance between each one of the arbitrary-shaped grating structures 313a to 313n may be determined using numerical analysis. For example, a finite-difference time-domain (FDTD) analysis program may be used to determine the distance between each one of the arbitrary-shaped structures 313a to 313n that optimizes the coupling efficiency. The arrangement of the arbitrary-shaped grating structures 313a-n on the x-y plane forms the grating in a grating region.

In some implementation, the one-dimensional gratings shown in FIG. 3A and FIG. 3B, can have one-dimensional lattice vector (which define the unit cell size) designed so that the so that the locations of the in-phase antinodes of the interference wave substantially match the locations of grating valleys and/or peaks.

In some implementations, the two-dimensional gratings shown in FIG. 3C, FIG. 3D, and FIG. 3E, can have two-dimensional lattice vectors (which define the unit cell size and shape) designed so that the locations of the in-phase antinodes of the interference region substantially match the locations of grating valleys and/or peaks.

Figure 4A:
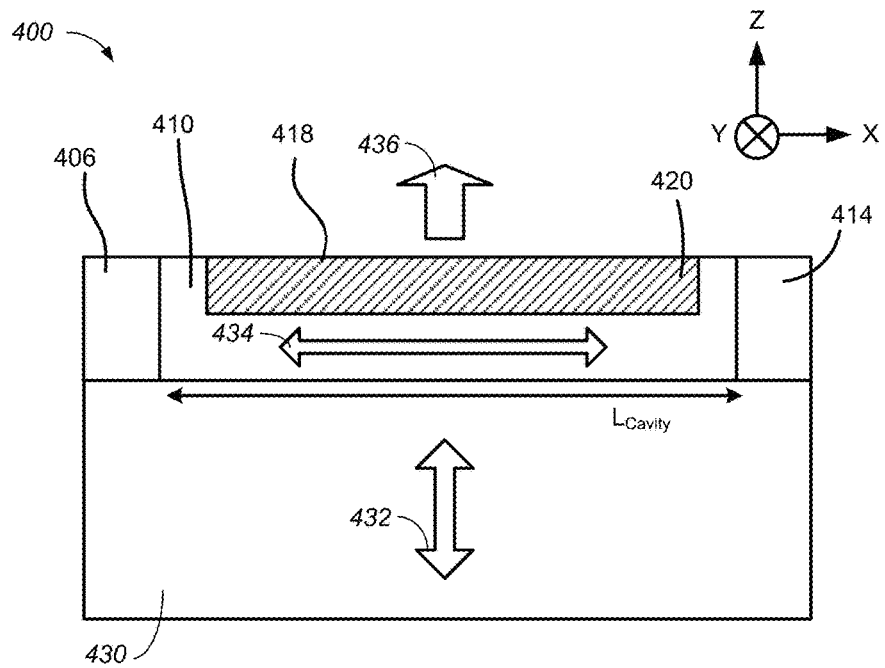
FIGS. 4A-4L show examples of an optical coupler integrated with a light source.

FIG. 4A shows an example photonic integrated circuit 400 having a grating based optical coupler formed on a light source. The photonic integrated circuit 400 includes a light source region 430 configured to generate incident light. In some implementations, the light source region 430 may generate incoherent light. For example, a III-V quantum well or quantum wire or quantum dot laser diode may include one or more layers of active materials that generate incoherent light when pumped with electrical carriers. In some implementations, the incoherent light may be coupled to the interference region 410 through spontaneous emission. In some implementations, the light source region 430 may be confined at other surfaces except the surface coupled to the interference region 410.

The optical coupler includes a first reflector region 406, a second reflector region 414, an interference region 410, and a grating region 420. The structures of the first reflector region 406, the second reflector region 414, the interference region 410, the grating region 420, and the grating 418 may be implemented by any corresponding structures described throughout this application, for example, the corresponding structures in FIGS. 1A-3E. For example, the grating can be implemented as indicated by FIG. 3A, containing two gratings 301a-n and 303a-n, where their individual period matches the interference period (pattern) but with a different duty cycle. As another example, the grating can be implemented as indicated by FIG. 3C, where a two-dimensional rectangular grating structure is formed. In some implementations, the interference region 410 and the grating region 420 is composed of silicon or III-V semiconductors, the light source region is composed of III-V semiconductors, and the first and second reflector regions 406 and 414 include metal coating or bragg reflectors such as DBR and/or DFB (distributed feedback) structures with a bragg period equal to half of a wavelength.

The first reflector region 406 and the second reflector region 414 are configured to reflect incident light at a direction that is opposite to a propagation direction of the incident light as indicated by the arrow 434. The interference region 410 is formed between the first reflector region 406 and the second reflector region 414 and is coupled to the light source region 430. The interference region 410 may be configured to (i) guide the light generated by the light source region 430 to propagate along a first direction (the x direction in FIG. 4A), and (ii) confine interference light formed by light reflected between the first reflector region 406 and the second reflector region 414.

A portion of the light generated in the light source region 430 may be coupled to the interference region 410 through spontaneous emission or any other appropriate coupling mechanism. Light coupled to the interference region 410 may resonate along the x direction, as designated by the arrow 434. Similar to the operations described in FIG. 1A, the first reflector region 406 and the second reflector region 414 provide reflective surfaces that forms a cavity in the interference region 410, where a standing wave pattern may be formed. Since the interference region 410 has a fixed cavity length $L_{Cavity}$, the standing wave can only resonate at certain wavelengths, and the interference region 410 may therefore act as a wavelength filter.

The grating region 420 includes a grating 418 formed on a region confining at least a portion of the interference light. The grating 418 is configured to emit a portion of the light in the z direction that is substantially perpendicular to the x direction. In some implementations, the grating 418 may be designed and fabricated in the grating region 420 to substantially match the standing wave pattern in the interference region 410. By matching the standing wave pattern, the grating 418 may act as an optical antenna and become the most efficient way for light to leave the interference region 410. Each grating period may act to emit the light as a point wave, and all point-wave fronts emitted from individual grating periods are combined into a planar wave front which propagates in the z direction with low loss.

Figure 4B:
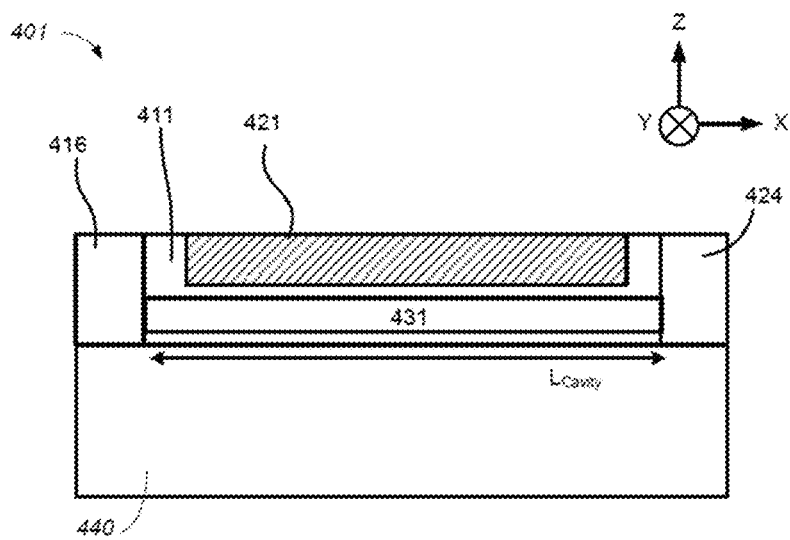

FIG. 4B shows an example photonic integrated circuit 401 having a grating based optical coupler where a light source region 431 is coupled to the interference region 411 by being embedded in the interference region 411. The structures of the first reflector region 416, the second reflector region 424, the interference region 411, the grating region 421 may be implemented by any corresponding structures described throughout this application, for example, the corresponding structures in FIGS. 1A-3E. The light source region includes active material layers such as alternating layers of gallium arsenide (GaAs) and aluminum gallium arsenide (AlGAAs) or alternating layers of InGaAs and InP. Any other combinations of active material layers forming a quantum dot, wire, and well structures that produce incoherent or coherent light are also within the scope of this disclosure.

The interference region 411 is formed between the first reflector region 416 and the second reflector region 424. The first reflector region 416 and the second reflector region 424 may be formed, for example, by metal coating or Bragg reflectors such as DBR and/or DFB structures with a Bragg period equal to half of a wavelength.

Compared to the descriptions of FIG. 4A where the light is generated outside the interference region 410, in FIG. 4B, the light is generated inside the interference region 411. The generated light resonates along the x direction between the first reflector region 416 and the second reflector region 424 in the interference region 411 to produce a coherent light and form a standing wave pattern. The grating region 421 may be designed to substantially match the standing wave pattern, where the coherent light is emitted out of the photonic integrated circuit 401 through the grating region 421 along the z direction. For example, the grating can be implemented as indicated by FIG. 3A, containing two gratings 301a-n and 303a-n, where their individual period matches the interference pattern but with a different duty cycle. As another example, the grating can be implemented as indicated by FIG. 3C, where a two-dimensional rectangular grating structure is formed. In some implementations, the substrate 440 may be used as a supporting layer. In some implementations, the substrate 440 may include an absorption layer to further reduce the light that propagates in the −z direction.

Figure 4C:
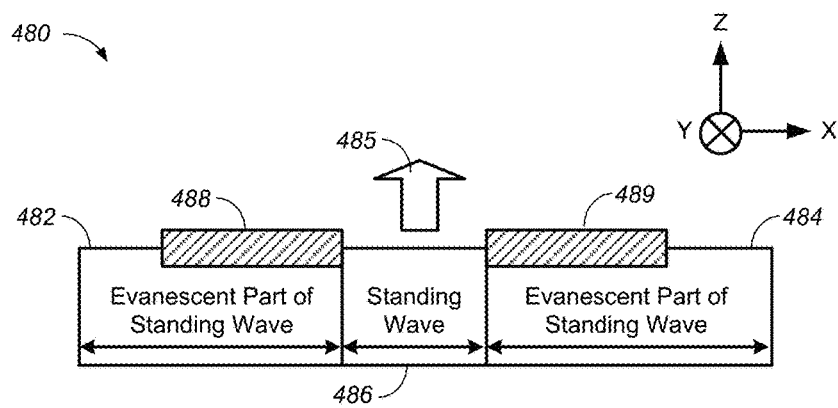

FIG. 4C shows an example photonic integrated circuit 402 having a grating based laser device with the grating regions formed on both of the reflector regions. A standing wave in the interference region may penetrate into both reflector regions forming two evanescent parts of the standing wave when DBR or DFB structure is applied for both reflectors. In some implementations, the two evanescent parts of the standing wave pattern substantially match the grating pattern. In some implementations, the light source region is coupled to the interference region. In some implementations, the light source region is coupled to the interference region by at least partially embedded in the interference region. In some implementations, between the interference region and the grating region or between the grating region and the reflector region, a tapered waveguide distributed feedback or distributed Bragg reflector (DFB or DBR) region can be further included where their period and duty cycle or both can be slightly modified to form a smooth effective index transition from the interference region to the grating region, or from the grating region to the reflector region. In some implementations, the taper region has the same period as the DFB or DBR reflector region but with its duty cycle being gradually increased or decreased along the direction from the interference region to the reflector region. The descriptions of the aforementioned taper region with its period/duty increased or decreased gradually may be applied to any one of the optical couplers described in this application.

Figure 4D:
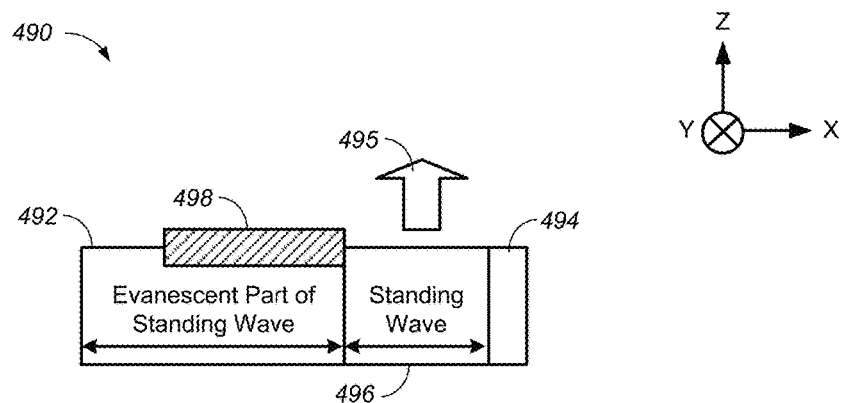

FIG. 4D shows an example photonic integrated circuit 404 having a grating based laser device with the grating region formed on one of the reflector regions. A standing wave in the interference region may penetrate into one reflector region forming an evanescent part of the standing wave when DBR or DFB structure is applied for one reflector. In some implementations, the evanescent part of the standing wave pattern substantially matches the grating pattern. In some implementation, the light source region is coupled to the interference region. In some implementations, the light source region is embedded in the interference region.

Figure 4E:
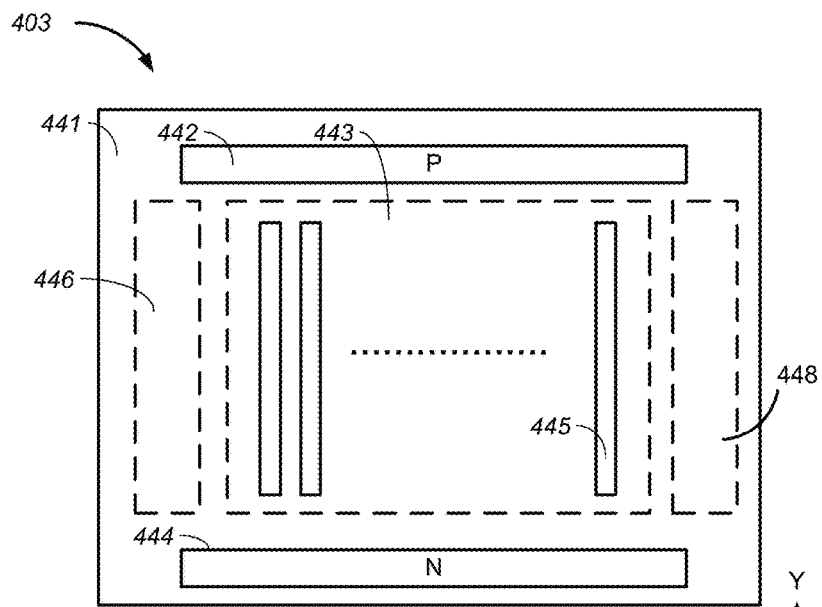

FIG. 4E shows an example photonic integrated circuit 403 having a grating based optical coupler integrated with a light source, where the interference light can be controlled by a p-n junction. The photonic integrated circuit 403 includes a light source region 441, a p-doped region 442, an interference region 443, an n-doped region 444, a grating region 445, a first reflector region 446, and a second reflector region 448. The structures of the light source region 441, the p-doped region 442, the interference region 443, the n-doped region 444, the grating region 445, the first reflector region 446, and the second reflector region 448 may be implemented by any corresponding structures described throughout this application, for example, the corresponding structures in FIGS. 1A-3E.

Similar to the descriptions of FIG. 4A, incoherent light is generated in the light source region 441, where a portion of the light is coupled to the interference region 443. The coupled light resonates along the x direction between the first reflector region 446 and the second reflector region 448 in the interference region 443 to form a standing wave pattern and generate coherent light. A grating in the grating region 445 is designed to substantially match the standing wave pattern, and the coherent light may be emitted out of the photonic integrated circuit 403 through the grating 443 in the +z or −z direction, depending on the design of the grating 445.

In some implementations, the n-doped region 444 and a p-doped region 442 may be configured to provide an electric field in the interference region 443 with an application of a voltage or a current across the n-doped region 444 and the p-doped region 442. The interference region 443 may be configured to provide a different interference pattern with the application of a voltage or a current across the n-doped region 444 and the p-doped region 442 due to the generation, recombination, injection or depletion of free carriers. In the case where the interference pattern is changed due to the change of refractive index, the interference region 443 may stop lasing or may support another lasing wavelength. Therefore the application of a voltage or a current across the n-doped region 444 and the p-doped region 442 can act as a tunable wavelength lasing mechanism or a modulation to the coherent light.

Here, incoherent light is generated in the light source region 441, where a portion of the light is coupled to the interference region 443. For example, the light source region 441 may include an indium gallium arsenide (InGaAs) quantum well or quantum wire or quantum dot structure. The coupled light resonates between the first reflector region 446 and the second reflector region 448 in the interference region 443 to generate coherent light and form a standing wave pattern. A grating in the grating region 445 is designed to substantially match the standing wave pattern, and the coherent light is emitted out of the interference region 443 through the grating region 445 along a direction that is substantially perpendicular to the resonating direction of the interference light. In some implementations, taper regions can be used in the interference region or the reflector region where the narrower part of the taper region is used to suppress high-order modes and the wider part of the taper region, for example, the grating region 445, may be used to match the external coupling device with different beam shape, area and numerical aperture requirements. The descriptions of the taper region width may be applied to any one of the optical couplers described in this application. In some implementations, a reflector region (ex: DBR structure, metal coating, etc) can be used either on top or beneath the interference region 443 to modify the directionality into the other direction.

Figure 4F:
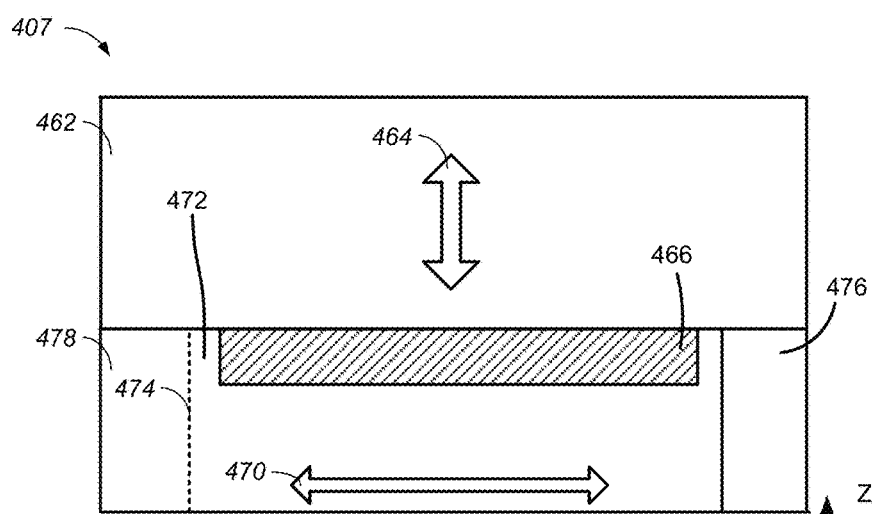

FIG. 4F shows an example photonic integrated circuit 407 having a light source region 462 coupled to a grating based optical coupler through the grating region 466. The photonic integrated circuit 407 includes a light source region 462, a first reflector region 478, a second reflector region 476, an interference region 472, a boundary 474, and a grating region 466. The structures of the light source region 462, the first reflector region 478, the second reflector region 476, the interference region 472, and the grating region 466 may be implemented by any corresponding structures described throughout this application, for example, the corresponding structures in FIGS. 1A-3E. For example, the grating can be implemented as indicated by FIG. 3A, containing two gratings 301*a-n* and 303*a-n*, where their individual period matches the interference pattern but with a different duty cycle. As another example, the grating can be implemented as indicated by FIG. 3C, where a two-dimensional rectangular grating structure is formed. As another example, the first reflector region 478 and the second reflector region 476 may be formed, for example, by metal coating or Bragg reflectors such as DBR and/or DFB structures with a Bragg period equal to half of a wavelength.

Here, incoherent light is generated in the light source region 462 and coupled to the interference region 472 through spontaneous emission or another suitable coupling mechanism. The coupled incoherent light is reflected by the reflector regions 476 and 478, and resonates along the x direction. The coherent light, when reaching lasing threshold, can emit either in the +z or −z direction depending on the design of the grating region 466. In some implementations, the grating region 466 can be designed to direct light mostly to the −z direction so that the emitted light does not couple back to the light source region 462.

In some implementations, the reflector 478 can be a partial reflector with less reflectivity than the reflector 476. The incoherent light generated in the light source region 462 can couple to the interference region 472 through spontaneous emission, and resonates along the direction 470. When reaching the lasing threshold, the coherent light can propagate in the −x direction through the boundary 474 into the partial reflector 478 and then into a waveguide, and at the same time propagate in the +z or −z direction into an external medium for further processing.

Figure 4G:
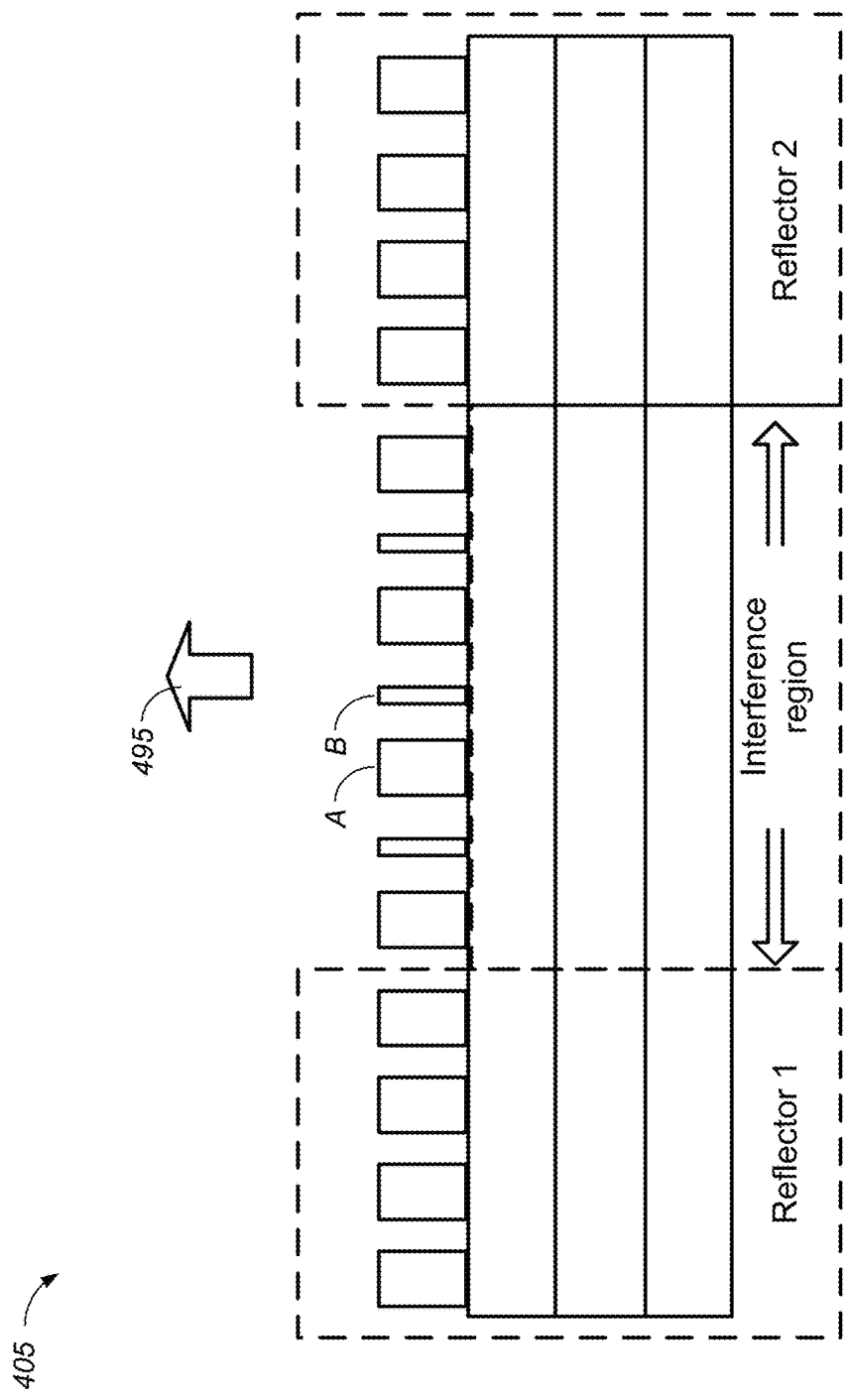

FIG. 4G shows an example photonic integrated circuit 405 exhibiting a grating based laser device with two grating structures having a similar period in the interference region. The two grating structures A and B in FIG. 4G may correspond to 301*a-n* and 303*a-n* in FIG. 3A, where one may differentiate grating A from grating B by for example the two different grating peak widths. The two grating structures are formed on the interference region, which may be interpreted as being bounded by reflector 1 and 2. The two grating structures re-direct the coherent light that propagates and resonates in the lateral direction to the upward or downward vertical direction by tuning the grating parameters (ex: grating height, duty cycle, refractive indices of the layer materials) of the two grating structures to achieve the desired directionality. In some implementations, the effective refractive index of the region above the two grating structures is smaller than the effective refractive index of the two grating structures. In some implementations, the effective refractive index of the interference region is smaller than the effective refractive index of the two grating structures. In some implementations, the two grating structures A and B each have duty cycle less than 50%. Electrical contacts to the laser device can be made either from the top surface or the bottom surface. In some implementations, electrical contact to the laser device can be made from the top surface and the emitting light can be redirect in the downward direction so that the laser device can be flip-chip bonded to a substrate for high speed electrical contact performance without blocking the vertical emission light.

Figure 4H:
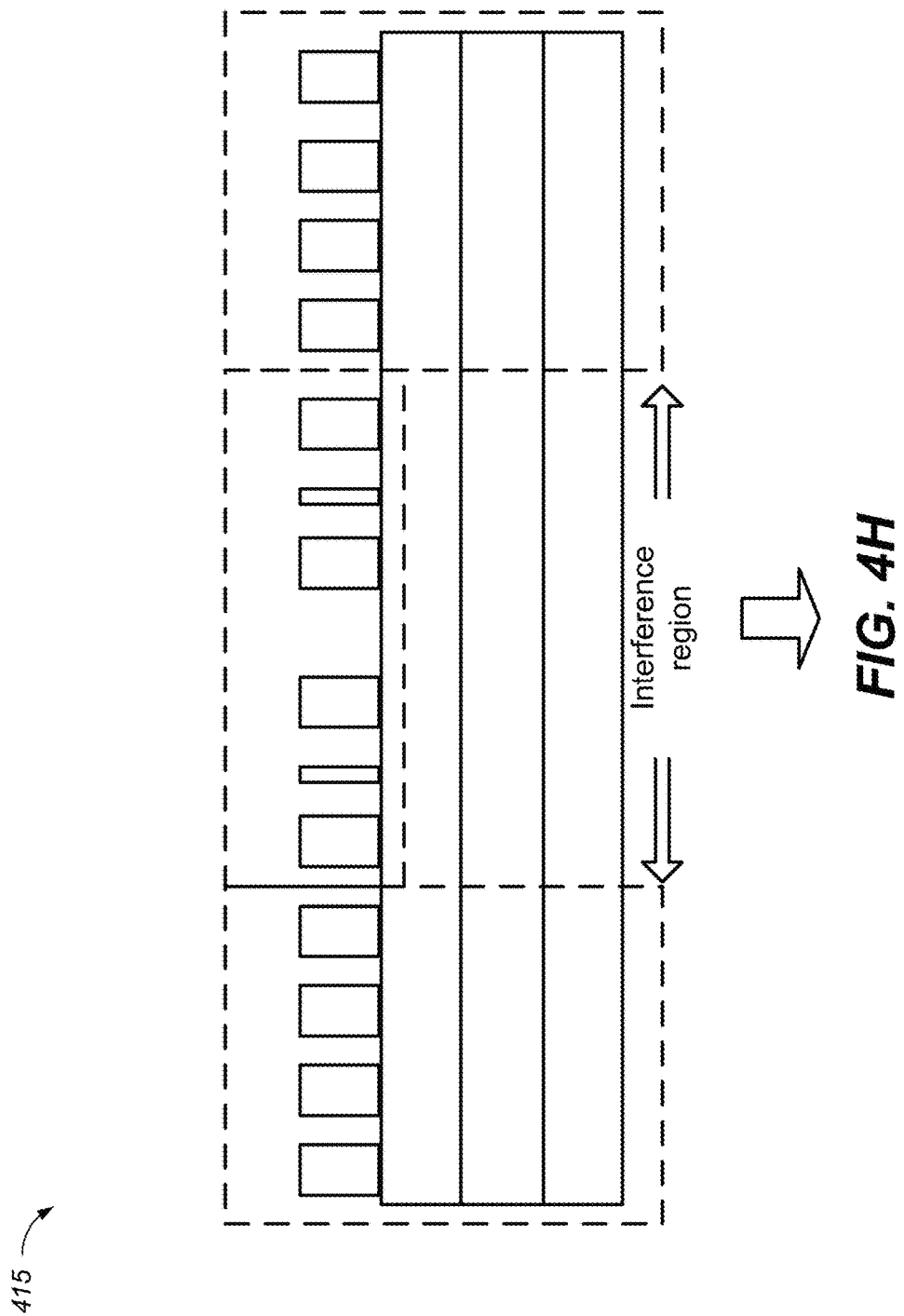

FIG. 4H shows an example photonic integrated circuit 415 exhibiting a grating based laser device with two grating structures having a similar period and a quarter-wave shift in the interference region. Compared to the laser device shown in FIG. 4G that may support two lasing modes, the quarter-wave shift introduced in the interference region breaks the symmetry by removing one segment from the grating structure so that the laser device shown in FIG. 4H may support only one lasing mode. In some implementations as shown in the figure, electrical contact to the laser device can be made from the top surface and the emitting light can be redirect in the downward direction so that the laser device can be flip-chip bonded to a substrate for high-speed electrical contact performance without blocking the vertical emission light.

Figure 4I:
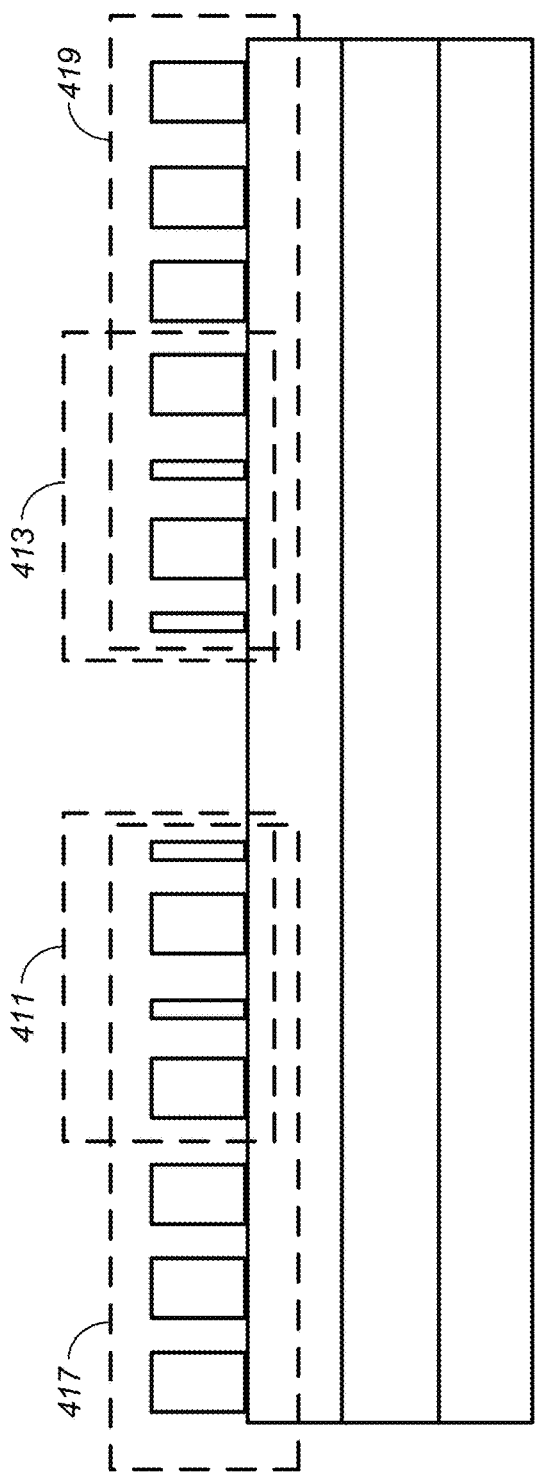

Another way to interpret the laser device in FIG. 4H based on the concept in FIG. 4C is shown in FIG. 4I. Two grating regions 411 and 413 separated by the quarter-wave shift are formed where each grating region partially overlaps with a reflector region 417 and 419. The two grating-reflector overlapping regions re-direct the coherent light that propagates and resonates in the lateral direction to the vertical direction, and support only one lasing mode. In some implementations, electrical contact to the laser device can be made from the top surface and the emitting light can be redirect in the downward direction so that the laser device can be flip-chip bonded to a substrate for high speed electrical contact performance without blocking the vertical emission light.

Figure 4J:
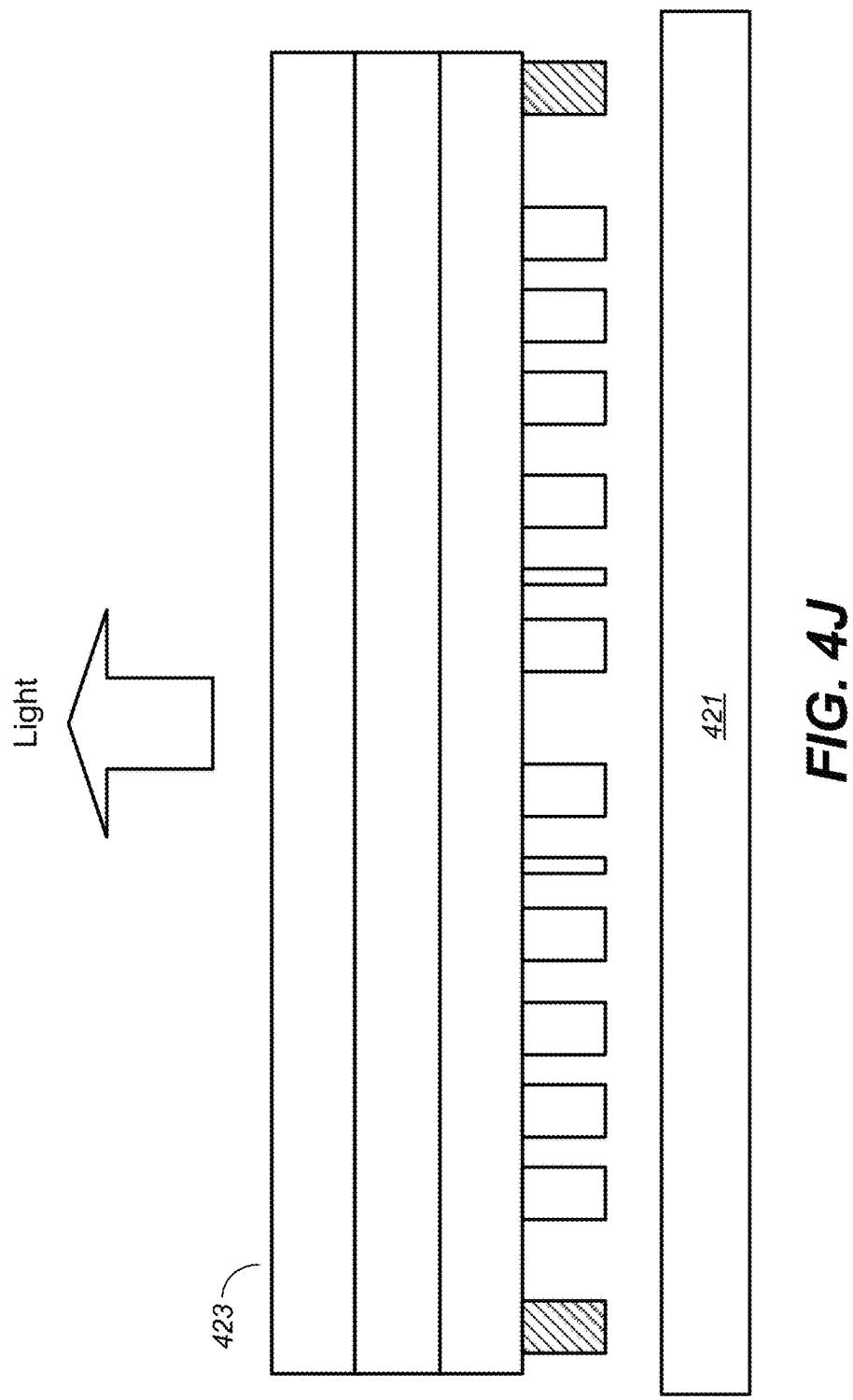

FIG. 4J shows one implementation where the grating based laser device 423 is flip-chip bonded to a substrate 421 and the light is emitting from the back side of the laser device. In some implementations, the backside of the grating based laser device 423 where the light is emitting can be further recessed to facilitate the light emission.

Figure 4K:
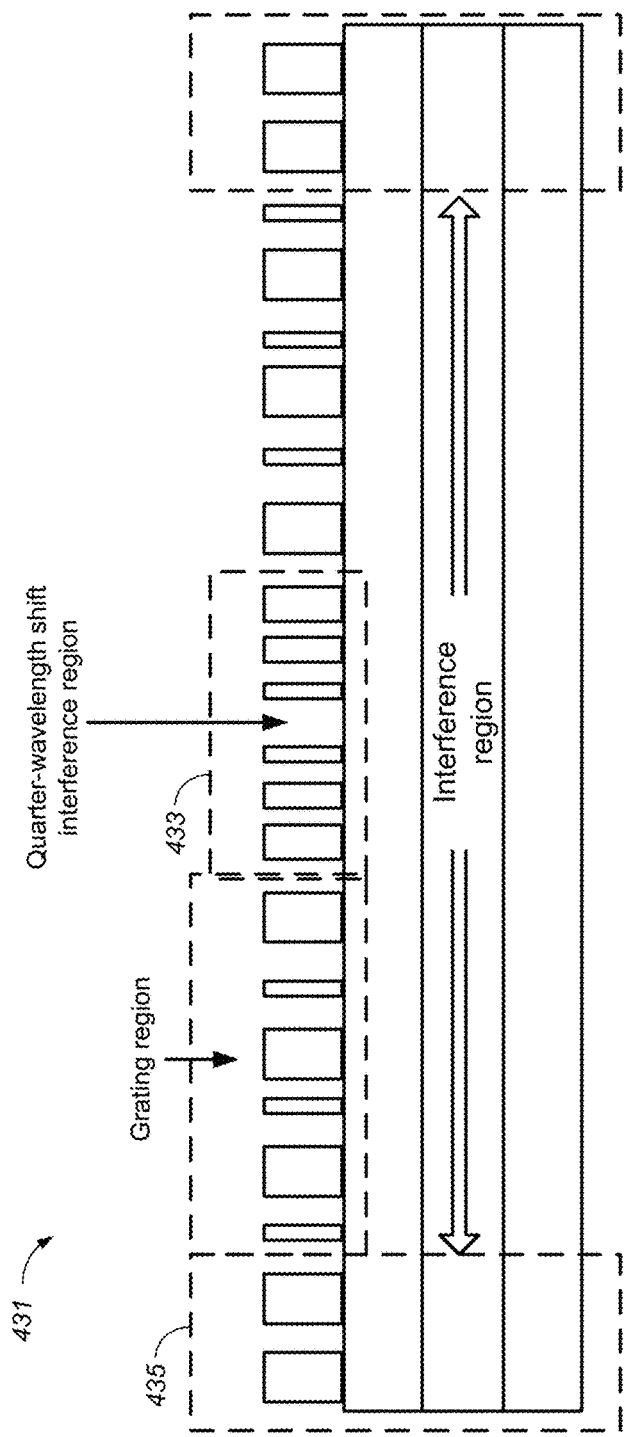

FIG. 4K shows an example photonic integrated circuit 431 exhibiting a grating based laser device with two grating structures having a similar period and a quarter-wave shift in the interference region. Compared to the laser device shown in FIG. 4H, FIG. 4K further illustrates a period/duty cycle taper region 433 between the quarter-wavelength shift interference region and the grating region. In some implementations, the taper region 433 has similar or smaller periods compared to the period of the DFB reflector region 435, namely d1, but with its duty cycles being gradually increased along the direction from the center to the reflector region as shown in FIG. 4K. In some implementations, the same concept of this period/duty cycle taper region can be implemented between the grating region and the reflector region.

Figure 4L:
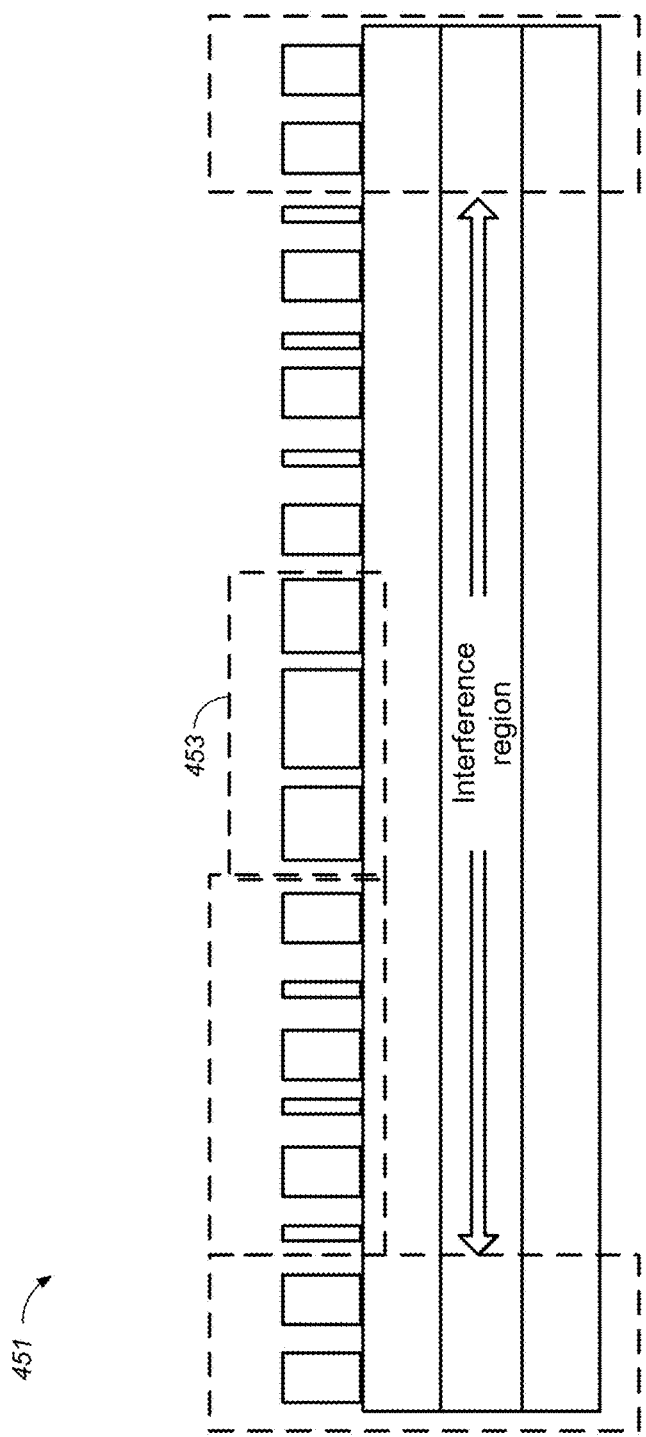

FIG. 4L shows an example photonic integrated circuit 451 exhibiting a grating based laser device with two grating structures having a similar period and a quarter-wave shift in the interference region. Compared to FIG. 4K, In FIG. 4L the quarter-wave shift introduced in the interference region breaks the symmetry by adding one segment to the grating structure. In some implementations, the taper region 453 has similar or larger periods compared to the period of the DFB reflector region, namely d1, but with its duty cycles being gradually decreased along the direction from the center to the reflector region as shown in FIG. 4L.

For a conventional laser diode, the basic functioning principle is by supplying electrical carriers from two terminals (P and N) or electrodes into a light source region including at least one photon emitting materials (PEM) such as III-V semiconductors to be as a gain material. The terminals are usually forward-biased to let electrons and holes meet in the PEM, recombine and emit photons. As shown previously in FIG. 1A, the first reflector 106 and the second reflector 114 define the resonance structure (namely, the interference region or cavity 110), which extends along a lateral direction while the re-directed light is emitted along a vertical direction 123. When the interference region 110 contains PEM layer and two terminals are provided such that photons can be generated in the interference region 110, these photons can resonate between two reflectors 106 and 114 along a lateral direction. In this disclosure, a third type of terminal, functioning as a gate terminal (the conventional two terminals can be viewed as the "conducting terminals"), is included to attract/repel/inject/retrieve certain type of the carriers toward the gate region, hence modulating the amount of carriers to be recombined. The electrical contact of this terminal can be of many forms, such as a direct metal contact (ex: MESFET type), a junction type (ex: JFET type), or through a dielectric for field control (MOSFET type). While there are many possible implementations for this control terminal, the core concept is to provide a second set of electrical field to alter the amount of carriers recombined in addition to the first set of electrical field that is used to inject carriers to generate photons. Such a "gate control" scheme can have a larger modulation bandwidth compared to a conventional direct modulation of a laser diode. It may also enable advanced modulation schemes by encoding more than one bit of data (on/off) with multiple levels of applied voltages/currents to the gate resulting into different output light power levels. This type of modulation is similar to amplitude modulation, which is by applying different voltage levels to the gate. Various exemplary embodiments for realizing this gate-controllable lateral resonance optical emitter structure are described in more details in the following paragraphs.

Figure 5A:
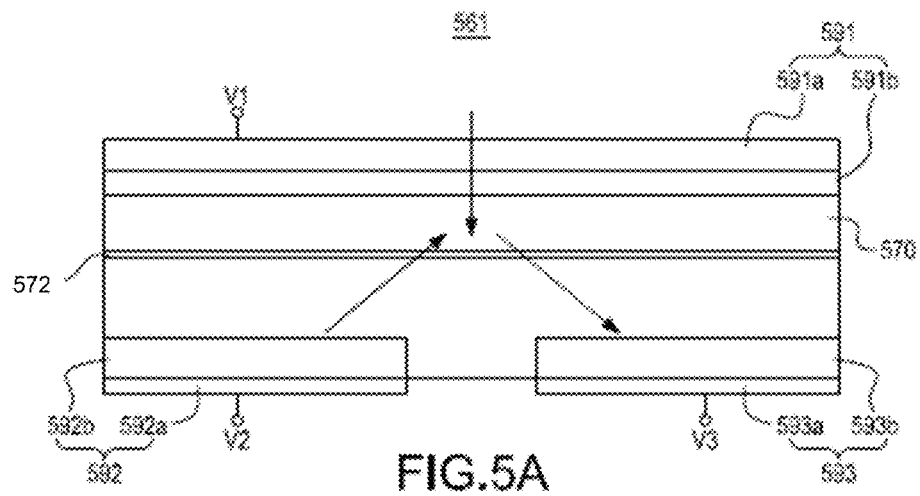
FIGS. 5A-5K show block diagrams of a grating-based laser device.

FIG. 5A shows the cross-sectional view of an exemplary optical apparatus 561 for light emission. The optical apparatus 561 for light emission comprises a light source region 570, which includes a photon emitting materials (PEM) layer 572. Moreover, the light source region 570 can be an interference region bounded by two reflectors. The optical apparatus 561 further comprises a first electrode 591 coupled to the light source region 570, a second electrode 592 coupled to the light source region 570, and a third electrode 593 coupled to the light source region 570. As also shown in this figure, the first electrode 591 comprises a conducting layer 591a and a doped region 591b. The conducting layer 591a is, for example, a metal layer, and the doped region 591b is, for example, an n type doped region. Similarly, the second electrode 592 comprises a conducting layer 592a and a doped region 592b. The conducting layer 592a is, for example, a metal layer, and the doped region 592b is, for example, a p type doped region. Namely, the first electrode 591 and the second electrode 592 are of different polarities such that carriers (electrons and holes) can be injected into the light source region 570. For example, electrons are injected into the PEM layer 572 through the n type doped region 591b and holes are injected into the PEM layer 572 through the p type doped region 592b such that electrons and holes are combined in the PEM 572 to generate photons. The third electrode 593 comprises a conducting layer 593a and an insulating layer 593b where the insulating layer 593b is between the conducting layer 593a and the light source region 570. In some implementations, the conducting layer 593a includes doped polysilicon or metal and the insulating layer 593b includes oxide or nitride or semi-insulating III-V semiconductors. As shown in this figure, a voltage V1 is applied to the first electrode 591, a voltage V2 is applied to the second electrode 592 and a third voltage V3 is applied to the third electrode 593, where V2>V1. In some implementations, the electrode with the lowest voltage can be used as ground. In some implementations, if V3>V2, then the third electrode 593 attracts electrons (shown by dashed line) and reduces the amount of electrons to recombine with holes from the second electrode 592. In some implementations, if V2>V3>V1, then the third electrode 593 attracts both holes from the second electrode 592 and electrons from the first electrode 591. In some implementations, if V3<V1, then the third electrode 593 attracts holes from the second electrode 592. In some implementations, if V3 is intended to be larger than V2, then the third electrode 593 could be P-type; and if V3 is intended to be smaller than V1, then the third electrode 593 could be N-type.

Note that other similar structures where a third electrode other than the conventional two conducting electrodes are also possible and should be included in this disclosure as long as it follows the key concept. Some more examples are shown in the block diagrams included in FIGS. 5B-5G. Typically, the optical apparatus for light emission according to one implementation comprises a third electrode modulating the amount of electrical carriers for recombination, and a lateral optical cavity structure for light resonance, which are shown by the examples before.

Figure 5B:
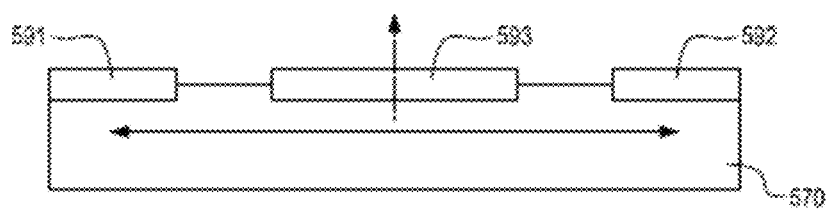
Figure 5C:
Figure 5D:
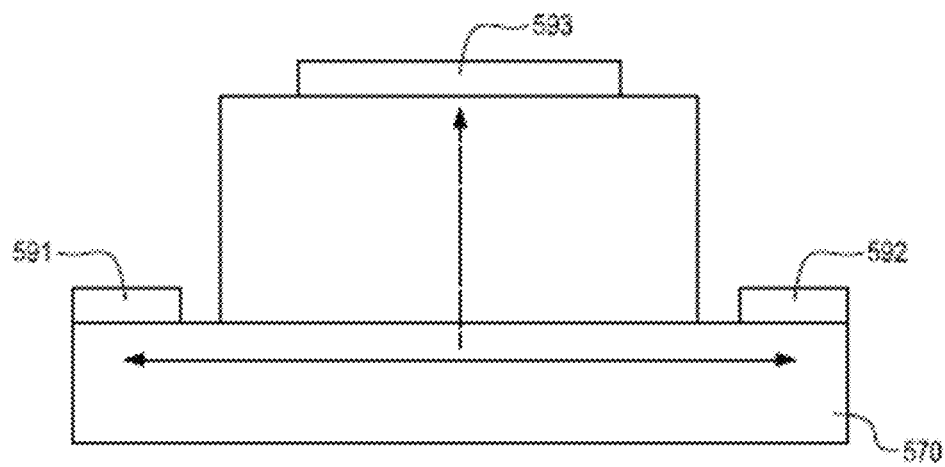
Figure 5E:
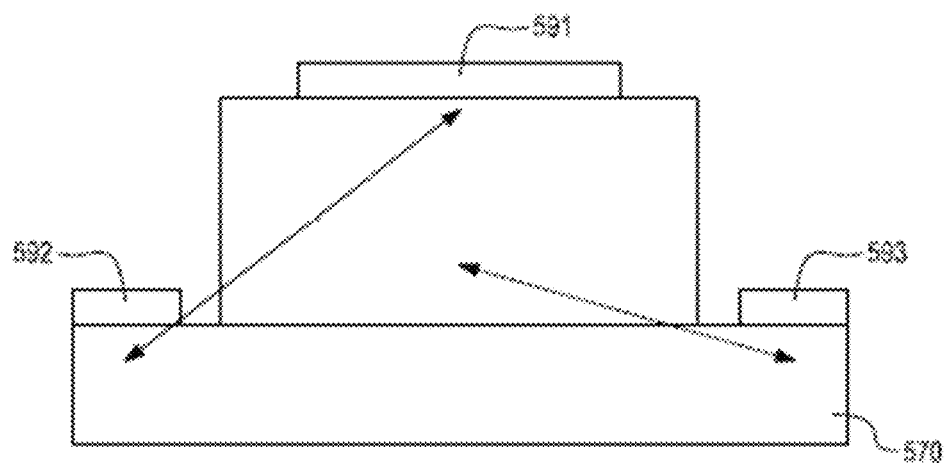

FIGS. 5B-5E show the block diagrams of the optical apparatus for light emission with lateral cavity. In these examples, V1 and V2 are used as the voltages applied to the "conducting" electrodes (namely, the first electrode 591 and the second electrode 592) of the laser, and V3 as the voltage applied to the "modulating" electrode (namely the third electrode) to control the amount of carriers recombined to emit photons. The P or N type is omitted here in the description to be more generic. The solid-line with two arrows indicating the region where recombination takes place, and is usually inside III-V semiconductors, III-V semiconductor based quantum well structure, III-V semiconductor based quantum wire structure, III-V semiconductor based quantum dot structure, or other materials with direct bandgap. As shown in FIG. 5B, the first and the second electrode 591 and 592 are located at two opposite sides of the interference region 570. The photon emitting materials (PEM) is omitted here in the description and can be viewed as being partially embedded inside the interference region 570. The third electrode 593 is located between the first and the second electrode 591 and 592 to modulate the carries between the first electrode 591 and the second electrode 592. As shown in FIG. 5C is another implementations while the third electrode 593 is located outside the connection path of the first and the second electrode 591 and 592. In this scenario, the third electrode 593 might still perform modulation function by drawing carrier from the carrier-recombination region. In the examples shown in FIGS. 5B and 5C, the electrodes are located on similar levels. In the example shown in FIGS. 5D and 5E, at least one of the electrodes is located on different layer with other electrodes. Similar to the example shown in FIG. 5A, the first electrode 591 comprises a conducting layer and a doped region. Namely, the first electrode 591 and the second electrode 592 are of different polarities such that carriers (electrons and holes) can be injected into the light source region. The third electrode 593 comprises a conducting layer and an insulating layer where the insulating layer is between the conducting layer and the interference region 570. Moreover, in the examples shown in FIGS. 5B to 5E, light reflectors (not shown) are arranged on two opposite faces of the interference region 570 and corresponds to the arrow directions of the solid-line region in FIG. 5D. After applying electrical current or voltage between the first and the second electrode 591 and 592, photons can be generated and resonate along the solid-line region and bounded by the light reflectors in FIG. 5D. An electrical voltage or current can be applied to the third electrode 593 to attract or repel carries (shown by dashed line) and hence changing the amount of electrons or holes to recombine in the interference region, thus realizing the modulation function. Compared to FIG. 5D, FIG. 5E shows another implementation by switching the positions of one conducting electrode and one modulating electrode. The injection path (solid line) and modulating path (dashed line) are changed accordingly.

Figure 5F:
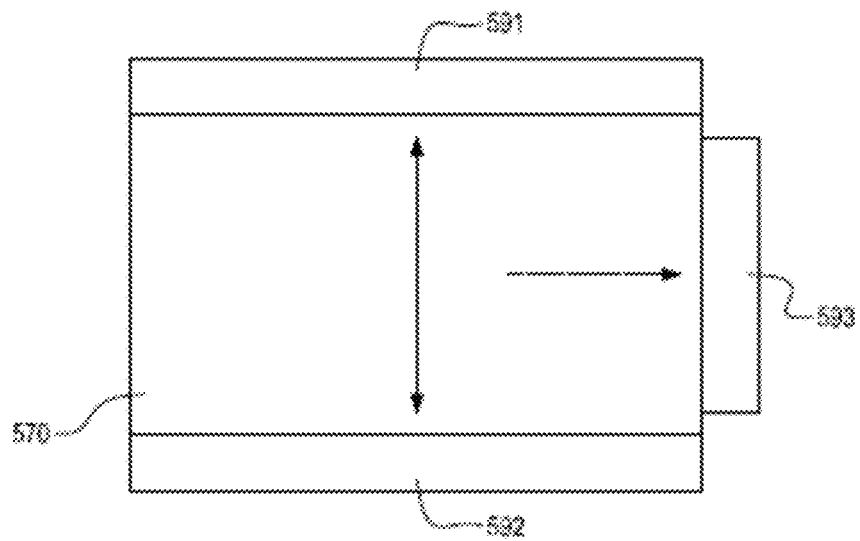
Figure 5G:
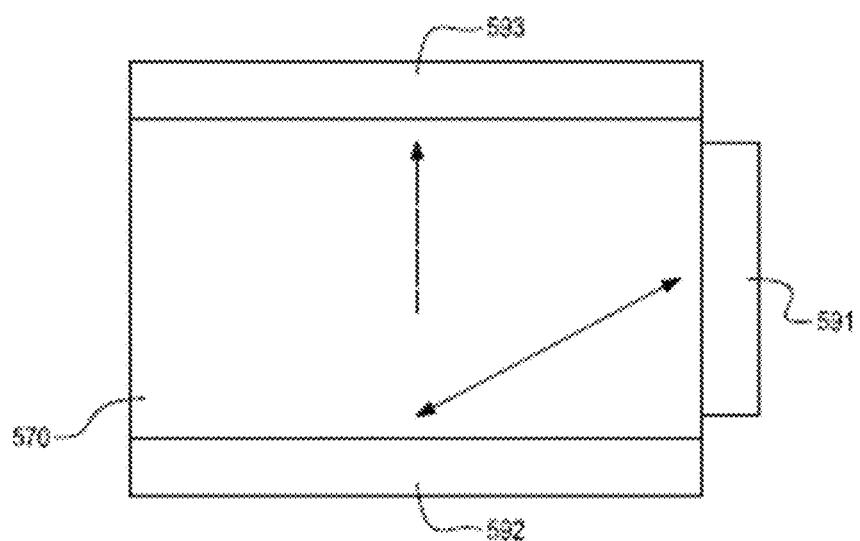
Figure 5H:
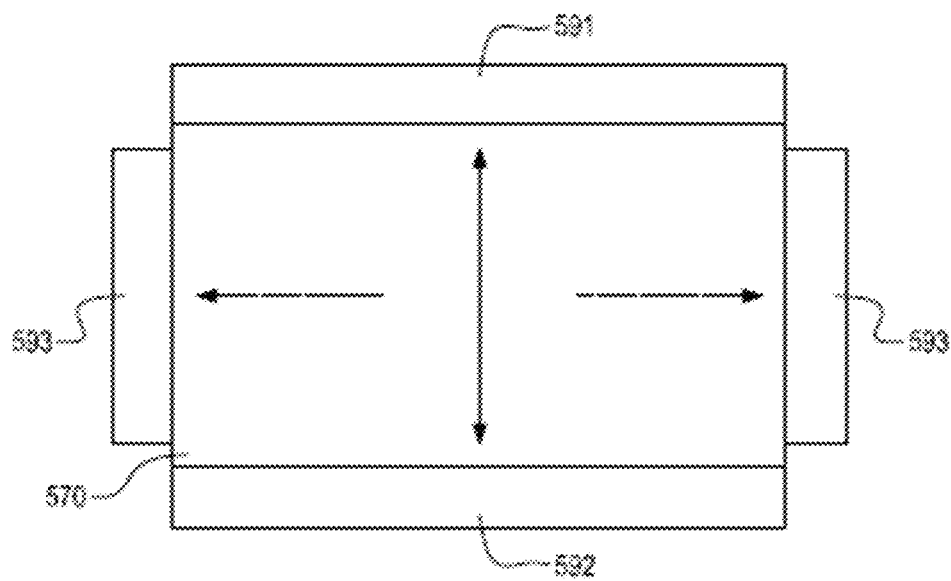
Figure 5I:
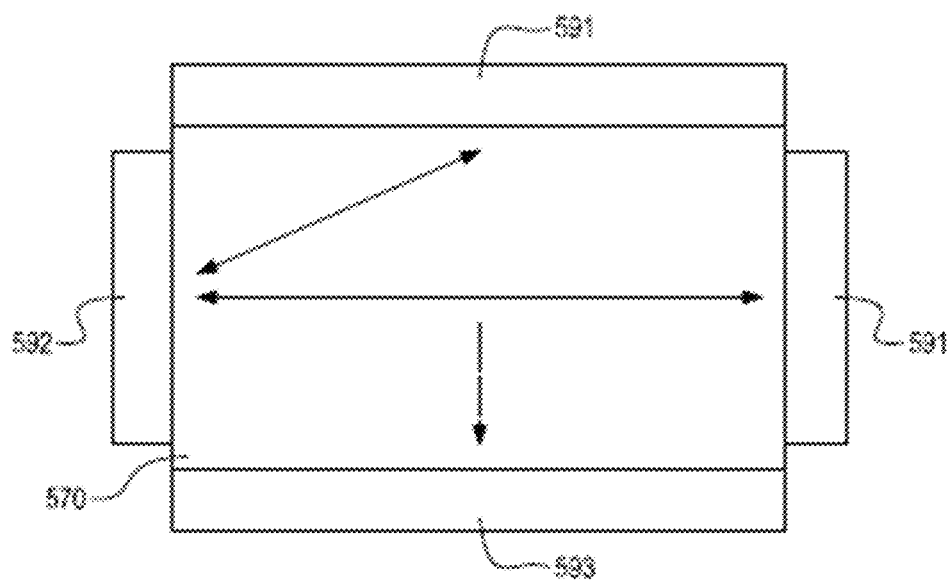
Figure 5J:
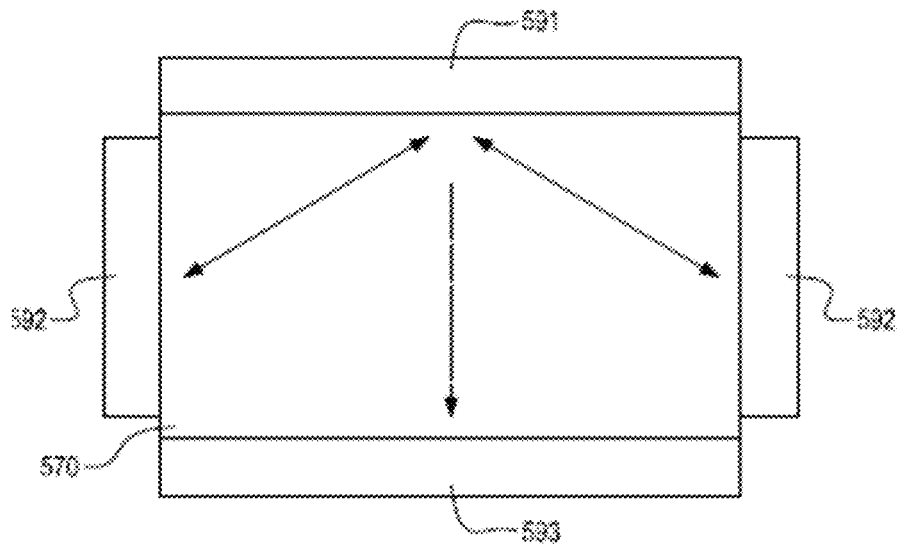
Figure 5K:
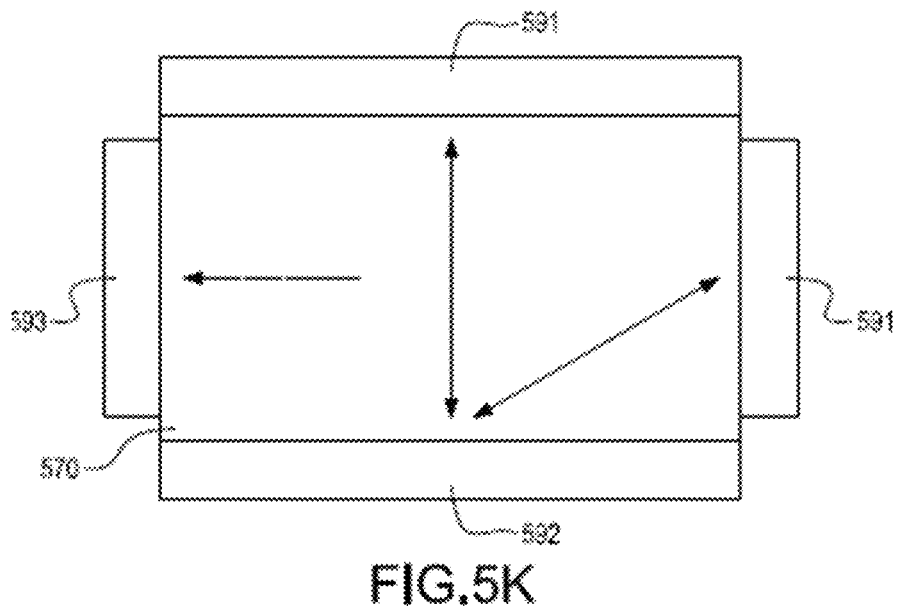

FIGS. 5F-5K show the block diagrams of optical apparatus for light emission with several other implementations electrode orientations similar to the numbering and notations used in FIGS. 5A-5E. FIG. 5F shows an implementation with vertically oriented conducting electrodes 591 and 592 and a sidewall modulating electrode 593. FIG. 5G shows sidewall conducting electrodes 591 and 592 with a top modulating electrode 593. FIG. 5H shows the implementation similar to FIG. 5F but with more than one modulating electrode 593. FIG. 5I shows two conducting paths (the solid lines) and a vertical modulating electrode 593 at the bottom. FIG. 5J shows two conducting paths (the solid lines) and a vertical modulating electrode 593 at the bottom. FIG. 5J shows two conducting paths (the solid lines) and a modulating electrode 593 at the sidewall.

Since all the major elements shown in the examples can be combined to form other designs or implementations, such as the relative orientations of the quantum well or quantum wire or quantum dot structures of the PEM to the cavity (for example, in parallel or vertical to the resonance region), the grating form, using two conventional conducting electrodes or including an additional modulating electrode, these figures shown here are just a few examples within many possible implementations of this disclosure. Therefore, any design/structure following the concept of this disclosure should still be considered as within the scope of this disclosure. Also, different electrodes and contacts can locate at different layers either in a lateral or vertical orientation. Note that the figures shown as design examples are not drawn to scale for simplified viewing purpose. Also, the interference region (cavity) can include PEM such as GaAs, InGaAs, InGaAsP, InGaAsN, InAs, silicon nanocrystal, germanium nanocrystal, or other materials as long as the PEM layers can be added on top or least partially embedded in the interference region through bonding or material growth. Furthermore, more than one cavity can be cascaded along the resonance direction for a wider operation bandwidth. Therefore, any implementation following the concept set forth by the claims should be considered as within the scope of this disclosure.

Figure 6A:
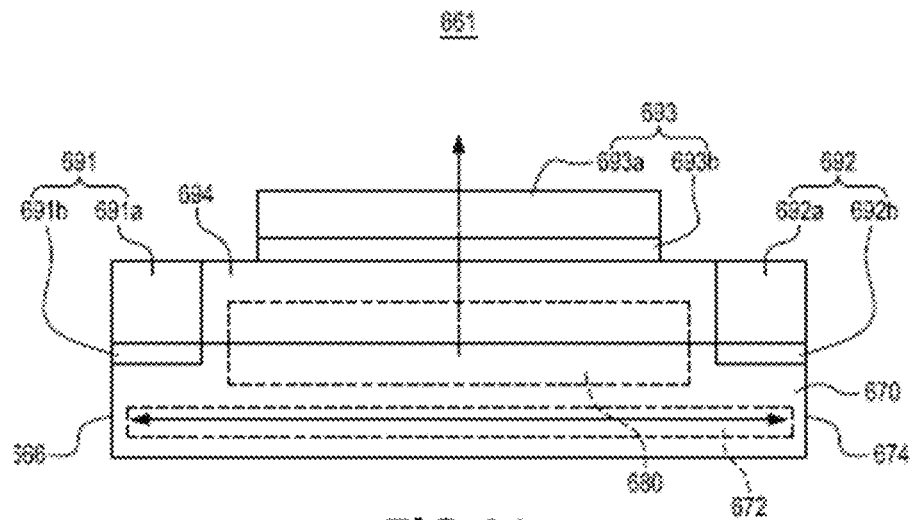
FIGS. 6A-6G show examples of a grating-based laser device with front-side modulation.

FIG. 6A shows the cross-sectional view of an exemplary grating based laser device (hereinafter laser device) 661 with front-side modulation, where front-side modulation means that the modulation gate is at the side with light emission. The laser device 661 includes active material layers such as alternating layers of gallium arsenide (GaAs) and aluminum gallium arsenide (AlGaAs) or alternating layers of InGaAs and InP as photon emitting material (PEM) 672, which is optically coupled to the interference region 670. Any other combinations of active material layers forming a quantum dot, wire, and well structures that produce incoherent or coherent light are also within the scope of this disclosure. The laser device 661 includes an interference region (cavity) 670 bounded by a first reflector 666 and a second reflector 674. In the shown example, the laser device 661 further includes a grating region 680 formed in an upper portion of the interference region 670. The laser device 661 further includes a first contact 691, a second contact 692 and a third contact 693, where the first contact 691 and the second contact 692 are placed at two ends of the interference region 670 while the third contact 693 is placed atop the interference region 670 and between the first contact 691 and the second contact 692. The first electrode 691 comprises a conducting layer 691*a* and a doped region 691*b*. The conducting layer 691*a* is, for example, a metal layer, and the doped region 691*b* is, for example, an n type doped region. Similarly, the second electrode 692 comprises a conducting layer 692*a* and a doped region 692*b*. The conducting layer 692*a* is, for example, a metal layer, and the doped region 692*b* is, for example, a p type doped region. Namely, the first electrode 691 and the second electrode 692 can be of different polarities such that carriers (electrons and holes) can be injected into the interference region 670 and recombined in the PEM 672. For example, electrons are injected through the n type doped region 691*b* and holes are injected through the p type doped region 692*b* such that electrons and holes are recombined to generate photons. The third electrode 693 comprises a conducting layer 693*a* and an insulating layer 693*b* where the insulating layer 693*b* is formed between the conducting layer 693*a* and the light source region 670. Moreover, the conducting layer 693*a* includes doped poly-silicon or metal and the insulating layer 693*b* includes oxide or nitride or other semi-insulating III-V semiconductors. In some implementations, the interference region includes electrical conducting materials such that the carriers injected from the contacts can be transferred into the PEM region for recombination to generate photons.

Taking N type as an example for the first contact (electrode) 691 and P type as an example for the second contact 692, electrons will be injected at N type contact 691 and holes will be injected at P type contact 692 as voltages V1 and V2 (V2>V1) are applied to the first contact 691 and the second contact 692, respectively. Accordingly, photons are generated at the active material layers 672 when the electrons are recombined with the holes. If a voltage V3 applied to the third contact 693 is larger than V2, the third contact 693 will attract electrons (as shown by dashed line) and reduce the amount of electrons to recombine with holes from P type contact 692. If V2>V3>V1, the third contact 693 will attract both electrons and holes from the N type contact 691 and the P type contact 692, respectively. If V3<V1, the third contact 693 will attract holes from the P type contact 692. In this manner, the third contact 693 is used for carrier modulation for the laser device 661. The third contact 693 may be separated with the interference region 670 by a medium 694 to adjust the electrical field penetrating into the interference region. The medium 694 can be omitted if a direct carrier modulation mechanism such as PN (junction type) or MS (direct metal contact type) modulation is applied. In the laser device 661 shown in FIG. 6A, carriers (electrons or holes) are injected into the PEM region 672 which is optically and electrically coupled to the interference region 670 when suitable voltages are applied to the first contact 691 and the second contact 692, respectively.

The structures of the first reflector 666, the second reflector 674, the interference region 670, and the grating region 680 may be implemented by any corresponding structures described throughout this application, for example, the corresponding structures in FIGS. 1A-3E. For example, the grating can be implemented as indicated by FIG. 3A, containing two gratings 301*a-n* and 303*a-n*, where their individual period matches to the interference period but with a different duty cycle. As another example, the grating can be implemented as indicated by FIG. 3C, where a two-dimensional rectangular grating structure is formed. As another example, the first reflector region 666 and the second reflector region 674 may be formed, for example, metal coating or bragg reflectors such as DBR and/or DFB structures with a bragg period equal to half of a wavelength. In some implementations, the interference region 670 is composed of III-V semiconductors, and at least one of the first reflector 666 and second reflector 674 includes a corner mirror, a DBR mirror, a waveguide loop mirror, or a metal layer. The generated light resonates along the direction between the first reflector 666 and the second reflector 674 in the interference region 670 to generate coherent light and form a standing wave pattern. The grating region 680 may be designed to substantially match the standing wave pattern, where the coherent light is emitted out of the laser device 661 through the grating region 680 along a direction different from the resonance direction. In some implementations, the grating has lattice vectors formed so that the locations of the in-phase antinodes of the light inside the interference region 670 substantially match the locations of the grating valleys or peaks. In some implementations, the third contact 693 is a transparent material (such as ITO) to pass the re-directed coherent light.

Figure 6B:
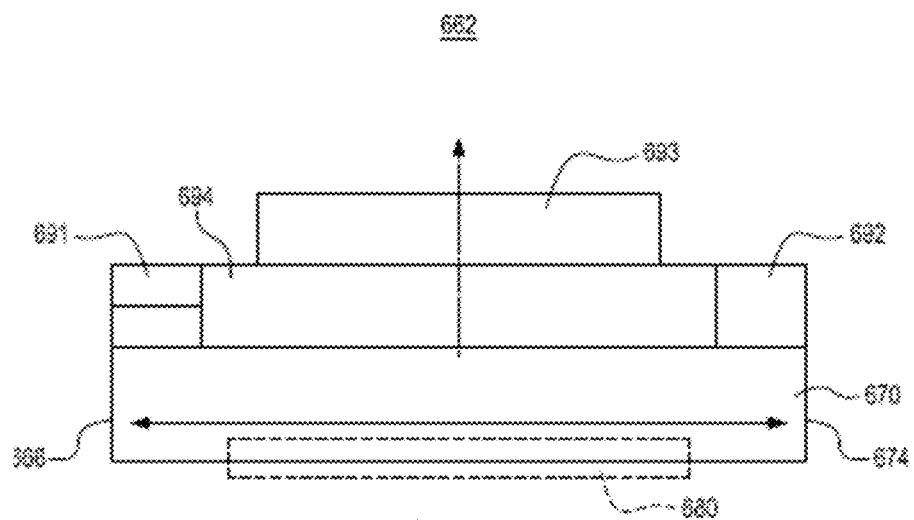

FIG. 6B shows the cross-sectional view of an exemplary grating based laser device (hereinafter laser device) 662 with front-side modulation. The laser device 662 is similar to that shown in FIG. 6A except that the grating region 680 is located on the bottom portion of the interference region 670. In FIG. 6B, elements similar to those of FIG. 6A use the same numerals for brevity, and these elements also have the same or similar materials/composition/function as those shown in FIG. 6A. Moreover, in the laser device 662 shown in FIG. 6B, the first contact 691 and the second contact 692 are in contact with different epitaxy grown layers such that the first contact 691 and the second contact 692 are located at different vertical layers. In some implementations, the first electrode 691 is in contact to an N type III-V semiconductor, the second electrode 692 is in contact to a P type III-V semiconductor where the N type and P type materials are both grown by MOCVD or MBE with in-situ doping.

Figure 6C:
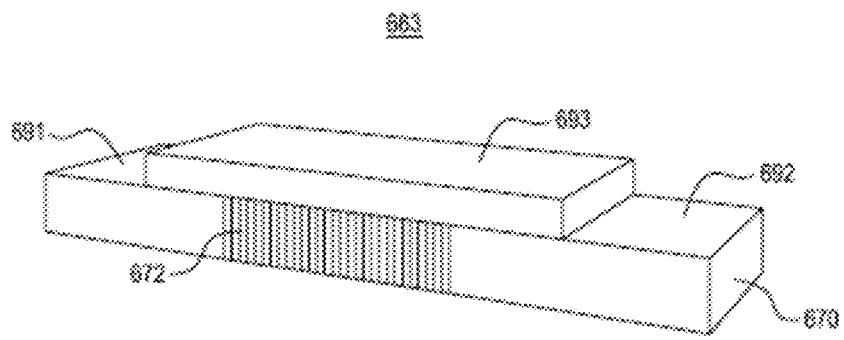
Figure 6D:
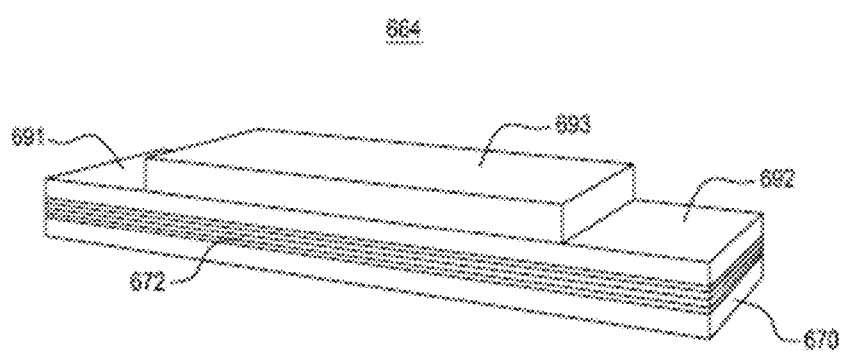

FIGS. 6C and 6D show the perspective views of exemplary grating based laser devices (hereinafter laser device) 663 and 664 with front-side modulation. The laser devices 663 and 664 are similar to that shown in FIG. 6A except that the arrangement of quantum wells structure inside the PEM 672 can be in parallel (FIG. 6D) or vertical (FIG. 6C) to the carrier injection direction or to the resonation direction. Since in FIGS. 6C and 6D, light passes one of the electrodes (V3), the material for this electrode should be transparent to light. For example, if the third electrode 693 is overlapping with the light emitting path, an insulting material such as oxide and a conducting material such as poly silicon can be used when the output light wavelength is longer than 850 nm.

Figure 6E:
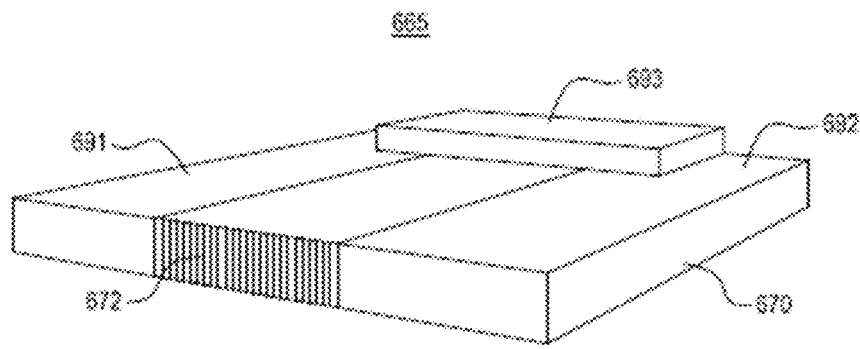
Figure 6F:
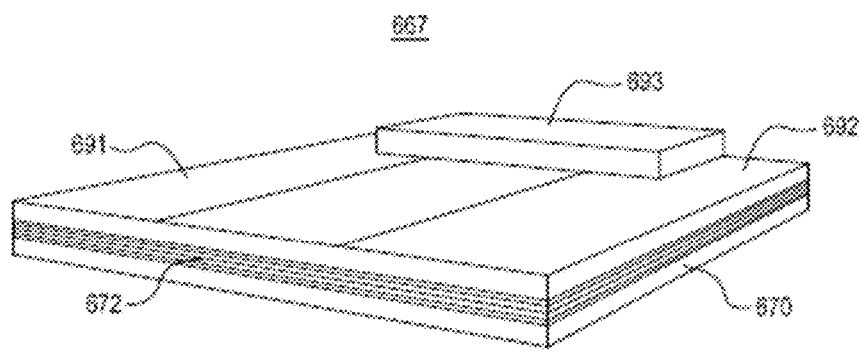

FIGS. 6E and 6F show the perspective views of exemplary grating based laser devices (hereinafter laser device) 665 and 667 with front-side modulation. The laser device 665 shown in FIG. 6E has similar quantum well orientations to that shown in FIG. 6C, and the laser device 667 shown in FIG. 6F has similar quantum well orientations to that shown in FIG. 6D except that one of the terminal (for example, the third electrode 693) is intentionally offset from the light emitting direction to avoid blocking the light. The choice of materials for this terminal can be more diversified compared to those shown in FIGS. 6C and 6D.

Figure 6G:
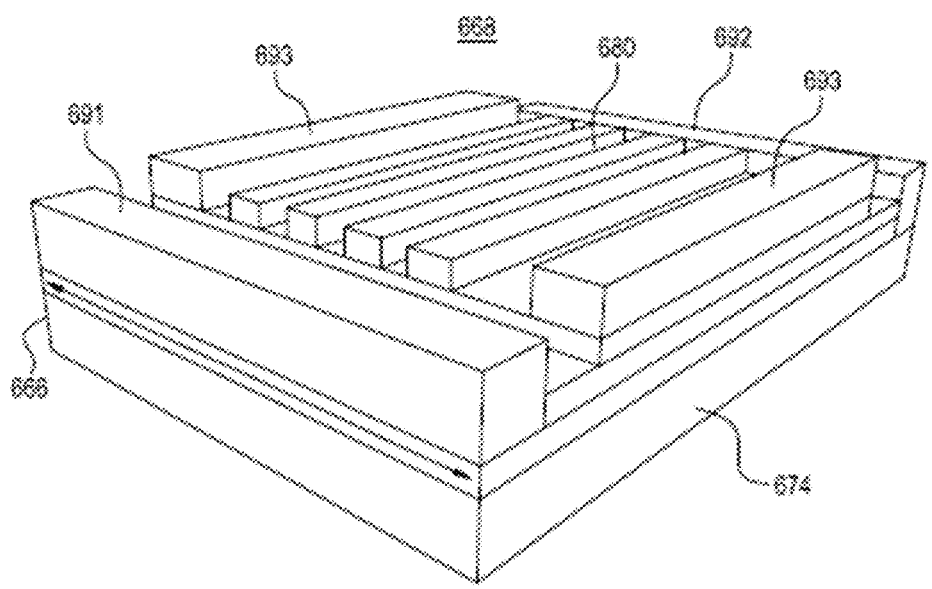

FIG. 6G shows the perspective view of an exemplary grating based laser device (hereinafter laser device) 668 with front-side modulation. The shown laser device 668 is similar to that of FIG. 6A except that two conducting electrodes 691 and 692 are contacting to different layers and the carrier injection direction (between 691 and 692) is different from the light resonance direction (between two electrodes 693) bounded by a first reflector 666 and a second reflector 674. In this example, the carriers are primarily injected from 691 and 692, and recombined to generate photons. The photons can resonate between two reflectors 666 and 674 and emit through the grating region 680 in a mechanism similar to what has been described before. The modulating electrodes 693 are located away from the grating emission area to avoid blocking the light. In some implementations, the grating region 680 can also function partially as part of the modulating electrode.

In some implementations, the emission beam profile can be further modified based on changing the width/length ratio the grating area viewing from the top. The length can be defined as the direction along the interference or resonance direction.

Figure 7A:
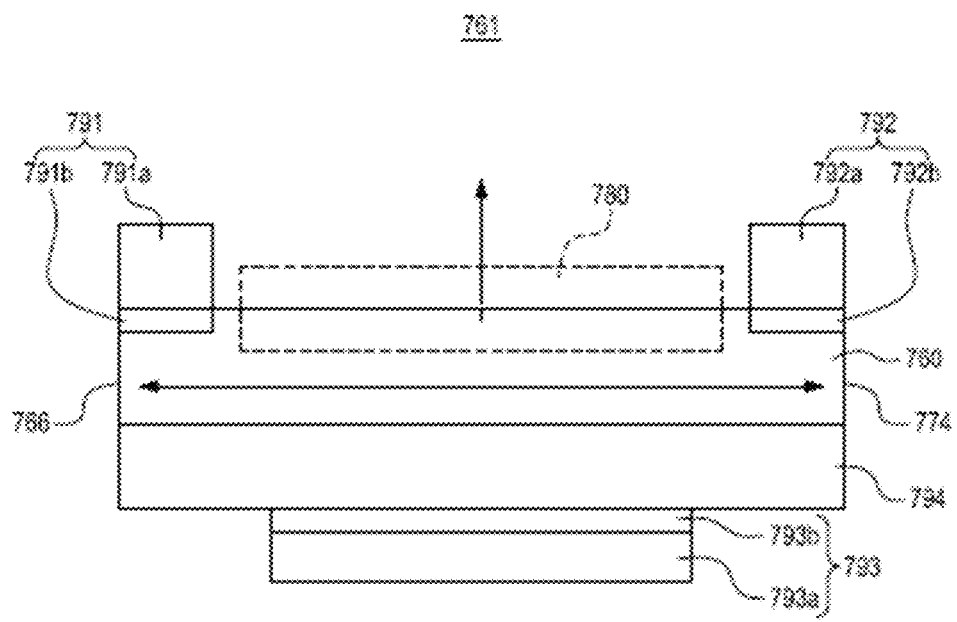
FIGS. 7A-7C show examples of a grating-based laser device with back-side modulation.

FIG. 7A shows the cross-sectional view of an exemplary grating-based laser (hereinafter laser device) 761 with back-side modulation. The laser device 761 is similar to that of FIG. 6A except that the third contact 693 is formed on the bottom (back side) of the interference region 760 and the coherent light is emitted from the top (front side) of the interference region 760 through the grating region 780 in a mechanism similar to what has been described before. Although not shown in this figure, the first contact 791 and the second contact 792 may also be in contact with different epitaxy grown layers in a way similar to FIG. 6B. Moreover, the grating region 780 can also be located on the bottom of the interference region 760 in a way similar to FIG. 6B as long as the directionality is designed accordingly. For a back-side modulation with front-side emission structure as shown here, the material composition of the modulating electrode can be more flexible since it is not overlapping with the light emission path.

Figure 7B:
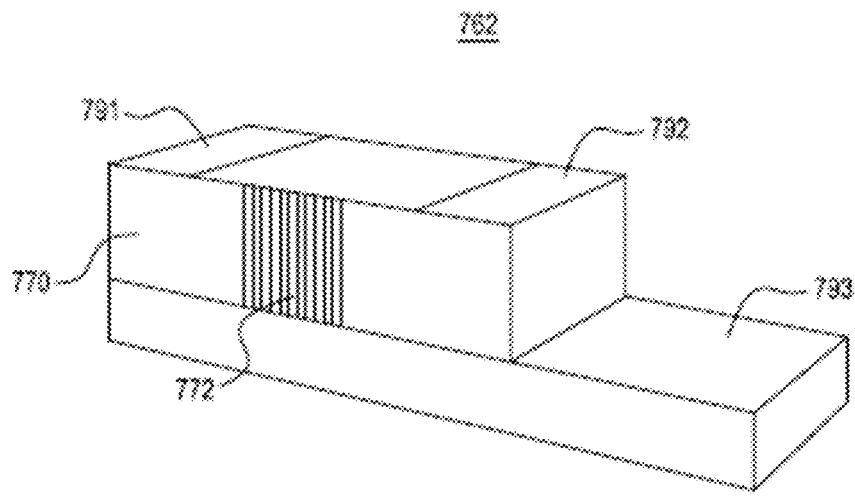
Figure 7C:
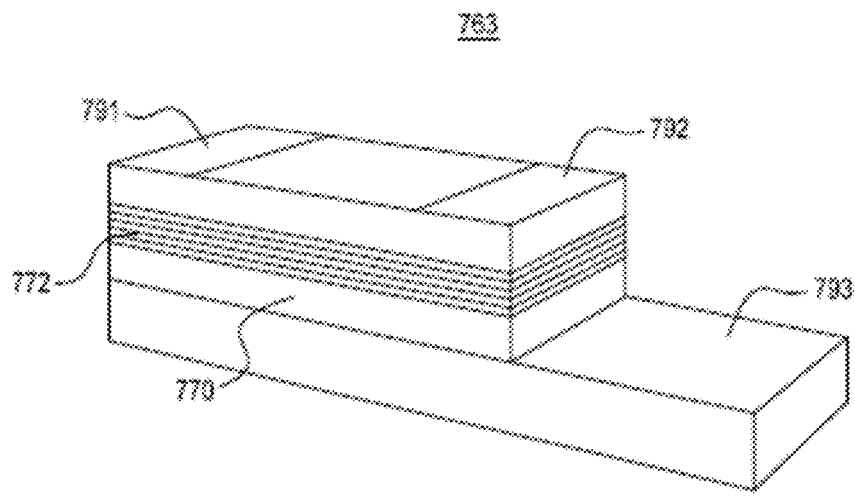

FIGS. 7B and 7C show the perspective views of the exemplary grating-based lasers (hereinafter laser devices) 762 and 763 with back-side modulation. The laser devices shown here are similar to that of FIGS. 6E and 6F in that the quantum well orientations inside the PEM 772 can be varied and the third modulating electrode 793 is in contact to the bottom of the interference region 770.

Figure 8A:
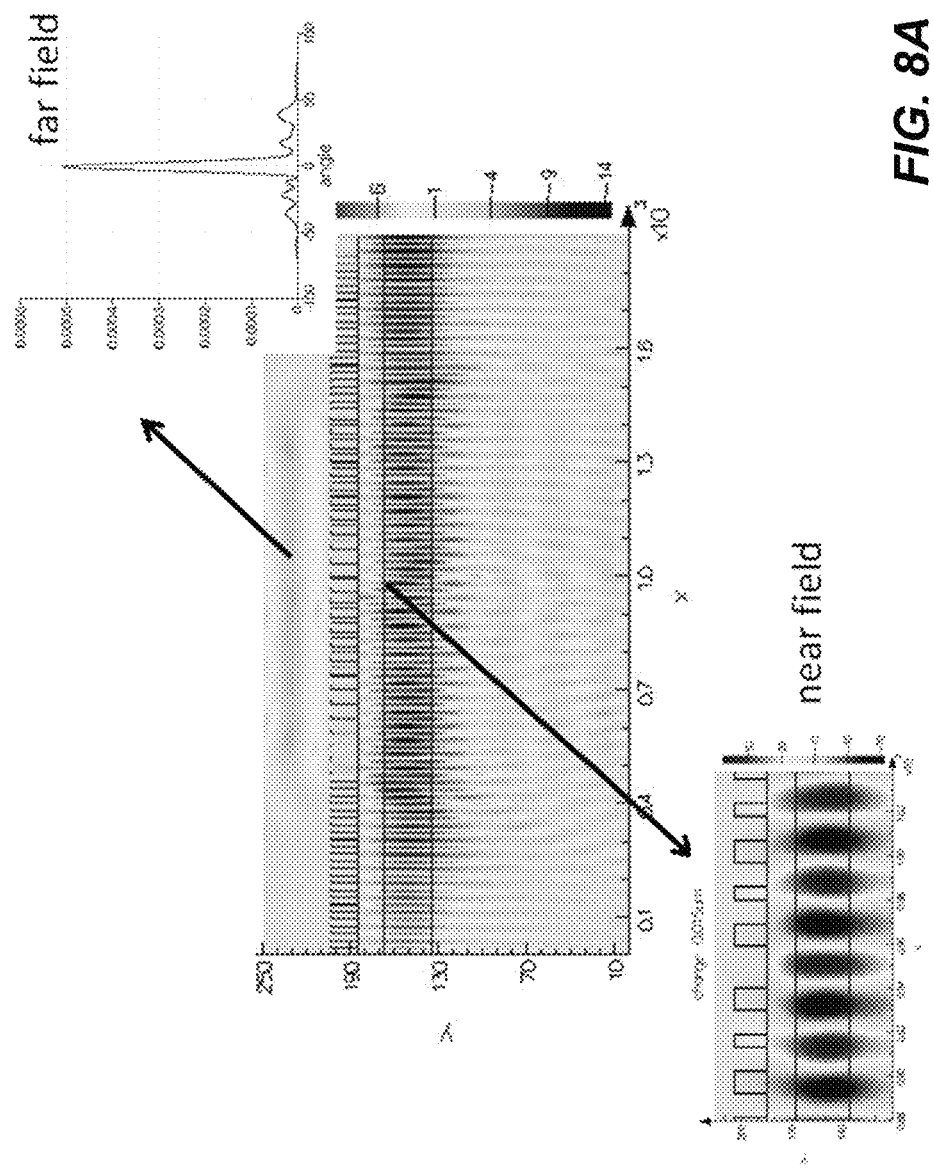
FIG. 8A shows the simulation results of near field and far field profiles of the grating-based laser device.

FIG. 8A shows an exemplary simulation result of the cross-section of a grating based laser device with two alternating grating structures. InGaAs quantum wells embedded in InP matrix with InGaAsP layer as the top grating is designed and simulated. A near field profile shows that the grating peaks of one grating structure match the 0° in-phase antinodes, and the grating peaks of the other grating structure match the 180° in-phase antinodes. Above the grating, a clear vertical emission of light in the upward direction can be observed, and the corresponding far field profile shows a 0° far field angle, i.e., a completely vertical emission. The exemplary simulation shows an exemplary implementation of a grating based laser device using the two grating structures as indicated by FIG. 3A.

FIG. 8B shows an exemplary simulation result of the beam profile according to different width/length of the grating area (top view). The width/length can be defined as the direction perpendicular/along the interference direction. The wave profiles can be different along these two directions due to their confinement difference. In this example where a SOI substrate is used, the wave profile along the width direction resembles a sinosoidal function (weaker confinement) while the wave profile along the length direction resembles a rectangular function (stronger confinement). As a result, in this example, the width may be made larger than the length to achieve a circular emission beam profile.

Figure 9:
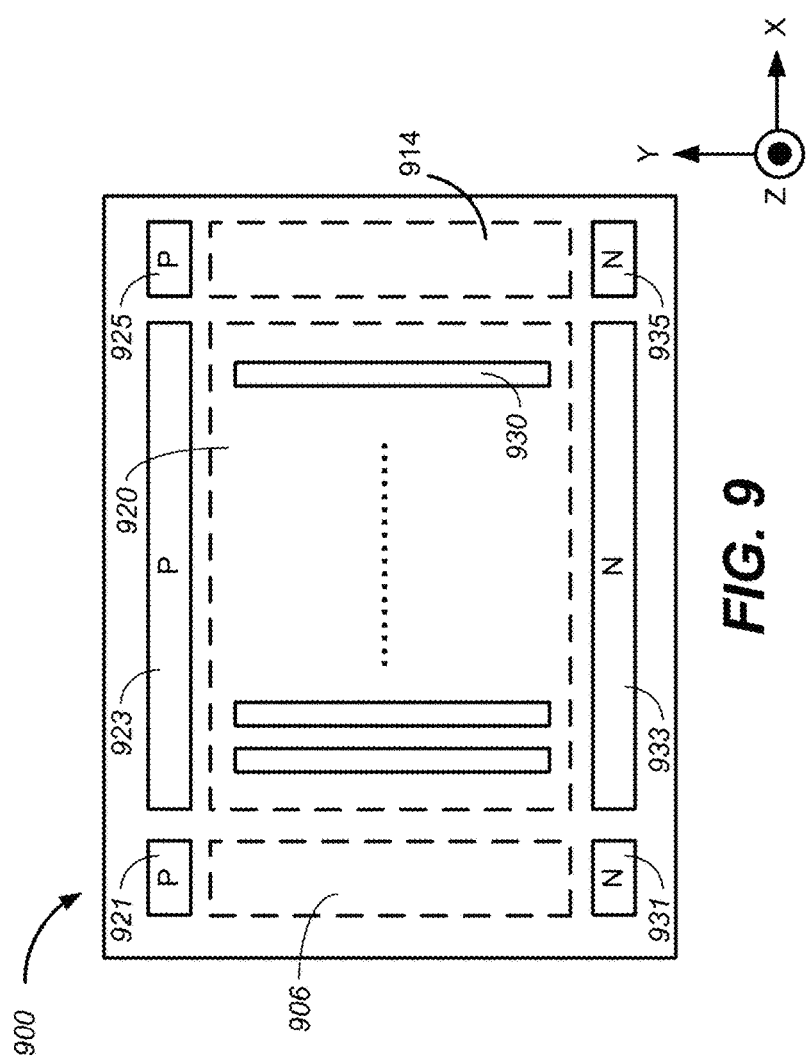
FIG. 9 shows an example of an optical coupler integrated with p-n junctions.

FIG. 9 shows an example of an optical coupler 900 integrated with p-n junctions. The optical coupler 900 includes a first reflector region 906, an interference region 920, and a second reflector region 914. The interference region 920 includes a grating region 930. The first reflector region 906, the interference region 920, the second reflector region 914, and the grating region 930 may be implemented using any one of the corresponding regions as described throughout the application.

The optical coupler 900 also includes p-n junction pairs including p-doped regions 921, 923, and 925, and n-doped regions 931, 933, and 935. In general, by controlling one or more p-n junction pairs, parameters such as output power and output wavelength may be actively controlled by the application of voltages or carriers injection. In some implementations, the p-n junction pairs 921/931, 923/933, and/or 925/935 may extend into the first reflector region 906, the interference region 920, and/or the second reflector region 914, respectively, for better controllability. In some implementations, the p-doped and n-doped regions may alternate to form interdigitated patterns or other patterns. The descriptions of the doped regions may be applied to any one of the optical couplers described in this application.

In some implementations, an n-doped region 931 and a p-doped region 921 may be configured to provide an electric field in the first reflector region 906 with an application of a voltage or a current across the n-doped region 931 and the p-doped region 921, where the first reflector region 906 may be configured to provide a different reflectivity with the application of the voltage or a current across the n-doped region 931 and the p-doped region 921.

In some implementations, an n-doped region 935 and a p-doped region 925 may be configured to provide an electric field in the second reflector region 914 with an application of a voltage or a current across the n-doped region 935 and the p-doped region 925, where the second reflector region 914 may be configured to provide a different reflectivity with the application of a voltage or a current across the n-doped region 935 and the p-doped region 925. As another example, an n-doped region 935 and a p-doped region 925 may be configured to provide an electric field in the second reflector region 914 with an application of a voltage or a current across the n-doped region 935 and the p-doped region 925, where the electrical carriers in the second reflector region 914 can be extracted.

In some implementations, an n-doped region 933 and a p-doped region 923 may be configured to provide an electric field in the interference region 920 with an application of a voltage or a current across the n-doped region 933 and the p-doped region 923, where the interference region 920 may be configured to provide a different interference pattern for the interference light with the application of a voltage or a current across the n-doped region 933 and the p-doped region 923.

For example, by applying a reverse bias voltage, the electric field may extract the free carriers in a region, and therefore may modify the refractive index of the region. As another example, by applying a forward bias voltage, free carriers may be injected into a region, and therefore may modify the refractive index of the region.

Figure 10A:
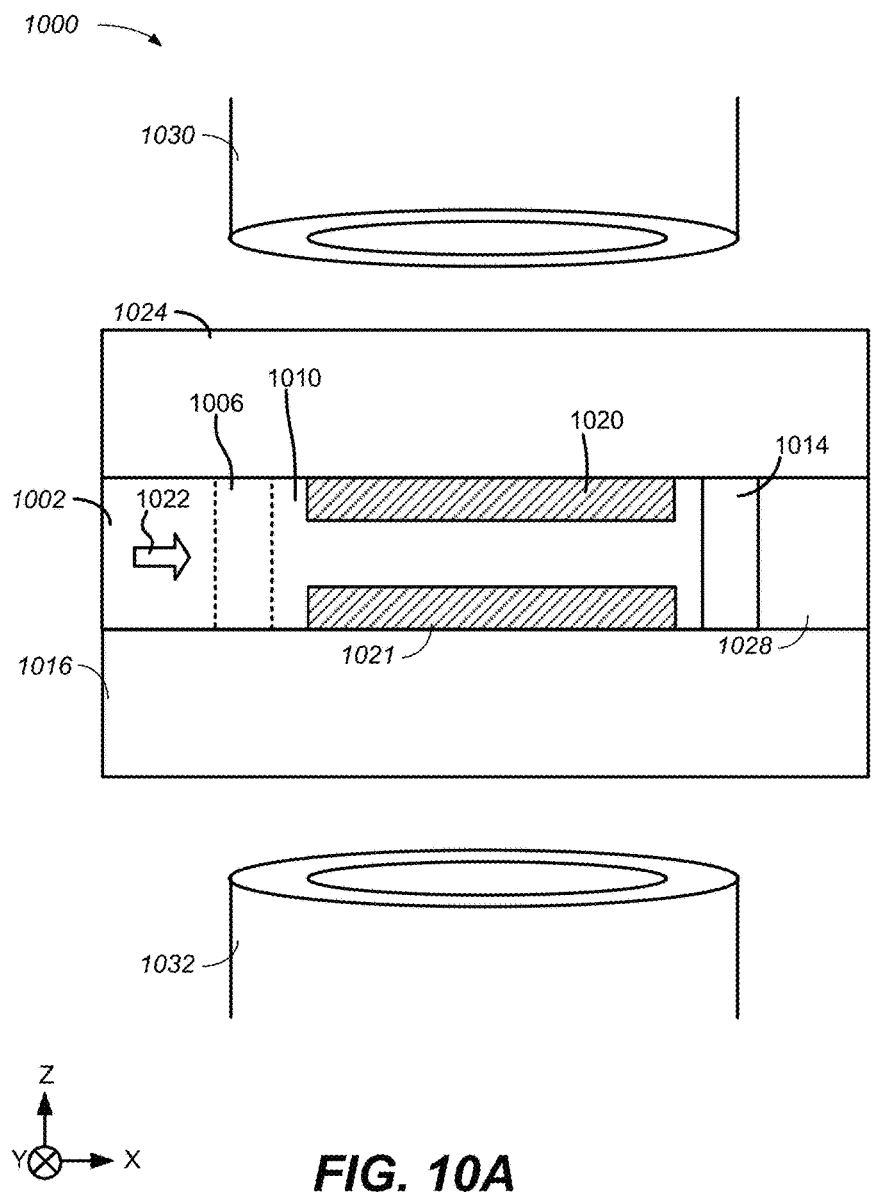
FIGS. 10A-10B show examples of an optical coupler having multiple output paths.

FIG. 10A shows an example photonic integrated circuit 1000 having multiple outputs. The photonic integrated circuit 1000 includes a first waveguide region 1002 configured to guide line in the direction as designated by the arrow 1022. The photonic integrated circuit 1000 includes a first grating region 1020 formed on a side of the interference region 1010. The photonic integrated circuit 1000 includes a second grating region 1021 formed on a different side of the interference region 1010, for example, the opposite side as shown in FIG. 10A. The photonic integrated circuit 1000 includes a reflector region 1014, and may optionally include another reflector region 1006. The photonic integrated circuit 1000 includes a second waveguide region 1028 that may be coupled to other passive and/or active optical components.

In some implementations, light from the first waveguide region 1002 enters the interference region 1010, and can be directed to a first external medium 1030, a second external medium 1032, or a second waveguide region 1028. For example, similar to the descriptions of FIG. 9, an n-doped region and a p-doped region may be configured to provide an electric field in the interference region 1010 with an application of a voltage or a current across the n-doped region and the p-doped region, where the portion of the light emitted in the +z direction and the portion of the light emitted in the −z direction may be controlled by the application of a voltage or a current across the n-doped region and the p-doped region. As another example, similar to the descriptions of FIG. 9, an n-doped region and a p-doped region may be configured to provide an electric field in the second reflector region 1014 with an application of a voltage or a current across the n-doped region and the p-doped region. The reflectivity of the second reflector region 1014 may be tuned, and light may be transmitted to the second waveguide region 1028.

In some implementations, the light enters the interference region 1010, and can be split into different portions of light that exit for the first external medium 1030, the second external medium 1032, and/or the second waveguide region 1028. For example, the grating in the first grating region 1020 may be designed such that the grating periodicity substantially matches the standing wave of a TE-polarized light. Similarly, the grating in the second grating region 1021 may be designed such that the grating periodicity substantially matches the standing wave of a TM-polarized light. By controlling the proportion of TE and TM polarized light in the photonic integrated circuit 1000, the portions of light exiting the photonic integrated circuit 1000 for the first external medium 1030 and the second external medium 1032 may be controlled. The above example can serve as an effective polarization beam splitter.

In some implementations, a first layer 1024 may be formed between the first grating region 1020 and the first external medium 1030. The first layer 1024 may be formed to protect the photonic integrated circuit 1000, or to provide a specific distance for coupling the first grating region 1020 and the first external medium 1030. In some implementations, a second layer 1016 may be formed between the second grating region 1021 and the second external medium 1032. The second layer 1016 may be formed to protect the photonic integrated circuit 1000, or to provide a specific distance for coupling the second grating region 1021 and the second external medium 1032. For example, the first layer 1024 may be a cladding, and the second layer 1016 may be a substrate of the photonic integrated circuit 1000. As another example, the first layer 1024 may have a lower refractive index compared to the grating region 1020.

Figure 10B:
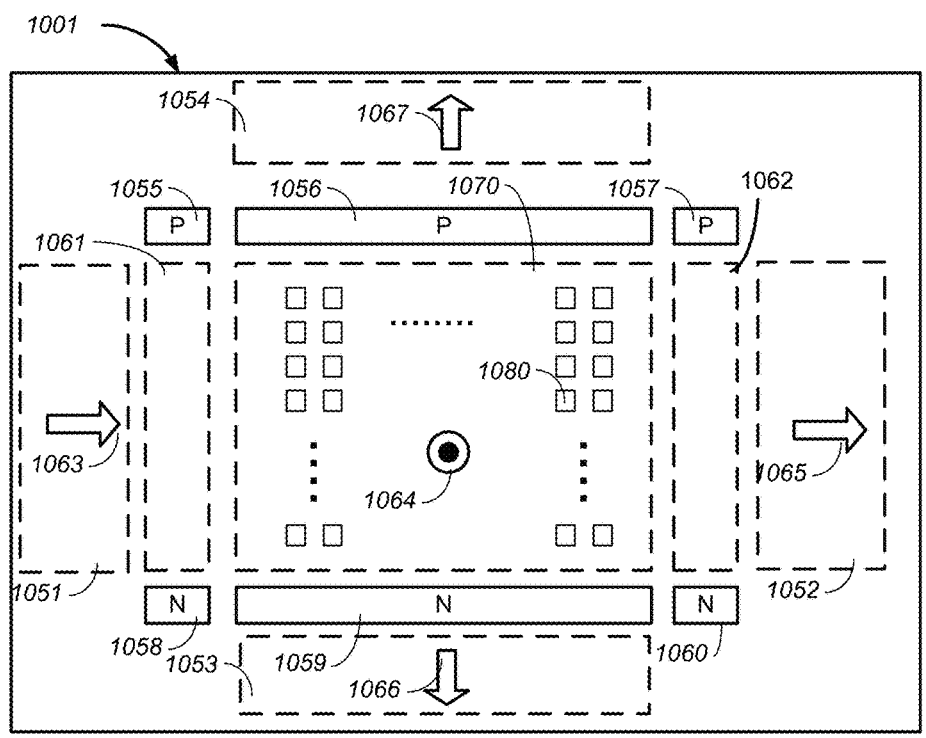

FIG. 10B shows an example photonic integrated circuit 1001 having multiple inputs and outputs. The photonic integrated circuit 1001 may include a first waveguide region 1051, a second waveguide region 1052, a third waveguide region 1053, a fourth waveguide region 1054, p-n junctions 1055-1060 and 1095-1098, a first reflector region 1061, a second reflector region 1062, a third reflector region 1091, a fourth reflector region 1092, an interference region 1070, and a two-dimensional grating 1080. The structures of the first waveguide region 1051, the second waveguide region 1052, the third waveguide region 1053, the fourth waveguide region 1054, the p-n junctions 1055-1060 and 1095-1098, the first reflector region 1061, the second reflector 1062, the third reflector region 1091, the fourth reflector region 1092, the interference region 1070, and the two-dimensional grating 1080 may be implemented by any corresponding structures described throughout this application, for example, the corresponding structures in FIGS. 1-7 and FIG. 9.

In some implementations, light from the first and the third waveguide region 1051 and 1053 enter the interference region 1070, and may be directed to the second waveguide region 1052, the fourth waveguide region 1054, or out of the grating in the z direction as designated by the outward arrow 1064. In some implementations, to minimize the back reflection of the input light from the first and the third waveguide regions, the reflectivity of the first and the third reflector regions 1061 and 1091 can be tuned during the initial design or through dynamic application of electrical field to match the one-circulation attenuation coefficients of the wave propagating along the x and y direction respectively.

In some implementations, light from the first waveguide region 1051 enters the interference region 1070, and may be split to different portions to the second waveguide region 1052, the third waveguide region 1053, the fourth waveguide region 1054, and/or out of the grating in the z direction as designated by the outward arrow 1064. For example, the grating region may include a two-dimensional grating 1080 configured to separate light into two light portions propagating along two directions x and y according to wavelengths. As another example, the grating region may include a two-dimensional grating 1080 configured to separate light into two light portions propagating along two directions x and y according to polarization. As another example, the two-dimensional grating 1080 may be configured to reversely combine two light portions propagating along two directions x and y into one light portion.

In some implementations, the two-dimensional grating 1080 may be configured to emit light upward in the z direction by combining two lights coming from two directions x and y, by substantially matching the periods of the grating 1080 along the x and y direction to periods of the interference pattern along the x and y directions respectively. In some implementations, the two-dimensional grating 1080 may be configured to emit light upward in the z direction by combining two lights coming from two directions x and y, by modifying the interference pattern along the x and y directions, through the application of electrical fields between p-doped and n-doped regions, to match the grating 1080 pattern along the x and y directions respectively. As another example, the two-dimensional grating 1080 may be configured to reversely split one light propagating at one direction (e.g. −z) into two light portions propagating along two directions x and y.

Similar to the descriptions of FIG. 10A, in some implementations, an n-doped region and a p-doped region may be configured to provide an electric field in the interference region with an application of a voltage or a current across the n-doped region and the p-doped region, where a respective proportion of each of the two light portions propagating along two directions is controlled by the application of a voltage or a current across the n-doped region and the p-doped region. For example, a voltage may be applied across the n-doped region 1059 and the p-doped region 1056 to control the routing or the splitting of the input light. In some implementations, one or more doped regions can be eliminated if there is no need to modulate the refractive index of corresponding regions. For example, the doped regions 1056 and 1059 can be eliminated if there is no need to dynamically modulate the interference region 1070.

Figure 11A:
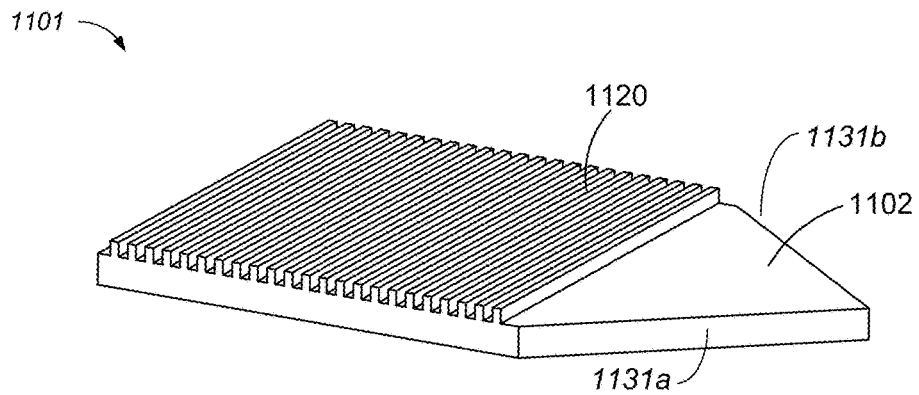
FIGS. 11A-11E show examples of a mirror.

FIG. 11A shows an example of an optical apparatus 1101, including a corner mirror 1102 that provides a high-reflectivity across a broad spectrum. The descriptions of FIG. 11A may be applied to any one of the reflector regions disclosed in this application. In general, light propagates through the grating region 1120, and is incident on the facets 1131a and 1131b of the corner mirror 1102. Because the light is incident on the facets 1131a and 1131b beyond a total reflection angle, substantial light is reflected due to total reflection, achieving a high-reflectivity.

Figure 11B:
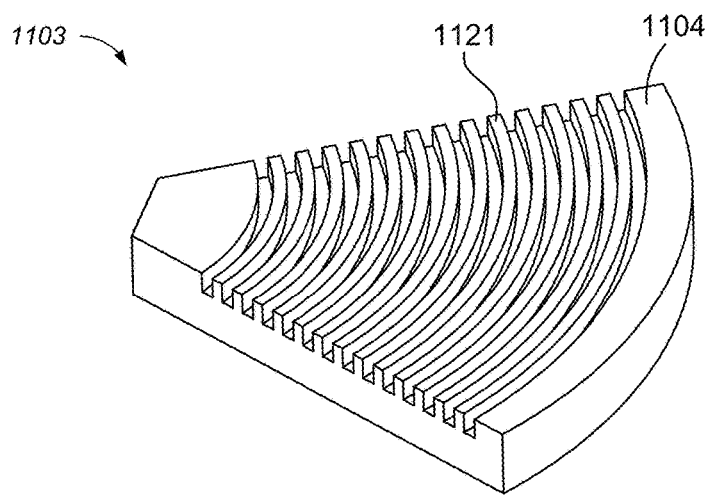

FIG. 11B shows an example of an optical apparatus 1103, including a circular or elliptical facet 1104 that provides a partial-reflectivity or a high-reflectivity. The descriptions of FIG. 11B may be applied to any one of the reflector regions disclosed in this application. In general, light propagates through the curved grating region 1121, and is incident on the facet 1104. In some implementations, the facet 1104 may be coated with a metal layer to provide a high-reflectivity. The curved facet 1104 refocuses the light back toward the direction of the waveguide region by the high-reflectivity curved facet 1104.

Figure 11C:
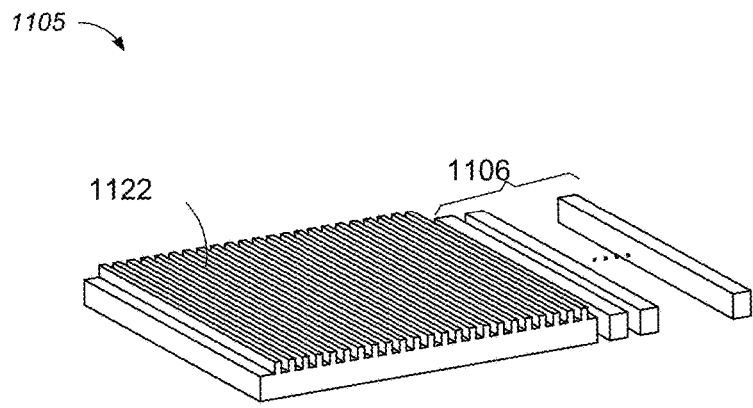

FIG. 11C shows an example of an optical apparatus 1105, including a bragg reflector 1106 providing a high-reflectivity. For example, Bragg reflectors 1106 may be formed by DBR and/or DFB structures with a Bragg period equal to half of a wavelength by a complete etching as shown here in FIG. 11C. The descriptions of FIG. 11C may be applied to any one of the reflector regions disclosed in this application. In general, light propagates through the grating region 1122, and is incident on DBR mirror 1106. In some implementations, the DBR mirror 1106 may be designed to provide a high reflectivity for a range of wavelengths.

Figure 11D:
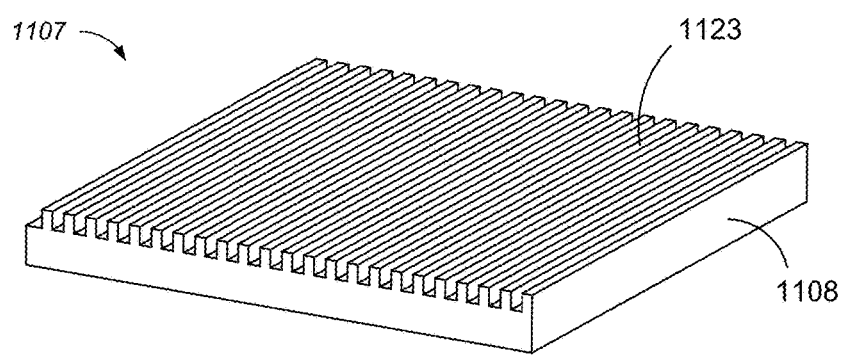

FIG. 11D shows an example of an optical apparatus 1107, including a facet 908 providing a partial-reflectivity or a high-reflectivity. The descriptions of FIG. 11D may be applied to any one of the reflector regions disclosed in this application. In general, light propagates through the grating region 1123, and is incident on the facet 1108. Without any additional coating, the reflectivity may be determined using the Fresnel equations. In some implementations, the facet 1108 may be coated with one or more layers of materials to increase the reflectivity. For example, the facet 908 may be coated with a metal layer to increase the reflectivity. As another example, the facet 1108 may be coated with multiple dielectric layers to increase the reflectivity for a range of wavelengths. As another example, the facet 1108 may be coated with a quarter-wavelength dielectric layer followed by a metal layer to increase the reflectivity for a range of wavelengths.

Figure 11E:
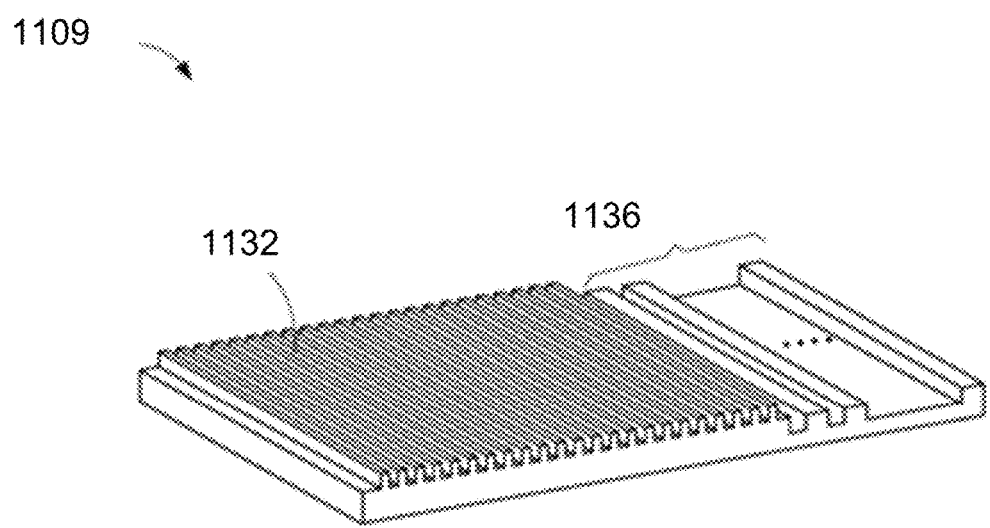

FIG. 11E shows an example of an optical apparatus 1109, including a surface corrugated bragg reflector 1136 providing a high-reflectivity. For example, the surface corrugated bragg reflectors 1136 may be formed by DBR and/or DFB structures with a bragg period equal to half of a wavelength by a partial etching as shown here in FIG. 11E. The descriptions of FIG. 11E may be applied to any one of the reflector regions disclosed in this application. In general, light propagates through the grating region 1132, and is incident into the mirror 1136 and gets reflected, forming an interference pattern.

Any other types of reflectors that can be integrated in a photonic integrated circuit may also be used as alternatives to the reflectors described in FIGS. 11A-11E. As an example, a reflector region may alternatively include a waveguide loop mirror. As another example, a reflector region may alternatively include an anomalously dispersive mirror where the effective index of this mirror increases with longer wavelength.

Figure 12:
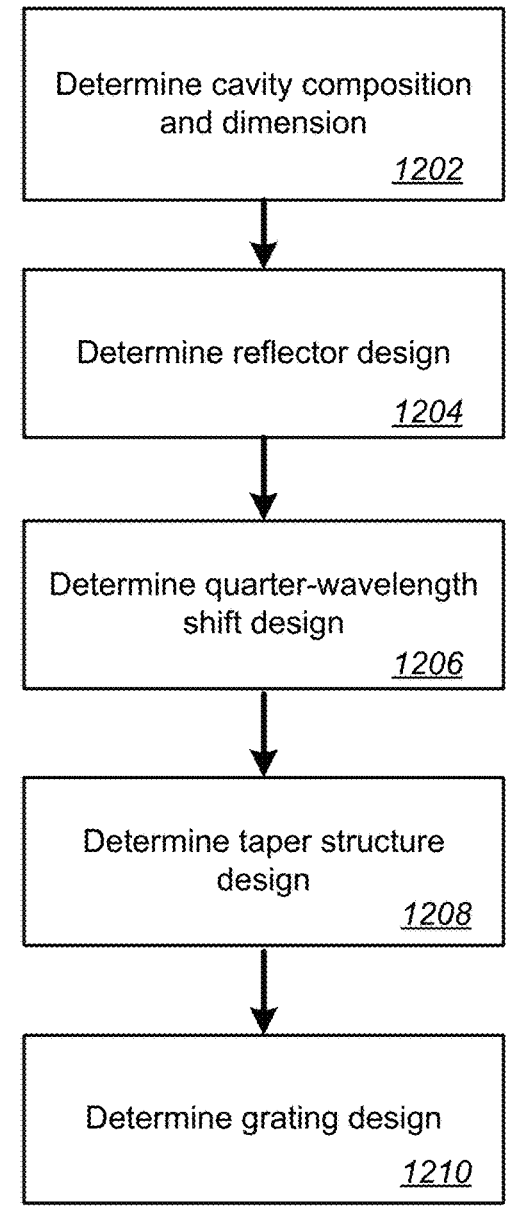
FIG. 12 shows an example of a flow diagram for designing a grating-based optical transmitter.

FIG. 12 shows an example of a flow diagram for designing a grating based optical transmitter. The process 1200 may be performed by a designer or a data processing apparatus, such as one or more computers.

First the cavity material composition and dimensions (1202) are determined. In some implementations, based on the target light polarization/mode/wavelength/spot size, and the external medium (e.g., fiber on top of the grating or waveguide connected to the second side 114, etc.), the dimensions and materials composition for the cavity and the substrate can be determined. For example, for a single mode optical signal with center wavelength around 1310 nm, an InP layer can be used as the substrate and InAs, InGaAs, InGaAsP, and InGaAsN based quantum well structure can be used on top of the InP substrate as the light source region. Another InP layer can be used on top of the light source region as the cladding. If the spot size of the external fiber is around 10 μm, the dimension of the cavity aligned with the fiber direction needs to be around or larger than 10 μm to allow the external fiber to be coupled onto the grating structure.

Then the reflector design (1204) is determined. A proper reflector design (e.g., tapered DFB/DBR or corner mirror or oxide-metal coating, etc.) can be used to form the interference wave pattern. In some implementations, a numerical analysis tool such as a FDTD simulation system may optimize design parameters to generate a design for a reflector having a reflection that is close to 100%. For example, the design may be a tapered waveguide distributed Bragg (DBR) or distributed Feedback (DFB) reflector, each having a periodicity equals to around half of the effective wavelength of the light inside the cavity. The interference region containing at least part of the interference light is formed inside the cavity.

Then a quarter-wave shift discontinuity can be implemented (1206) to break the symmetry if a DFB/DBR reflector design is used. This allows only one optical mode to be formed inside the cavity.

Then a taper structure can be implemented (1208) on both sides of the quarter-wave shift discontinuity to gradually compensate local effective index mismatch caused by discontinuities.

Then, grating structure to emit the light on top of the interference region can be determined (1210) based on the interference light wave pattern inside the interference region. The period of the grating pattern needs to be substantially matched to the period of the interference light; other parameters, such as duty cycle, grating height, and shape of the grating structure, are what may be optimized based on parameters such as the incident light spot size, mode of the light, wavelength of the light, material of the cavity and light source region, and intended emitting angle etc. In some implementations where a DFB/DBR reflector design is used, the grating can include two grating structures arranged along the light propagation direction with 180° phase shift as depicted in FIG. 3A. In some implementations, one grating structure is formed by decreasing the duty cycles at some parts of one DFB reflector by a predetermined value, while the other grating structure is formed by increasing the duty cycles at some parts of the other DFB reflector by a similar predetermined value. With alternatively reducing and increasing the duty cycles by a similar amount at different regions of the DFB reflector, the overall effective index may remain substantially unchanged, and hence the central wavelength of the interference wave pattern inside the interference region may also remain substantially unchanged after these duty cycle adjustments. The two grating structures, each has its period substantially matched to the period of the interference light can together serve as both reflectors and an optical antenna to emit light in a substantially vertical direction. In some implementations, adding the grating structure may still change the effective index and hence the characteristics of the interference light can change. Therefore, some iteration processes might be needed for optimization.

An exemplary design flow has been described. Nevertheless, it will be understood that various modifications may be made without departing from the spirit and scope of the disclosure. For example, various forms of the flows shown above may be used, with steps re-ordered, added, or removed. For example, in FIG. 12, step 1206 and 1208 are optionally, and if incorporated can also be done before step 1210. As another example, step 1206 can also be done after and with the same step 1208. As another example, step 1204, 1206, and 1208 can also be done with the same step. As another example, step 1210 can also be done before step 1204.

Figure 13:
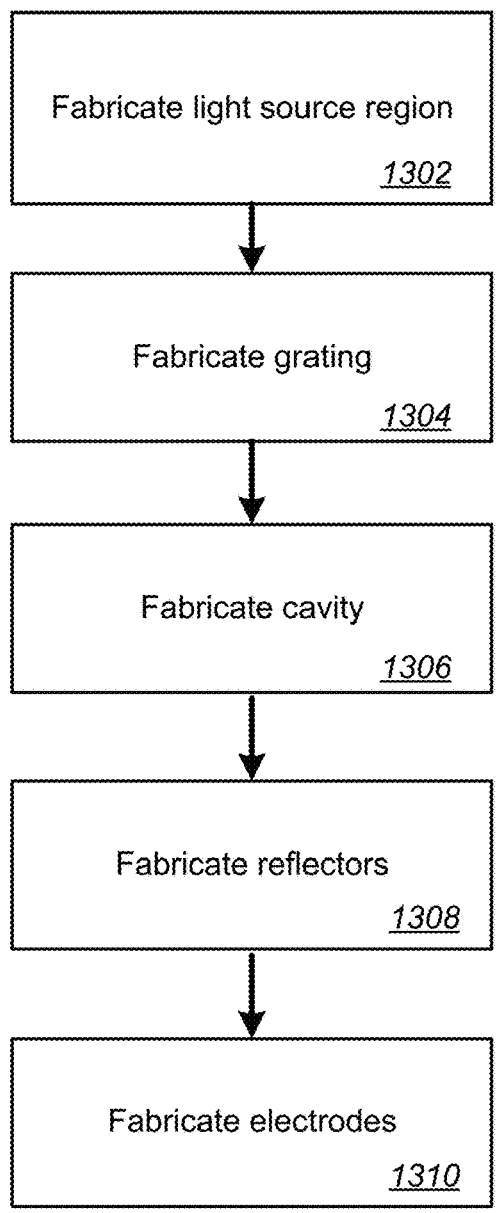
FIG. 13 shows an example of a flow diagram for fabricating a grating-based optical transmitter.

FIG. 13 shows an example of a flow diagram for fabricating a grating based optical transmitter. The process 1300 may be performed by a system including data processing apparatus, such as one or more computers that control one or more apparatuses that perform the fabrication steps.

The system is used to fabricate the light source region containing quantum well or quantum wire or quantum dot structures on a substrate (1302). The fabrication of light source region may be done by fabrication techniques including molecular beam epitaxy (MBE) or metal organic chemical-vapor deposition (MOCVD). In some implementations, a cladding layer can further be deposited by film deposition techniques such as chemical vapor deposition, plasma-enhanced chemical vapor deposition, sputtering, or any other suitable thin film deposition techniques may be used to deposit one or more layers on top of the light source region.

The system is used to fabricate the gratings (1304). The fabrication of gratings may be done by a combination of fabrication techniques including lithography, etching and deposition. For example, lithography techniques such as projection lithography with a stepper lithography tool, electronic-beam lithography, contact lithography, or any other suitable lithography techniques may be used to pattern the gratings. As another example, etching techniques such as dry etching, wet etching, or any other suitable etching techniques may be used to etch the patterned gratings. A single grating structure or both grating structures as mentioned in FIG. 3A can be fabricated by sharing the lithography and etching steps using the same mask. Furthermore, if a surface corrugated DFB type reflector is used, the surface corrugated structure can be done also at the same step when fabricating the gratings. In some implementations, the gratings further include a quarter-wavelength shift and taper structures as mentioned before. In some implementations, thin film deposition techniques such as chemical vapor deposition, plasma-enhanced chemical vapor deposition, sputtering, or any other suitable thin film deposition techniques may be used to deposit one or more layers of materials on the gratings as a cladding layer.

The system is used to fabricate the cavity (1306). The fabrication of cavity may be done by lithography and etching to define the cavity into the target dimensions. In some implementations, thin film deposition techniques may be optionally used to deposit one or more layers to passivate the patterned cavity.

The system is used to fabricate the reflector (1308). The fabrication of the reflector region may be done by a combination lithography, etching and deposition similar as mentioned before. In some implementations, a DBR type or a corner reflector can be formed during the same step when forming the cavity (1306) by sharing the same lithography, etching step and even the mask. In some implementations, a metal reflector can be formed by depositing a metal layer on the sides of the cavity along the interference light direction. In some other implementations, a quarter-wavelength dielectric layer can be formed between the cavity and the metal layer to achieve a high reflectivity.

The system is used to fabricate the electrodes (1310) to provide electrical carriers into the light source region or to modulate the electrical field in the light source region. At least two electrodes electrically coupled to the light source region are formed by a combination of deposition, lithography and etching. In some implementations, a third electrode is formed such that the three electrodes are arranged to provide a control for relative electrical fields among the three electrodes to modulate an electrical carrier concentration. Light generated by the electrical carrier recombination resonates inside the interference region along a first direction and emits out of the interference region along a second direction that is different from the first direction.

A number of implementations have been described. Nevertheless, it will be understood that various modifications may be made without departing from the spirit and scope of the disclosure. For example, various forms of the flows shown above may be used, with steps re-ordered, added, or removed. For example, step 1306 can also be done before step 1304. As another example, step 1308 can also be done with the same step 1304. As another example, step 1308 can also be done with the same step 1306. As another example, step 1310 can also be done post step 1302.

Optical Device for Redirecting Incident Electromagnetic Wave

Figure 14A:
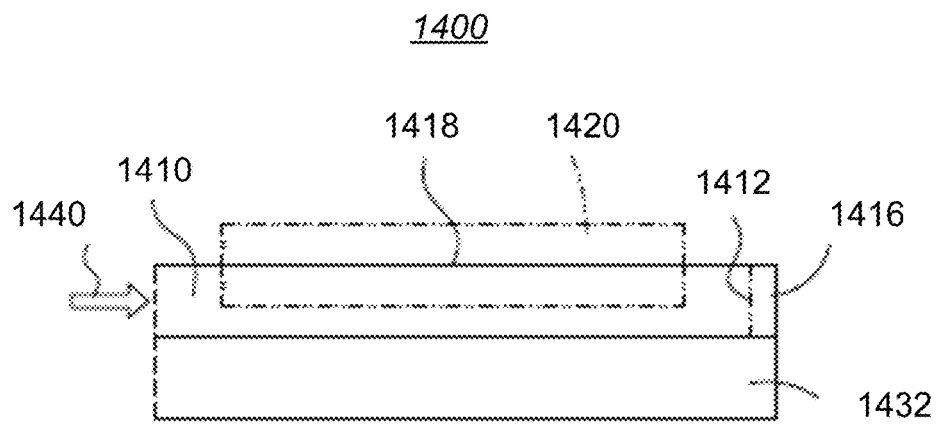
FIG. 14A illustrates the block components of a first embodiment of the optical device for redirecting an incident light.

Structure with One Mirror on One Side:

FIG. 14A illustrates the block components of a first embodiment of the optical device for redirecting an incident light. The optical device 1400 mainly comprises a cavity 1410 with a first side 1412, a grating structure 1420 arranged on a top face 1418 of or embedded into the cavity 1410, and a mirror 1416 arranged on the first side 1412. The above-mentioned components can be arranged on a supporting layer 1432 with a refractive index lower than that of the cavity to create total-internal reflection, for example, a silicon dioxide layer 1432 in adjunction with cavity 1410 comprising of silicon or silicon nitride or silicon oxynitride thereon, or a silica layer 1432 in adjunction with cavity 1410 comprising of doped silica thereon. The above-mentioned components can also comprise of silicon or germanium or nitride or oxide or polymer or glass or their combinations, and be arranged on a highly reflective layer 1432, for example, an oxide-metal coating or a distributed Bragg reflector (DBR) stack.

Provided that the light 1440 is incident on the left part of the cavity 1410 (namely, the portion opposite to the first side 1412) as shown by an arrow, the incident light can be regarded as being confined inside the cavity 1410 if during one circulation from the initial entry point to the first side 1412 and then back to the initial entry point, the incident light is substantially attenuated.

This condition can be further explained with the initial entry point having a reflectivity r for light coming from left side thereof and the cavity (defined between the initial entry point and the first side 1412) having a one circulation attenuation coefficient $\alpha$. In this case, under the light confinement condition "$\alpha=r$", since r is now 0 (no light reflection at the initial entry point), a also needs to be 0, which means all of the light energy is attenuated after one circulation. Here, the light confinement condition means the light is spatially localized in the cavity region with substantially zero back-reflection; the one circulation means the light travels from the initial entry point into the cavity 1410, onto the first side 1412, reflected by mirror 1416, and finally back to the initial entry point.

In real cases when a slight deviation from the ideal "$\alpha=r$" case occurs, this embodiment still works but with a different coupling efficiency. Since in real implementations, many non-ideal factors such as process variation and material non-uniformity usually play a role, such deviations from the exact condition are expected in real implementations. However, as long as such deviations are within designed tolerances, they will not change the functionality of this embodiment. Hence, making design choices under imperfect conditions is part of the "optimization" process. For example, if during the grating etching process, an over etch occurs, we can increase the duty cycle (where the duty cycle is defined as the ratio of the peak width to the sum of peak width and valley width of the grating along the wave propagation direction) of the initial design to compensate for the over etch. If making such choices still follows the concept of this embodiment, then all these design choices and variations are also within the scope of the embodiment. This statement also holds for the structure with mirrors on both sides which will be discussed in the following sections. In another perspective, this one mirror structure can be viewed as one of the special cases of the following two-mirror structure where one of its mirrors has reflectivity equals zero.

As for the design of grating structure 1420, by substantially matching the pattern of the grating structure 1420 with the pattern of the standing wave in the cavity 1410, a substantial portion of the incident light can leave the cavity 1410 through the grating structure 1420 upward or downward at a predetermined angle with respect to the incident direction. By tuning the grating height or duty cycle or the cladding covering the grating structure or layer 1432 or their combinations, the directionality can be modified to have almost all powers emitting upward and at the same time with almost no powers emitting downward, or vice versa. To simplify the description without limiting the scope, upward emission is described as the major scenario throughout this description. As shown in FIG. 2, the symbol d1 indicates the distance between two adjacent maximum power points of the standing wave (intensity periodicity) in the cavity 1410 and the symbol d2 indicates the period of the grating structure 1420 (rectangular gratings are shown in this figure). The theoretical matching condition is d2=2d1. By matching the wave pattern, this grating structure 1420 acts as "antenna" and becomes most efficient for light to leave the cavity 1410 upward at the predetermined angle with respect to the initial incident direction. All point source wavefronts emitted from each periodic segment (p1 and p2) are combined into a joint planar wavefront which propagates upward with a predetermined angle based on the topographic design of the grating structure 1420, such as its shapes, periods, duty cycles, depths/heights or their combination properties. In the field of optical coupling, the predetermined angle can be designed as substantially vertical to top face of cavity for the ease of coupling light to/from the external optical component.

Since there are some non-ideal factors such as cavity etching that changes the effective reflective index and etching process itself that does not necessary create straight line topography, the actual matching condition might deviate from the theoretical condition d2=2d1. Hence, while the theoretical matching condition is d2=2d1, a slight deviation from the exact condition is expected during real implementations. For example, the distance d1 between two adjacent maximum power points of the standing wave in the cavity 1410 and the half of the period d2 of the grating structure 1420 do not match exactly but still have nearly the same order of magnitude. In other words, the distance d1 between two adjacent maximum power points of the standing wave in the cavity 1410 and the half of the period d2 of the grating structure 1420 are substantially within the same order of magnitude. For the definition of "the same order of magnitude", two numbers have the same order of magnitude if the ratio between the larger number and the smaller number is less than 10. The other parameters, such as grating duty cycles, depths/heights, and shapes of the grating structure, are design parameters, and such choices depend on factors including the incident light polarization/mode/wavelength/spot size, material of the cavity, and the intended directionality of the output light. All the choices for the aforementioned parameters might affect the performance, but do not change the essential functionality if they are properly chosen. Hence, these choices are part of the "optimization" process based on the concept described above.

Figure 15A:
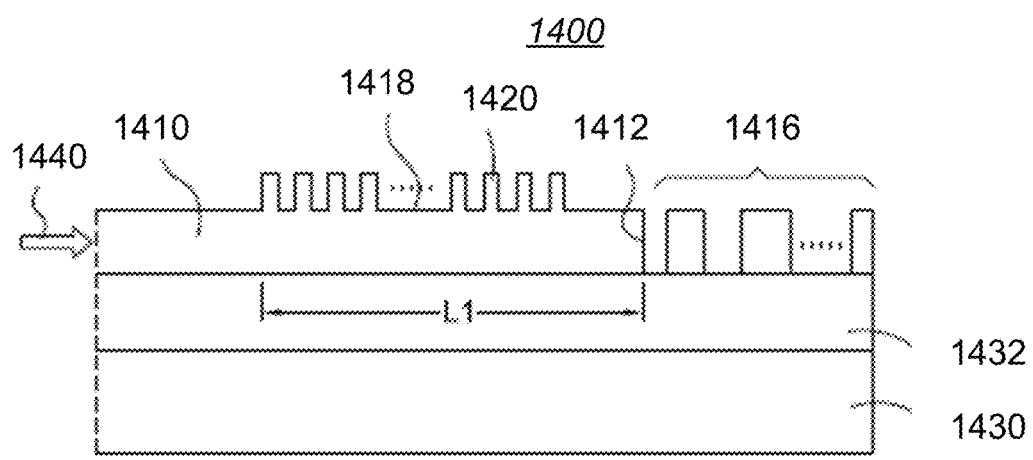
FIG. 15A shows a working example to further illustrate the embodiment shown in FIG. 14A.

FIG. 15A shows one of the working examples to demonstrate the feasibility of the embodiment shown in FIG. 14A. The optical device 1400 comprises a cavity 1410 with a first side 1412, a grating structure 1420 arranged on a top face 1418 of or embedded into the cavity 1410. A mirror 1416 is arranged at the first side 1412. The mirror 1416 is, for example, a tapered DBR mirror to provide nearly 100% light reflection (typically, a high reflectivity, such as higher than 50%, is desired to minimize the power leaking outside of the first side 1412 to achieve a light confinement condition). The cavity 1410, for example, can be arranged on a supporting layer 1432, and the supporting layer 1432 is arranged on a substrate 1430. The supporting layer 1432 has a refractive index lower than that of the cavity to create total-internal reflection, for example, a silicon dioxide layer 1432 in adjunction with cavity 1410 comprising of silicon or silicon nitride or silicon oxynitride thereon, or a silica layer 1432 in adjunction with cavity 1410 comprising of doped silica thereof. The light is incident from the direction shown by the arrow 1440 and enters the cavity 1410 through the initial entry point. The grating length L1 could be, for example, around 10 μm, to better match a conventional single-mode fiber (SMF) mode profile. Other sizes can be chosen based on the size of the external optical component this grating structure intends to be coupled with. An exemplary grating structure 1420 can be, for example, ribs of rectangular shape with 420 nm period, 0.56 duty cycle and 175 nm height, where the duty cycle is the ratio of the peak width to the full period (full period is the sum of peak width and valley width) along the wave propagation direction and the height is along a direction vertical to the top face 1418.

Simulation result shows that at 1305 nm wavelength with the parameters chosen as shown above, a directionality of approximately 85%-86% upward through the grating can be obtained along with a low back-reflection of approximately. To calculate the total coupling efficiency, a standard SMF (the fiber facet is coated with an anti-reflection coating) is placed on top of the grating. A transverse electric (TE) optical signal is then injected into the cavity 1410 from the initial entry point indicated by 1440 and is redirected into the SMF. The corresponding minimum total coupling loss is calculated as approximately 1.25 dB at 1305 nm wavelength, and features a 3 dB full width of approximately 20 nm~25 nm.

Note that the above numeric example is described to demonstrate the feasibility of this disclosure and should not by any means be regarded as limiting. Other variations and optimizations are considered to be within the scope of this description as long as they are covered in the claims set forth in this disclosure.

Figure 14B:
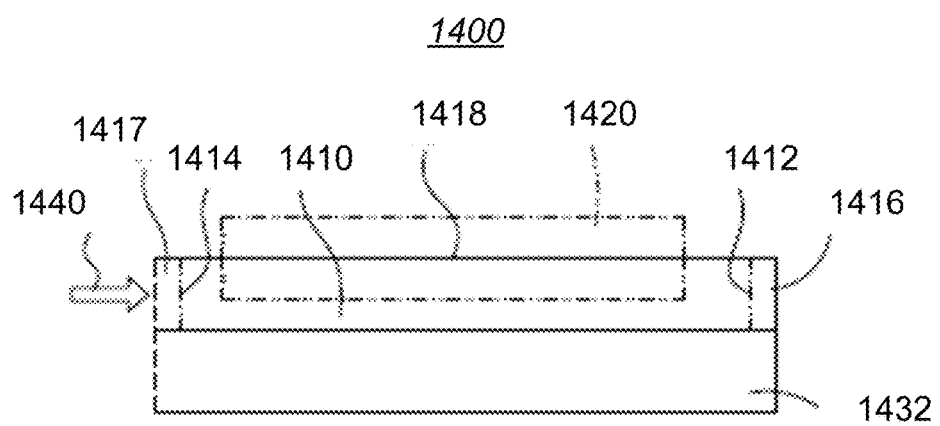
FIG. 14B illustrates the block components of a second embodiment of the optical device for redirecting an incident light.

Structure with Two Mirrors at Two Opposite Sides:

FIG. 14B shows the block components of a second embodiment of the optical device for redirecting an incident light. The optical device 1400 mainly comprises similar components as those shown in FIG. 14A; therefore, the similar components use the same numeral for brevity of description. In the embodiment shown in FIG. 14B, the optical device 1400 further comprises a light reflector 1417 (also can be referred as the second mirror M2 for the ease of illustration) at the second side 1414 of the cavity 1410.

Provided that the light is also incident from the left part of the second side 1414 indicated by 1440, the incident light can be regarded as being confined inside the cavity 1410 if certain design conditions are met. The material/size of the cavity 1410, the reflectivity of the mirror 1416 (also can be referred as the first mirror M1 for ease of illustration) at the first side 1412, and the reflectivity of the light reflector 1417 at the second side 1414, are selected such that the reflected light at the initial light entry and all the light coming from the right side of the second side 1414, transmitting through the light reflector 1417 and into the left side of second side 1414, destructively interfere each other at the left side of second side 1414 due to their π phase difference under the resonant condition inside the cavity to achieve the theoretical light confinement condition. Since the power leak out of the cavity 1410 (from all its surroundings such as its bottom, left side and right side in this 2D example) is controlled by the destructive interference under this condition based on the design concept disclosed, the most efficient way for light to leave the cavity 1410 is through the grating structure 1420. By substantially matching the pattern of the grating structure 1420 with that of the standing wave in the cavity 1410, a substantial portion of the incident light leaves the cavity 1410 through the grating structure 1420 upward with an angle based on the topographic design of the grating structure 1420, such as its shapes, periods, duty cycles and depths/heights. In the field of optical coupling, the angle can be designed as substantially vertical to top face of cavity for the ease of coupling purpose.

The first side 1412 and second side 1414 shown in FIG. 14B are depicted with dash-dotted lines. Therefore, the optical structure atop the supporting layer 1432 can be constituted by a plurality of optical waveguide regions integrally formed or in one-piece form with each other. For example, light with a particular wavelength impinges into a first waveguide region of the optical device and propagates to a second waveguide region coupled to the first waveguide. The second waveguide region is coupled to an interference region, where the light with the particular wavelength reflects with a first reflectivity between the second waveguide region and the interference region. The interference region is coupled to a third waveguide region, where the light with the particular wavelength reflects with a second reflectivity between the interference region and the third waveguide region. A grating structure 1420 may be arranged on or embedded into the interference region. In some implementations, the first reflectivity and the second reflectivity may vary with wavelengths. In some implementations, the first reflectivity and the second reflectivity may be constant across a range of wavelengths.

Figure 19A:
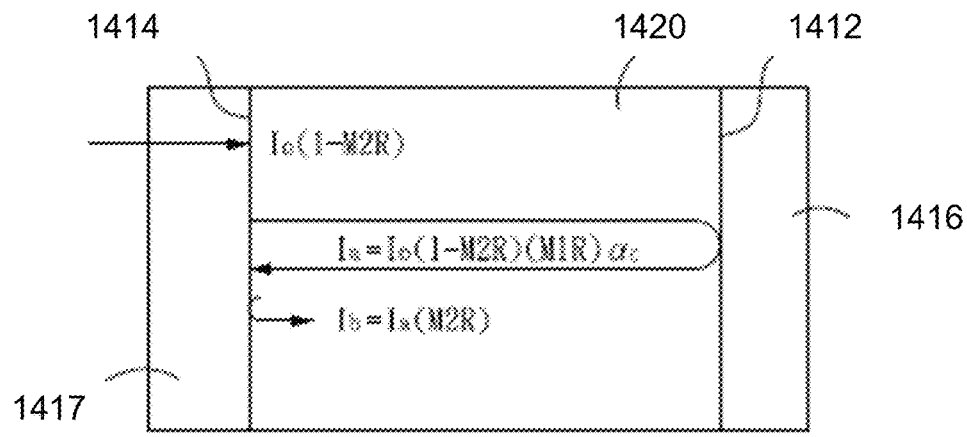
FIGS. 19A to 19B are used to illustrate the light traces under a confinement condition with two mirrors.

In the following paragraphs, we further explain the physical principle of the light confinement mechanism by using a hypothetically numeric example. Assume the light enters into the cavity through the light reflector 1417 (M2) at the second side 1414. Before that, the light power is set as 1. If we design a 10% M2 (r=10%), then after passing through M2 the transmitted light power becomes 90%. Under the confinement condition "α=r", α, which is the light intensity one circulation attenuation coefficient, is designed to be 10% as well. Here, one circulation means the light travels from the second side 1414, through the cavity 1410, onto the first side 1412, reflected by mirror 1416 (M1), and finally back to the second side 1414, but not yet reflected by M2. M1 is designed to be a perfect reflector with 100% reflectivity. Then after light travels through the cavity 1410, reflected from M1, and makes another trip through the cavity 1410, before passing through the M2 again, the light power becomes 90%*10%=9%. At the interface between M2 and the cavity 1410, since M2 is typically a reciprocal structure, 9%*10%=0.9% of the light power would reflect back to the cavity while 8.1% of the light power would pass through M2 and leave the cavity 1410. With reference to FIG. 19A, the light intensity is $I_o$ before entering the cavity, and, after the first one circulation, the light intensity becomes $I_a=I_o(1-M2R)(M1R)\alpha_c$ before back-transmitting through M2, where M2R is the reflectivity of M2, M1R is reflectivity of M1, and the one circulation attenuation coefficient is $\alpha=M1R\alpha_c$, where $\alpha_c$ is the net attenuation coefficient introduced by the cavity excluding the effect of M1. The back-transmitted light intensity through M2 then becomes $I_b=I_a(M2R)$.

Figure 19B:
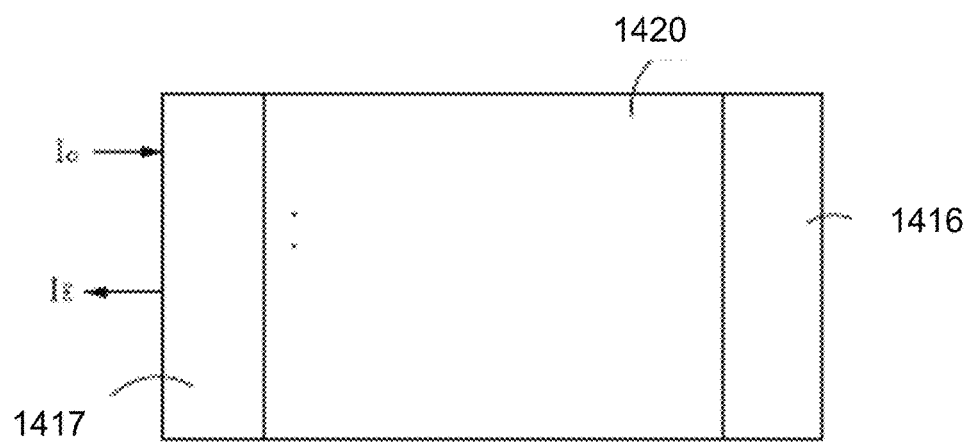

Although in this example the portion of light from the light reflector 1417 back to the incident source are 10% and 8.1% after the zero pass and the first pass respectively, they are out of phase under the resonant condition inside the cavity, and hence the actual power leaks out of the cavity 1410 from the second side 1414 is smaller than the sum of 10% and 8.1%. Under the light confinement condition and after numerous passes, all of the light from the light reflector 1417 back to the incident source cancel each other due to destructive interference, meaning almost all power of the original incident light is transferred into the cavity 1410 and then redirected upward with a predetermined angle. As shown in FIG. 19B, under the confinement condition, the back-reflected light power $I_E$ out of the cavity substantially reaches zero after numerous passes.

Since the one circulation attenuation coefficient α is a function of M1R, to meet the light confinement condition "M2R=α", the reflectivity of M2R must be smaller than that of M1R as long as the cavity is lossy. Also note that in order to simplify the description, we assume the phase shift (θm2) introduced by M2 is zero, and hence the actual resonant condition "round-trip phase shift equals 2mπ" (m: integer) is the same as "one-circulation phase shift equals 2mπ". If θm2 is not zero, then the resonating condition becomes "θm2+θoc=2mπ" where θoc is the phase shift of one circulation.

Figure 15B:
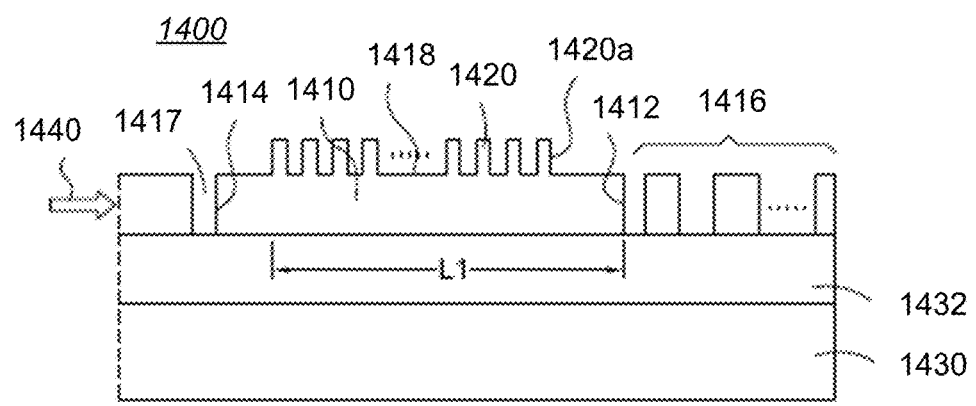
FIG. 15B shows a working example to further illustrate the embodiment shown in FIG. 14B.

FIG. 15B shows one of the working examples to further illustrate the feasibility of the embodiment shown in FIG. 14B. The optical device 1400 comprises a cavity 1410 with a first side 1412 and a second side 1414, a grating structure 1420 arranged on a top face 1418 of the cavity 1410. A mirror 1416 is arranged at the first side 1412 and a light reflector 1417 is arranged at the second side 1414. The mirror 1416 is, for example, a tapered DBR mirror. The light reflector 1417 is, for example, a single etched slit. The light is incident from the left side of the light reflector 1417 and enters the cavity 1410 through the second side 1414. The grating structure 1420 is, for example, rectangular with 420 nm period, 0.54~0.56 duty cycle and 180 nm~185 nm height. In this example, the light reflector 1417 is a slit with width below 70 nm to provide a mirror loss below 5%.

Given slit-grating distance and slit width around 180 nm~188 nm and 38 nm~40 nm, it can be simulated that at 1305 nm to 1310 nm wavelength, a directionality of approximately 85%~87% upward through the grating can be obtained with a low back reflection The minimum total coupling loss is calculated as approximately 1.1~1.4 dB at 1305 nm to 1310 nm wavelength, and features a 3 dB full width of approximately 20 nm. Moreover, depending on the design choice, the slit width can also be changed, and the slit width is preferably smaller than three effective optical wavelengths, which is derived from the incident wavelength and the material refractive index it travels. Other implementations, for example, a tapered DBR reflector (such as the tapered DBR reflector 1417 shown in FIG. 16F), can also be used as the light reflector 1417. Hence the above single slit example should not be considered as the limiting case for the implementation of light reflector 1417.

Note that according to another embodiment, a separated region can be inserted in between the left boundary of the grating structure 1420 and the second side 1414, or between the grating structure 1420 and the first side 1412 with a waveguide taper functioning as a mode filter.

Even though the ribs of the grating structure 1420 shown in the above-described embodiments (for example, the grating structure 1420 shown in FIG. 14B) have sidewalls 1420a vertical to the top face of cavity 1410, the ribs of the grating structure 1420 can have sidewalls 1420a slanted to the top face of cavity 1410 in a non-vertical manner. For example, the slanting angle of the sidewalls, the height/depth, or the separations of the grating structures can be designed to modify the emitting angle of the light into a predetermined angle with respect to the top face 1418. The grating structure 1420 can also have slanted ribs in combination with vertical ribs.

Figure 15C:
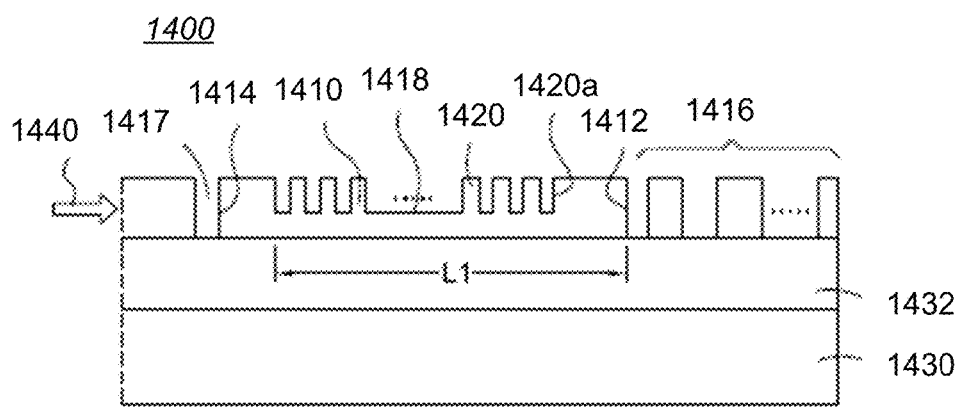
FIG. 15C shows another working example to further illustrate the embodiment shown in FIG. 14B.

Furthermore, as shown in FIG. 15C, instead of ribs protruding from the top face 1418 of the cavity 1410, the grating structure 1420 can be realized by grooves penetrating into the top surface 1418 of the cavity 1410. These grooves can penetrate into the cavity 1410 at a vertical angle as shown in FIG. 15C, or at a slanted angle depending on the practical process conditions. Even though the grooves are depicted to have a shallower depth in comparison to the slit 1417, it should be noted that the grooves can have a deeper or the same depth in comparison to the slit 1417. The grooves can be distributed with uniform or non-uniform separation.

Moreover, even though the rectangular ribs shown in FIGS. 15B and 15C have uniform periods and duty cycles, they can also be non-uniform depending on application scenarios. For example, the periods and the duty cycles of the grating structure in the two side regions of the cavity are different than those of the grating structure in the middle region of the cavity to better match the Gaussian spatial intensity distribution of a SMF.

Note that the above examples, including the numeric parameters used, are described to demonstrate the feasibility of this disclosure and should not by any means be regarded as the only way to implement this disclosure. Other variations and optimizations should be considered to be within the scope of the disclosure as long as they are covered in the claims set forth in this disclosure.

Design Procedure

In some implementations, a design methodology can be described as the following:

Based on the target light polarization/mode/wavelength/spot size, and the coupling device (ex: fiber on top of the grating or waveguide connected to the second side 1414, etc.), the dimensions and materials of the cavity and the substrate can be determined. For example, for a single mode optical signal with center wavelength around 1310 nm, a Si layer cavity around 250 nm on an oxide layer can be used. If the spot size of the external fiber is around 10 um, then the dimension of the cavity needs to be around or larger than 10 um to allow fiber to be coupled onto the grating structure which will be later formed on or embedded into the cavity.

Then, choose a proper mirror design (ex: tapered DBR or corner mirror or oxide-metal coating, etc.) with relatively high reflectivity as mirror 1416 and determine the interference wave pattern inside the cavity.

Then, design grating structure 1420 on top of the cavity 1410 based on the initial interference wave pattern. Note that adding grating will change the cavity property and might slightly change the interference wave pattern inside, so some iteration processes might be needed for optimization.

Then, based on the material quality and the physical dimensions of cavity 1410 and grating structure 1420, the one circulation attenuation coefficient (a) can be calculated along with the corresponding phase shift for the resonant condition.

After getting the one circulation attenuation coefficient $\alpha$, choose a proper reflector design with its reflectivity r=$\alpha$ (or very close to $\alpha$), and place it at the second side 1414 as the light reflector 1417. Note that in the case of small or nearly zero one circulation attenuation coefficient $\alpha$, the corresponding reflectivity r can be set as zero, meaning the light reflector 1417 is absent.

To better describe such special case when r=0, a design methodology with one mirror (namely the mirror 1416) can be further described as following:

Based on the target light polarization/mode/wavelength/spot size, and the coupling device (ex: fiber on top of the grating or waveguide connected to the second side 1414, etc.), the dimensions and materials of the cavity and the substrate can be determined.

Then, choose a proper mirror design (ex: tapered DBR or corner mirror or oxide-metal coating, etc.) with relatively high reflectivity as mirror 16 and determine the interference wave pattern inside the cavity.

Then, design grating structure 1420 on top of the cavity 1410 based on the initial interference wave pattern. Note that adding grating will change the cavity property and might slightly change the interference wave pattern inside, so some iteration processes might be needed for optimization.

Then, based on the material quality and the physical dimensions of cavity 1410 and grating structure 1420, the one circulation attenuation coefficient (a) can be calculated along with the corresponding phase shift for the resonant condition.

Based on the above design methodology, an exemplary numeric design procedure for implementing a high-performance coupler with substantially vertical emission on a SOI substrate is shown blow. An optical simulation tool can be used for testing the following design procedure:

Design a waveguide back mirror (namely the mirror 1416) featuring close to 100% reflection. This can be a silicon tapered waveguide DBR, a silicon waveguide loop mirror, a silicon corner mirror, or a silicon-oxide-metal coating layer.

Send in an optical signal into the waveguide with waveguide back mirror. Observe the interference wave pattern and identify the effective wavelength.

Add a grating structure on the waveguide, so that the grating period is almost the same as the period of the interference wave pattern. Note that the grating length, for example, can be chosen to be comparable to the size of external coupling optics, e.g., a SMF.

Fine tune the grating parameters, e.g., shapes, periods, duty cycles and depths/heights, until a desired directionality (i.e. "superstate power" divided by "superstate power plus substrate power") and a desired far field angle (ex: substantially vertical emission) are reached at the same time.

Measure the one circulation attenuation coefficient and its phase shift, and then design a waveguide front light reflector (namely the light reflector 1417) with reflectivity matched to this one circulation attenuation coefficient (r=a). Whether the condition of light confinement is met or not can then be checked by the total back-reflection of the whole structure.

In above example, the mirror 1416 can be implemented by a tapered waveguide DBR. The DBR is constructed by fully etched slits with space widths equal to 50 nm, 100 nm, 175 nm, 250 nm, 234 nm×4, and line widths equal to 167 nm, 150 nm, 133 nm, 116 nm, 107 nm×3. A broadband reflection ~100% covering >200 nm wavelength span can be obtained by this arrangement. Next, a TE optical signal is sent into the waveguide with the waveguide back mirror to identify the effective wavelength. A grating period of 420 nm is chosen based on the interference wave pattern, and a grating length ~10 μm is chosen for later coupling to a standard SMF. To avoid the scattering occurs at the grating-waveguide boundary, a fin-like grating is applied that stands on the SOI waveguide.

The near field and far field patterns of the optical device disclosed suggest that a uniform plane wave with substantially zero far field angle can be achieved. The strong field intensity in the grating region suggests a cavity effect. In fact, the disclosed optical device can be thought similar to an "optical antenna" array in which all emitters are locked in phase, and hence a directional emission occurs at zero far field angle.

Furthermore, the grating structure parameters, including its shapes, periods, duty cycles and depths/heights can be tuned individually or collectively to optimize the directionality and the far field angle. For example, the duty cycles can be modified at the side near M1 and M2 to achieve different directionality. Another example is modifying the period and etch depths to achieve a different far field angle. Note that the above examples are described to demonstrate the feasibility of this disclosure and should not be construed as limitations. Other variations and optimizations should be considered to be within the scope of this disclosure as long as they are covered in the claims set forth in this disclosure.

Figure 16A:
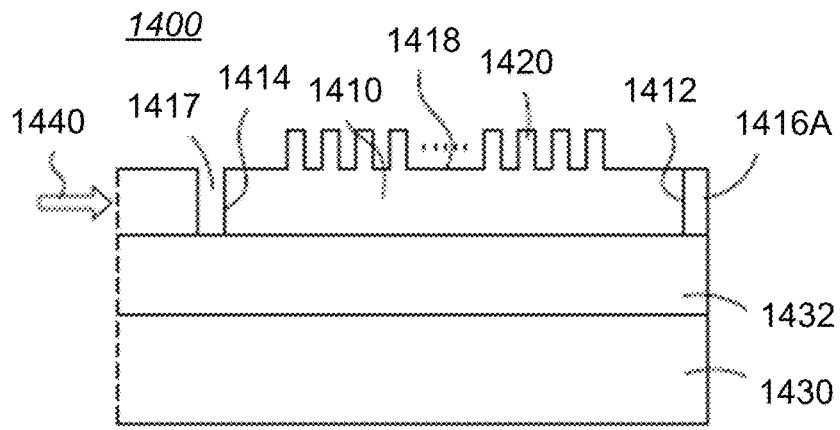
FIGS. 16A to 16H show the block components of example embodiments of the optical device for redirecting an incident light.

Besides the above embodiments, the optical device has further ramifications. FIG. 16A shows the block components of the optical device for redirecting an incident light according to still another embodiment. The optical device shown in FIG. 16A has similar components as those shown in FIG. 15B; therefore, the similar components use the same (or similar) numerals for brevity. The optical device shown in FIG. 16A uses a metal coating or dielectric coating 1416A on the side surface of the cavity 1410 to replace the tapered DBR mirror 1416 shown in FIG. 15B.

Figure 16B:
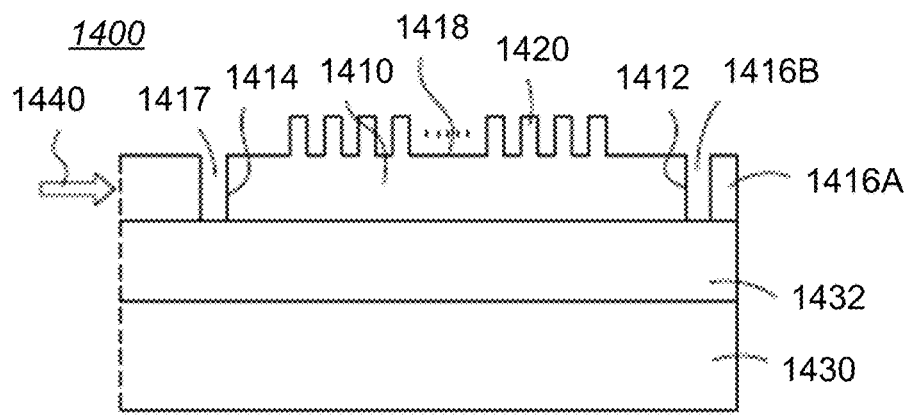

FIG. 16B shows the block components of the optical device for redirecting an incident light according to still another embodiment. The optical device shown in FIG. 16B has similar components as those shown in FIG. 15B; therefore, the similar components use the same (or similar) numerals for brevity. The optical device shown in FIG. 16B uses a metal coating or dielectric coating 1416A separated from the side surface of the cavity 1410 by an air gap 1416B to replace the tapered DBR mirror 1416 shown in FIG. 15B.

Figure 16C:
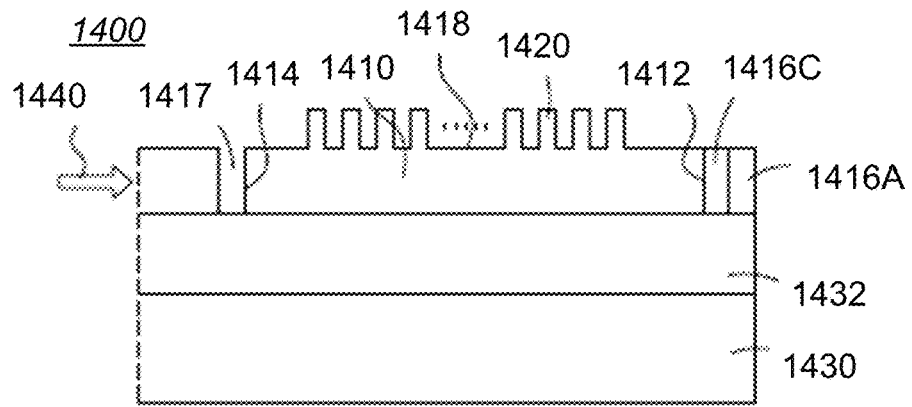

FIG. 16C shows the block components of the optical device for redirecting an incident light according to still another embodiment. The optical device shown in FIG. 16C has similar components as those shown in FIG. 15B; therefore, the similar components use the same (or similar) numerals for brevity. The optical device shown in FIG. 16C uses a metal coating 1416A separated from the side surface of the cavity 1410 by a dielectric layer 1416C to replace the tapered DBR mirror 1416 shown in FIG. 15B.

Figure 16D:
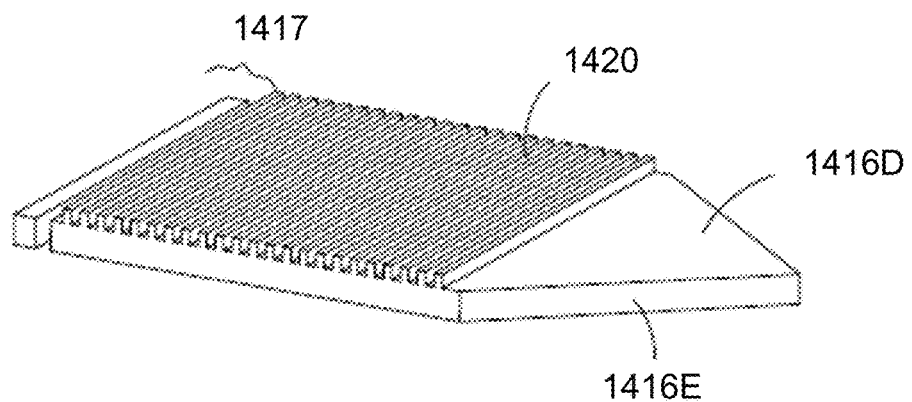

FIG. 16D shows the block components of the optical device for redirecting an incident light according to still another embodiment. The optical device shown in FIG. 16D has similar components as those shown in FIG. 15B; therefore, the similar components use the same (or similar) numerals for brevity. Moreover, to better illustrate the mirror used in this example, the substrate 1430 and supporting layer 1432 are omitted here for simplification. The optical device shown in FIG. 16D uses a corner mirror 1416D, which has light reflecting sides 1416E due to total-internal-reflection, at the first side 1412 of the cavity 1410 to replace the tapered DBR mirror 1416 shown in FIG. 15B. Note that the corner mirror 1416D can be in one piece form with the cavity 1410 or integrally formed with the cavity 1410. In some implementations, the second mirror 1417 may be replaced with a propagation region, where light propagates without a reflection or loss.

Figure 16E:
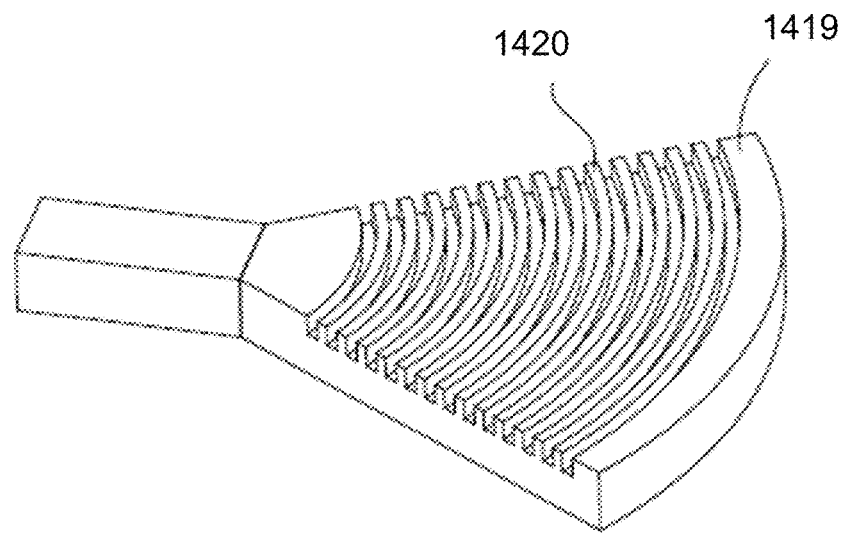

FIG. 16E shows the block components of the optical device for redirecting an incident light according to still another embodiment. The optical device shown in FIG. 16E has similar components as those shown in FIG. 16D. In the embodiment shown in FIG. 16D, the ribs in the grating structure 1420 are located along substantially parallel lines, and the parallel lines are substantially perpendicular to a propagation direction of light. In the embodiment shown in FIG. 16E, the grooves in the grating structure 1420 are located along substantially curved lines (for example, circular lines or elliptical lines with a common focal point). Moreover, even though a mirror 1419 is depicted at the circumference of the fan-like grating structure 1420, the skilled in the related art can easily replace the mirror 1419 with other kinds of reflecting means such as tapered DBR mirror.

Figure 16F:
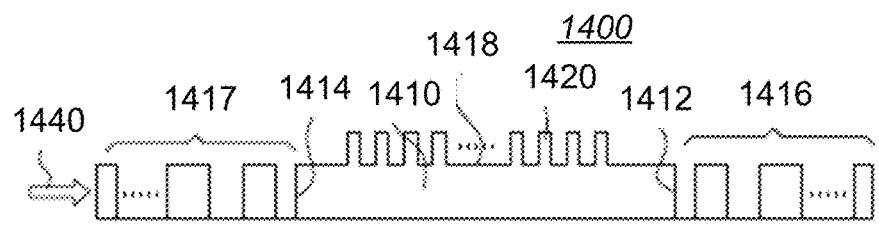

FIG. 16F shows the block components of the optical device for redirecting an incident light according to still another embodiment. The optical device shown in FIG. 16F has similar components as those shown in FIG. 15B except that both of the first mirror 16 and the second mirror 1417 adopt tapered DBR mirrors.

Figure 16G:
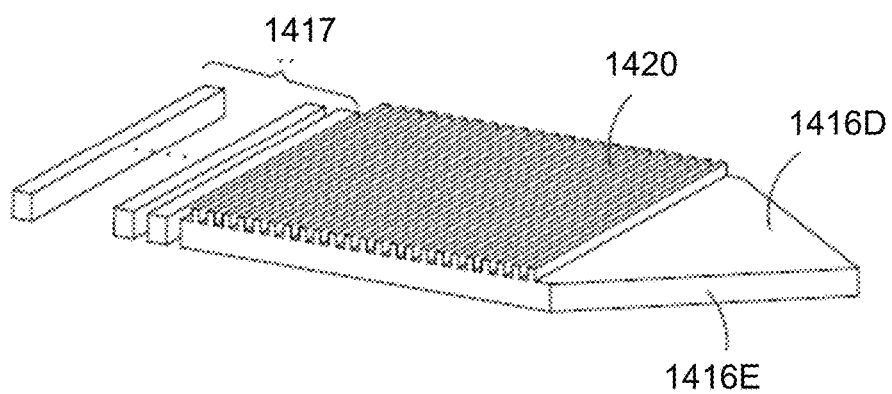

FIG. 16G shows the block components of the optical device for redirecting an incident light according to still another embodiment. The optical device shown in FIG. 16G has similar components as those shown in FIG. 16D except that the second mirror 1417 in FIG. 16G is a tapered DBR mirror.

Figure 16H:
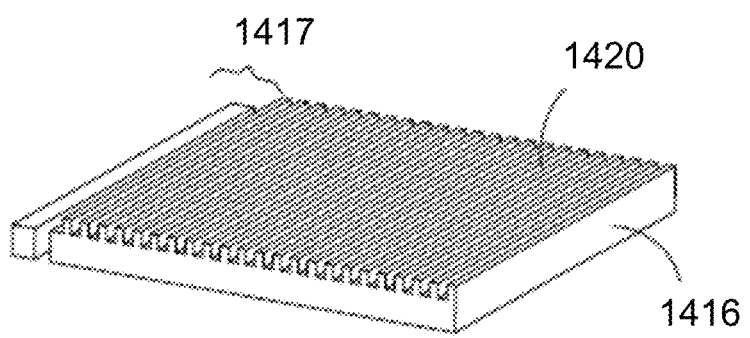

FIG. 16H shows the block components of the optical device for redirecting an incident light according to still another embodiment. The optical device shown in FIG. 16H has similar components as those shown in FIG. 16D except that the first mirror in FIG. 16D is represented by a smooth surface which could be later coated with other reflective layer to increase the reflectivity.

The grating structure 1420 can be implemented using various designs, for example, rectangular or triangular cross section implemented in a single column, array or segmented forms as shown in FIGS. 17A (symmetric triangular ribs), 17B (rectangular ribs), 17C (arrayed-dotted ribs), 17D (triangular ribs with ordered or random number per row) and 17E (segmented ribs) from the top view. FIGS. 17F to 17J are the corresponding cross section views of FIGS. 17A to 17E. Note that by changing the design of the grating structure, the emitting far field angle and directionality can be tuned. Other shapes can also be used as long as the distance d1 between two adjacent maximum power points of the standing wave in the cavity 1410 and the half of the period d2 of the grating structure 1420 have the same order of magnitude.

Moreover, the protruding ribs embodiments shown in FIGS. 17A to 17J can be replaced with penetrating grooves of corresponding shape (symmetric triangular, rectangular, arrayed-dotted, asymmetric triangular, and segmented), and these modifications are also within the scope of the disclosure.

Figure 18A:
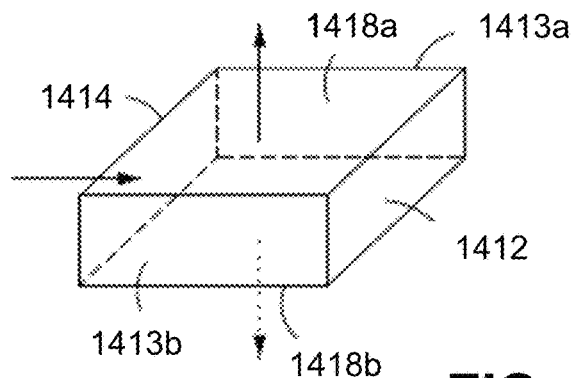
FIGS. 18A to 18C show the simplified perspective views of example embodiments of the optical device to further illustrate the light redirecting paths.
Figure 18B:
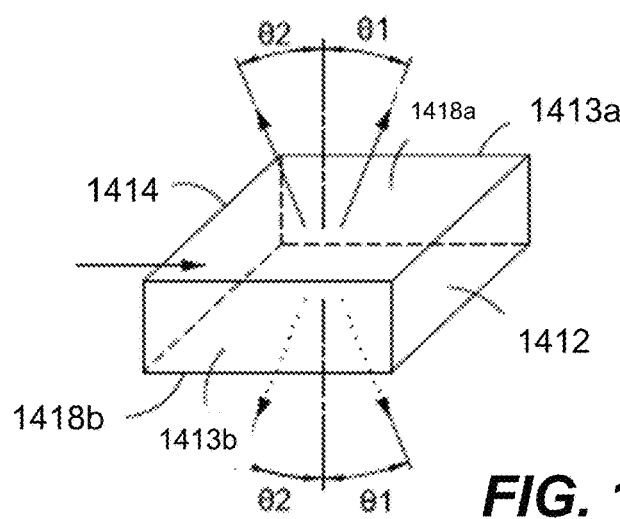
Figure 18C:
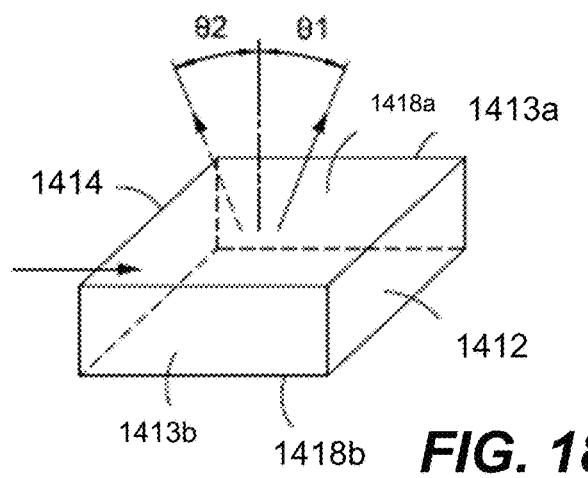

FIG. 18A to 18C show several simplified perspective views of the optical devices to further illustrate the light paths for various application scenarios. The optical device shown in FIG. 18A has similar block components as those shown in FIG. 14B; therefore, the optical device shown in FIG. 18A can be viewed as one of the possible 3D perspective views. More specifically, the cavity 1410 has a first side 1412 with mirror, a second side 1414 with light reflector, and two sides 1413*a* and 1413*b* each connected between the first side 1412 and the second side 1414. The grating structure can be embedded on the top surface 18*a* or the bottom surface 1418*b*. Furthermore, since the purpose of FIG. 18A to 18C is to illustrate the light paths, the structures of mirror, reflector and grating are not shown here for simple viewing purpose. The solid arrows in the figures are to indicate the major light propagating paths while the dotted arrow is to illustrate the minor light path when the directionality is not tuned to 100%. FIG. 18A illustrates an exemplary light path, where the light is incident from the second side and majority of the light is redirected toward the top with a substantially 90° angle with respect to the incident direction. FIG. 18B is similar to FIG. 18A but with different grating design on 1418*a* or 1418*b* to provide other emission far field angles. In this figure, θ1 equals θ2, which is a result of the cavity effect. For example, when θ1 is 45°, θ1 is also substantially 45°. Moreover, FIG. 18C illustrates the case when the grating structure is designed in a way, for example with non-symmetric shape, to emphasize on one direction as shown in the solid arrow (θ1) instead of the other as shown in a dashed arrow (θ2). For simple viewing purpose, the dotted arrow indicating the minor light path (when the directionality is not tuned to 100%) is not shown here. Combining with the reciprocal nature of this structure, many other possible light redirecting scenarios are possible and hence the examples shown here are for illustrative purpose and should not be viewed as limiting the scope of this disclosure. Other variations should be considered to be within the scope of this disclosure as long as they are covered in the claims set forth in this disclosure.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

Embodiments and all of the functional operations described in this specification may be implemented in digital electronic circuitry, or in computer software, firmware, or hardware, including the structures disclosed in this specification and their structural equivalents, or in combinations of one or more of them. Embodiments may be implemented as one or more computer program products, i.e., one or more modules of computer program instructions encoded on a computer-readable medium for execution by, or to control the operation of, data processing apparatus. The computer readable-medium may be a machine-readable storage device, a machine-readable storage substrate, a memory device, a composition of matter affecting a machine-readable propagated signal, or a combination of one or more of them. The computer-readable medium may be a non-transitory computer-readable medium. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory may be supplemented by, or incorporated in, special purpose logic circuitry.

To provide for interaction with a user, embodiments may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the techniques disclosed, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. An optical apparatus, comprising:
a light source region configured to generate light;
a first reflector region and a second reflector region configured to reflect the generated light to form an interference light along a first direction;
an interference region formed between the first reflector region and the second reflector region and coupled to the light source region, and the interference region configured to confine at least a portion of the interference light formed by light reflected between the first reflector region and the second reflector region along the first direction; and
a grating region containing a first grating structure and a second grating structure with substantially the same periodicity but different duty cycles, wherein both grating structures are arranged along the first direction with 180° phase offset,
wherein the grating region is formed on a region confining at least a portion of the interference light, and the grating region is configured to emit at least a portion of the light along a second direction that is different from the first direction, and
wherein a quarter-wavelength shift region is formed in the grating region by removing or adding at least one segment of the grating structures.

2. The optical apparatus of claim 1, wherein a grating periodicity of the first grating structure substantially matches the periodicity of the interference light inside the interference region.

3. The optical apparatus of claim 1, wherein a taper region is formed in adjacent to the quarter-wavelength shift region along the first direction wherein a period or a duty cycle of the taper region increases or decreases from the side closer to the quarter-wavelength shift region toward the side away from the quarter-wavelength shift region.

4. The optical apparatus of claim 1, wherein the first reflector region is a surface corrugated grating structure forming a distributed feedback or a distributed Bragg reflector.

5. The optical apparatus of claim 4, wherein the duty cycle of the first grating structure of the grating region is different from the duty cycle of the surface corrugated grating structure of the first reflector region, and the period of the first grating structure is twice the period of the surface corrugated grating structure.

6. The optical apparatus of claim 4, wherein the first grating structure of the grating region is formed on the same planar surface as the surface corrugated grating structure of the first reflector region.

7. The optical apparatus of claim 1, wherein the light source region is at least partially embedded in the interference region, and contains alternating III-V material layers forming a quantum well or quantum wire or quantum dot structure.

8. The optical apparatus of claim 1, wherein a portion of the grating region is formed on the interference region, or the first reflector region.

9. The optical apparatus of claim 1, wherein the second direction is substantially perpendicular to the first direction.

10. The optical apparatus of claim 1, wherein a grating periodicity of the first grating structure is d2, wherein the interference light inside the interference region has an intensity periodicity of d1, wherein d2 substantially equals to 2×d1.

11. The optical apparatus of claim 1, wherein the grating region has a grating length along the first direction and a grating width along a third direction perpendicular to the first direction at a planar surface, and the grating width is different from the grating length to obtain an circular beam profile.

12. The optical apparatus of claim 1, further comprising:
an n-doped region and a p-doped region configured to provide an electric field in the interference region with an application of a voltage or a current across the n-doped region and the p-doped region,
wherein the interference region is configured to provide a different interference pattern for the interference light with the application of a voltage or a current across the n-doped region and the p-doped region.

13. The optical apparatus of claim 1, further comprising:
an n-doped region and a p-doped region configured to provide an electric field in the first and/or second reflector region with an application of a voltage or a current across the n-doped region and the p-doped region,
wherein the first and/or second reflector region is configured to provide a different reflectivity with the application of a voltage or a current across the n-doped region and the p-doped region.

14. The optical apparatus of claim 1, wherein the first reflector region or the second reflector region includes one of a corner mirror, a DBR mirror, a DFB mirror, an anomalously dispersive mirror, a waveguide loop mirror, a dielectric layer with a metal mirror, or a metal layer.

15. The optical apparatus of claim 1, wherein the grating region has lattice vectors formed so that locations of in-phase antinodes of the interference light inside the interference region substantially match locations of grating valleys or peaks.

16. The optical apparatus of claim 1, further comprising:
a first electrode and a second electrode electrically coupled to the light source region, the first electrode and the second electrode configured to generate light through an electrical carrier injection by an electrical field applied between the first electrode and the second electrode.

17. The optical apparatus of claim 16, further comprising:
a third electrode electrically coupled to the light source region, the third electrode configured to modulate an electrical carrier concentration in the light source region by an electrical field applied (i) between the first electrode and the third electrode or (ii) between the second electrode and the third electrode.

18. The optical apparatus of claim 17, wherein the light source region contains at least two different layers of materials and the first electrode and the third electrode are physically in contact to different layers of materials of the light source region.

19. The optical apparatus of claim 17, wherein a dielectric layer is formed between the third electrode and the light source region and the third electrode is configured to modulate the amount of electrical carriers recombined in the light source region through a capacitive effect without injecting electrical carriers into the light source region.

20. The optical apparatus of claim 17, wherein at least two different voltage levels are applied to the third electrode in sequence to modulate the amount of electrical carriers recombined in the light source region to obtain different output light power level.

21. The optical apparatus of claim 17, wherein the grating region and the third electrode are located on the opposite sides of the interference region, and the light is emitted through the side of the grating region.

22. The optical apparatus of claim 17, wherein the grating region and the third electrode are located on the opposite sides of the interference region, and the light is emitted through the opposite side of the grating region.

23. The optical apparatus of claim 17, wherein the grating region and the third electrode are located on the same side of the interference region, and the light is emitted through the side of the grating region.

24. The optical apparatus of claim 17, wherein the grating region and the third electrode are located on the same side of the interference region, and the light is emitted through the opposite side of the grating region.

25. The optical apparatus of claim 17, wherein at least part of the third electrode is transparent to the light emitting through the side of the grating region.

26. A method for forming an optical transmitter, the method comprising:
forming a light source region;
forming an interference region, a first reflector region and a second reflector region, wherein the interference region, of which the light source region is at least partially embedded in, is bounded at two opposite ends along a first direction by the first and second reflector region;
forming a grating region including a first grating structure, covering at least part of the interference region, wherein the first grating structure has periodicity substantially matched to the period of the interference light along the first direction; and
forming a quarter-wavelength shift region in the grating region by removing or adding at least one segment of the grating structure,
wherein light generated by an electrical carrier recombination resonates inside the interference region along the first direction and emits out of the interference region along a second direction that is different from the first direction.

27. The method of claim 26, wherein the grating region further includes a second grating structure with the same periodicity but different duty cycle as the first grating structure, and a third grating structure that is a surface corrugated structure forming a DFB type reflector region.

28. The method of claim 26, further including forming a taper region in adjacent to the quarter-wavelength shift region along the first direction wherein a period and a duty cycle of the taper region increases or decreases from a side closer to the quarter-wavelength shift region toward a side away from the quarter-wavelength shift region.

29. The method of claim 26, further including forming at least three electrodes electrically coupled to the light source region, wherein the three electrodes arranged to provide a control for relative electrical fields among the three electrodes to modulate an electrical carrier concentration inside the light source region, and one of the electrodes is an insulating electrode without electrical carrier injection.

30. The optical apparatus of claim 1, wherein the duty cycle of a grating structure is a ratio of a peak width of the grating structure to a sum of the peak width and a valley width of the grating structure.

* * * * *